(12) United States Patent
Zaloom

(10) Patent No.: US 10,371,196 B1
(45) Date of Patent: Aug. 6, 2019

(54) COMPACT ROTATION LOCKING MECHANISMS FOR DETACHABLE LOAD BEARING PIVOTING SUPPORT ELEMENTS

(71) Applicant: Joseph Zaloom, Falls Church, VA (US)

(72) Inventor: Joseph Zaloom, Falls Church, VA (US)

(73) Assignee: Joseph A. Zaloom, Falls Church, VA (US)

( * ) Notice: Subject to any disclaimer, the term of this patent is extended or adjusted under 35 U.S.C. 154(b) by 175 days.

(21) Appl. No.: 15/285,514

(22) Filed: Oct. 5, 2016

Related U.S. Application Data

(63) Continuation-in-part of application No. 14/874,713, filed on Oct. 5, 2015, now Pat. No. 9,506,281, which is a continuation of application No. 14/488,054, filed on Sep. 16, 2014, now Pat. No. 9,483,083, and a continuation of application No. 14/255,711, filed on Apr. 17, 2014, now Pat. No. 9,596,914.

(60) Provisional application No. 62/064,216, filed on Oct. 15, 2014, provisional application No. 62/060,353, filed on Oct. 6, 2014, provisional application No. 61/906,878, filed on Nov. 20, 2013, provisional application No. 61/878,491, filed on Sep. 16, 2013.

(51) Int. Cl.
| | |
|---|---|
| *F16C 11/10* | (2006.01) |
| *F16M 13/00* | (2006.01) |
| *H05K 5/02* | (2006.01) |
| *F16M 11/10* | (2006.01) |
| *A47B 23/04* | (2006.01) |

(52) U.S. Cl.
CPC .............. *F16C 11/10* (2013.01); *A47B 23/04* (2013.01); *F16M 11/105* (2013.01); *F16M 13/005* (2013.01); *H05K 5/0226* (2013.01); *H05K 5/0234* (2013.01)

(58) Field of Classification Search
CPC . E05D 11/06; E05D 11/1078; E05D 11/1007; E05D 11/1035; Y10T 16/540254; Y10T 16/540255; Y10T 16/540247; Y10T 16/54025; Y10T 16/540253; Y10T 16/54024; Y10T 16/5402; Y10T 16/54; Y10T 16/540256; Y10T 16/540257; Y10T 16/54095; Y10T 16/5275
See application file for complete search history.

(56) References Cited

U.S. PATENT DOCUMENTS

| | | | | |
|---|---|---|---|---|
| 464,201 | A | * 12/1891 | Rowland | ................ A47K 10/22 242/599.3 |
| 1,166,702 | A | 1/1916 | Mardon et al. | |
| 2,101,500 | A | 12/1937 | Jagus | |
| 3,671,998 | A | * 6/1972 | Ruiz | ..................... E05D 7/1011 15/392 |
| 3,744,085 | A | 7/1973 | Griego | |

(Continued)

OTHER PUBLICATIONS

"Computer Components, & Imaging Supplies", Crimson Imaging Supplies, Mar. 15, 2013, two pages.

(Continued)

*Primary Examiner* — Victor D Batson
*Assistant Examiner* — Matthew J Sullivan

(57) ABSTRACT

Compact rotation locking mechanisms for detachable load bearing pivoting support elements which may also be used for converting the batteries of personal information and input devices into removable and interchangeable pivoting support elements for these devices.

8 Claims, 53 Drawing Sheets

(56) References Cited

U.S. PATENT DOCUMENTS

| | | | |
|---|---|---|---|
| 4,392,284 A * | 7/1983 | LePage | A44C 5/145 16/229 |
| 4,436,271 A | 3/1984 | Manso | |
| 5,020,763 A | 6/1991 | Hegarty | |
| 5,058,848 A | 10/1991 | Ferraro | |
| 5,060,904 A | 10/1991 | Hegarty | |
| 5,074,164 A | 12/1991 | Sheu | |
| 5,100,098 A | 3/1992 | Hawkins | |
| 5,168,601 A | 12/1992 | Liu | |
| 5,274,882 A * | 1/1994 | Persson | H04M 1/0216 16/229 |
| 5,867,911 A * | 2/1999 | Yates | A01D 34/90 16/326 |
| 5,933,996 A | 8/1999 | Chang | |
| 6,367,760 B1 | 4/2002 | Pagano | |
| 6,983,514 B2 | 1/2006 | Lu et al. | |
| 7,083,155 B1 | 8/2006 | Smartt | |
| 7,188,818 B2 | 3/2007 | Chang | |
| 7,546,996 B2 | 6/2009 | Somji | |
| 7,568,915 B1 | 8/2009 | Lavoie | |
| 7,581,290 B2 | 9/2009 | Chang | |
| 7,591,604 B2 | 9/2009 | Roberts | |
| 7,611,117 B1 | 11/2009 | Lang, Jr. | |
| 7,712,719 B2 | 5/2010 | Derry et al. | |
| 7,770,862 B2 | 8/2010 | Chen | |
| 7,836,623 B2 | 11/2010 | Wang et al. | |
| 8,038,116 B2 | 10/2011 | Lee et al. | |
| 8,118,274 B2 | 2/2012 | McClure et al. | |
| D672,783 S | 12/2012 | Robinson | |
| 8,382,059 B2 | 2/2013 | LeGette et al. | |
| 8,387,930 B2 | 3/2013 | Drew et al. | |
| 8,833,716 B2 | 9/2014 | Funk et al. | |
| 8,898,862 B1 * | 12/2014 | McGrath | E05D 11/1007 16/326 |
| 9,488,430 B2 * | 11/2016 | Hawley | F41A 35/02 |
| 2004/0007649 A1 | 1/2004 | Vettraino | |
| 2005/0155183 A1 | 7/2005 | Lu et al. | |
| 2006/0084585 A1 | 4/2006 | Lin | |
| 2006/0137491 A1 | 6/2006 | Chen | |
| 2006/0175484 A1 | 8/2006 | Wood, III et al. | |
| 2008/0156836 A1 | 7/2008 | Wadsworth et al. | |
| 2011/0094058 A1 | 4/2011 | Van Gennep | |
| 2012/0074272 A1 | 3/2012 | Hull | |
| 2012/0111881 A1 | 5/2012 | Gaddis, II et al. | |
| 2012/0126088 A1 | 5/2012 | Whittaker et al. | |
| 2012/0326003 A1 | 12/2012 | Solow et al. | |
| 2013/0092805 A1 | 4/2013 | Funk et al. | |
| 2013/0092811 A1 | 4/2013 | Funk et al. | |
| 2013/0233984 A1 | 9/2013 | Huang | |
| 2013/0256478 A1 | 10/2013 | Reda et al. | |
| 2013/0277520 A1 | 10/2013 | Funk et al. | |
| 2014/0054426 A1 | 2/2014 | Burns | |
| 2014/0063750 A1 | 3/2014 | Mau et al. | |
| 2014/0116230 A1 | 5/2014 | Nakata et al. | |
| 2014/0259532 A1 | 9/2014 | Millard et al. | |
| 2014/0328020 A1 | 11/2014 | Galant | |
| 2014/0346311 A1 | 11/2014 | Derman | |

OTHER PUBLICATIONS

"Ipad/Tablet Holding Products—Galaxy Tab Stand, Ipad Leg Strap, Nook Holder@ Hand e Holder", www.handholder.com, Mar. 15, 2013, four pages.

"HandyShell for iPad, iPad Cases & Covers/SpeckProducts", Mar. 15, 2013, two pages.

Detachable Metal Stand for iPad, Cell Phone, Smartphone, Tablet Accesories/Kross, Mar. 15, 2013, two pages.

"Life-Phorm All-in-One Positioning Device for iPad 3, iPad 4, Tablets, Smartphones and Cameras (000LIF)", Amazon.com: Life-Phorm All-in-One Positioning Device for iPad 3, iPad 4, Tablets, Smartphones and Cameras (000LIF): Computers & Accessories, Apr. 18, 2013, four pages.

"Stable Coil PRO—Flexible Gooseneck Coil Based Pivoting iPad Stand—iPad 4g, 3g, iPad 2 and 1g", Stable Coil PRO Flexible Gooseneck Coil Pivoting iPad 4g, 3g, iPad2 Stand Holder, Apr. 18, 2013, four pages.

"Buzz/ ZeroChromaZeroChroma", Mar. 15, 2013, twelve pages.

* cited by examiner

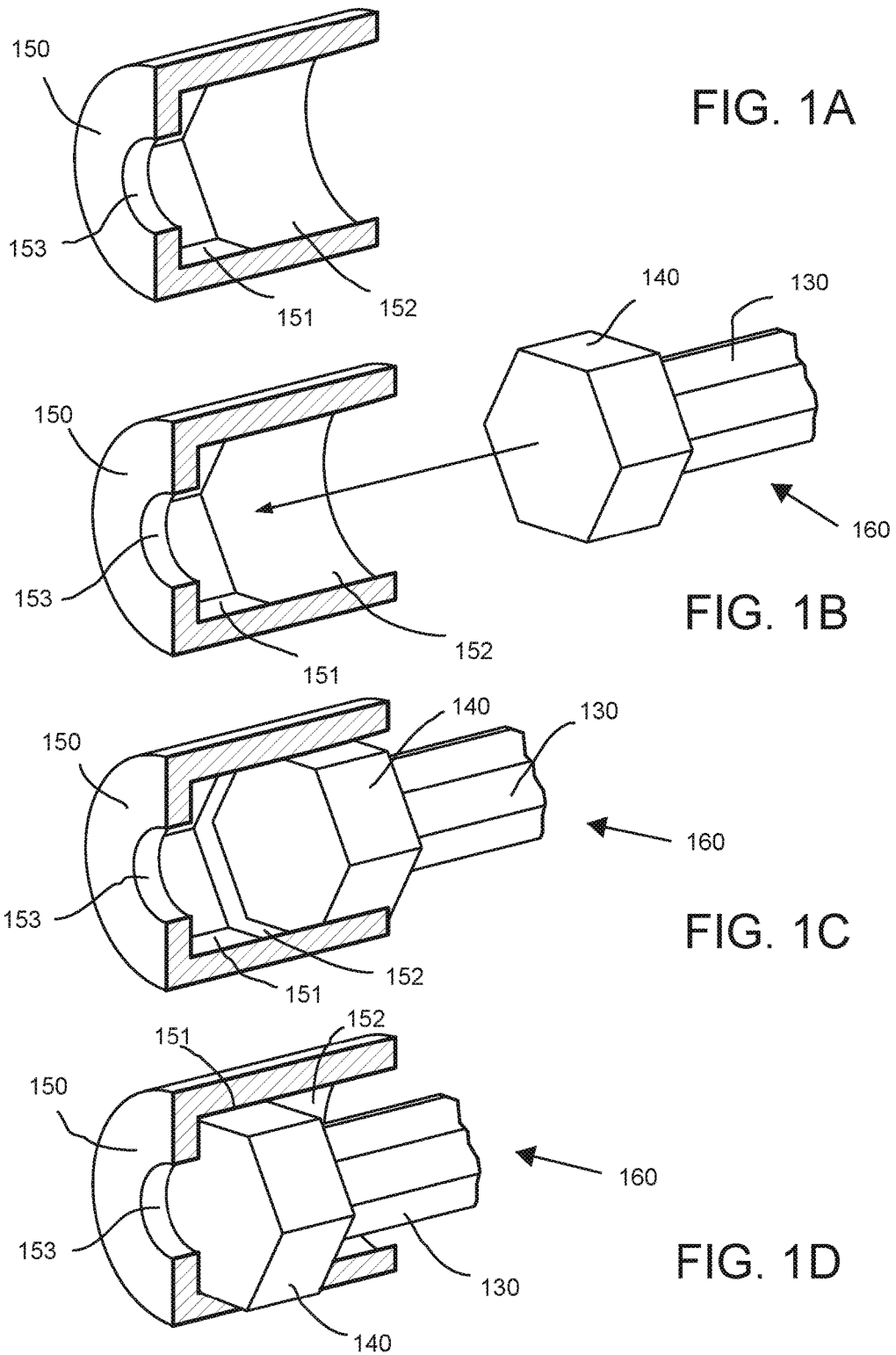

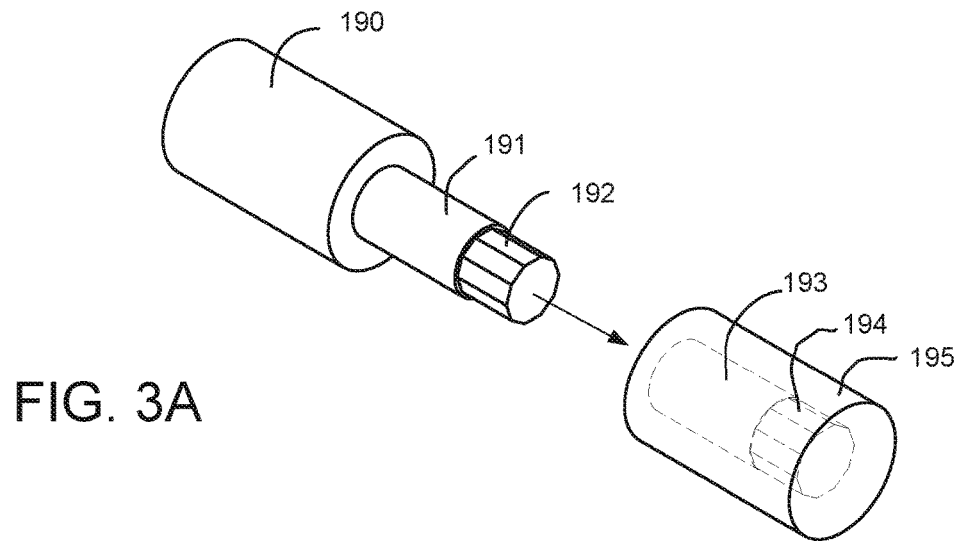
FIG. 3A
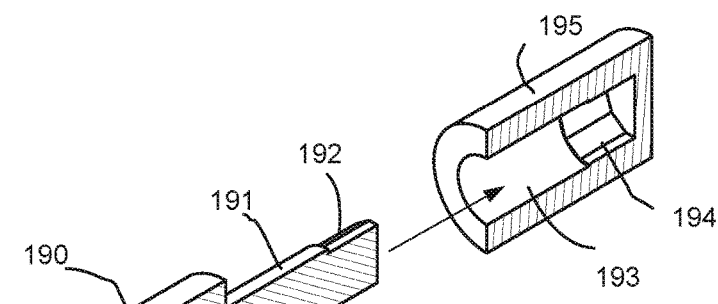
FIG. 3B
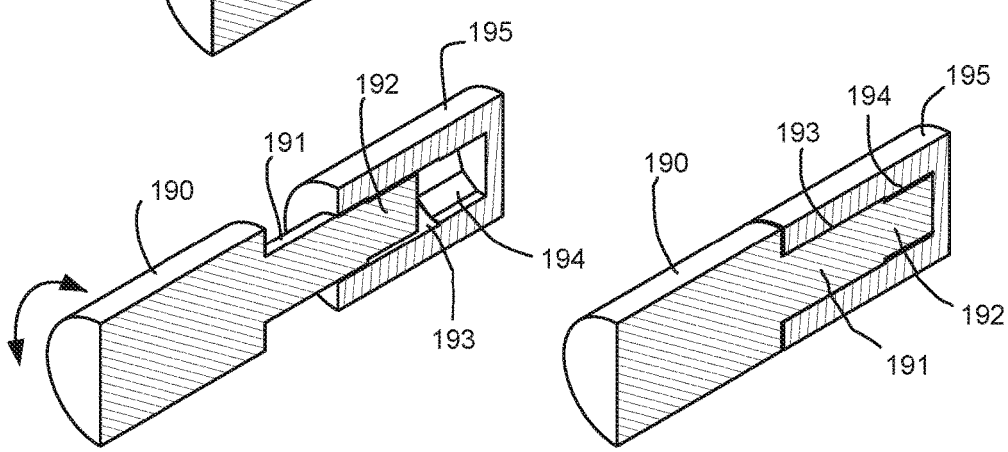
FIG. 3C
FIG. 3D

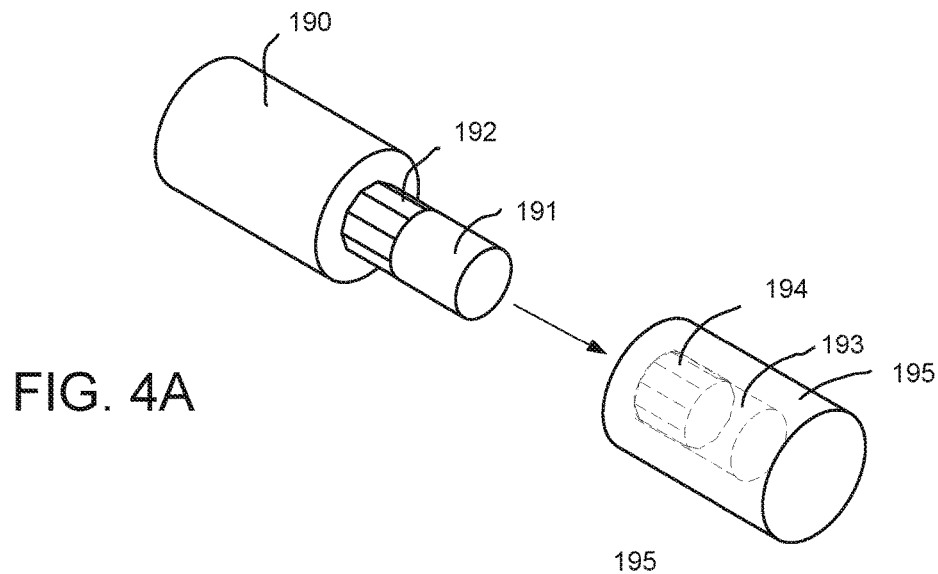
FIG. 4A
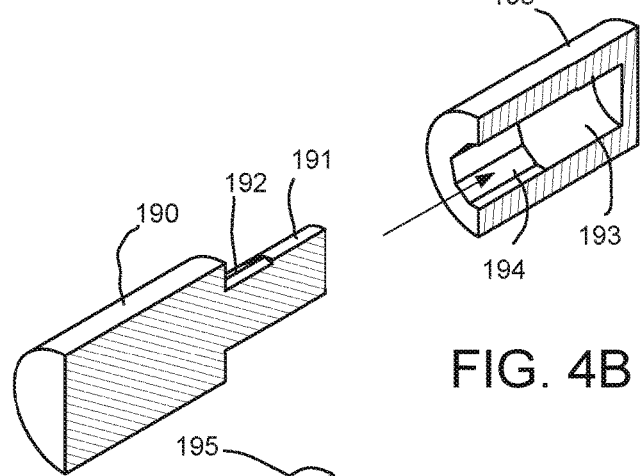
FIG. 4B
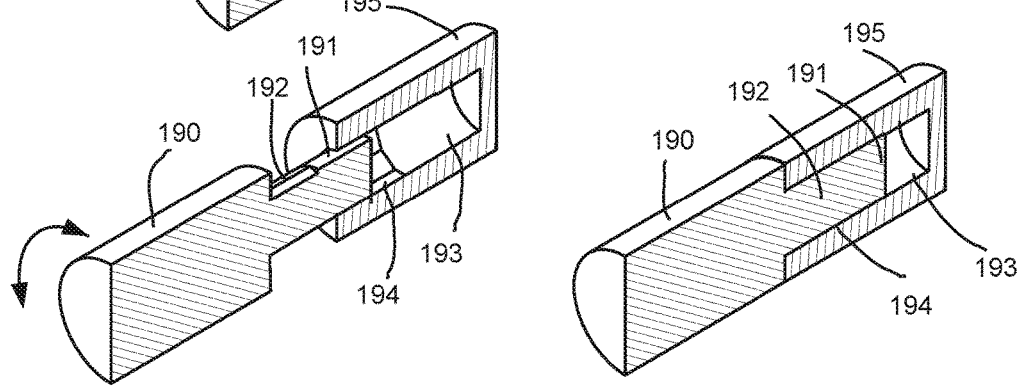
FIG. 4C
FIG. 4D

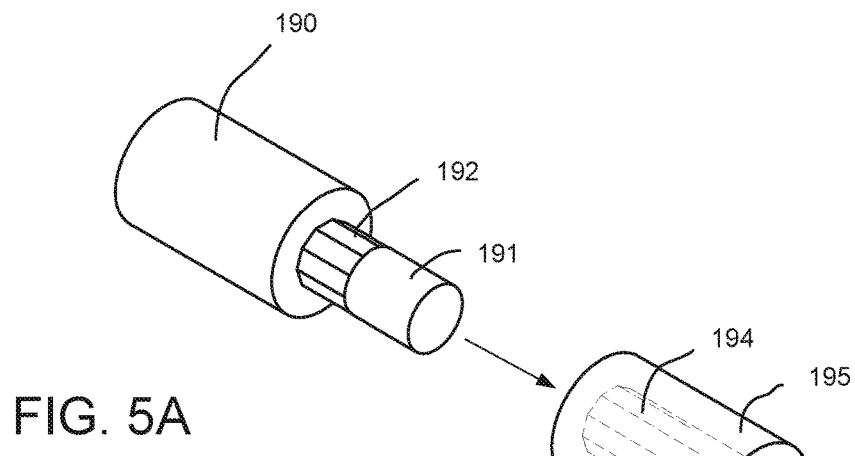
FIG. 5A
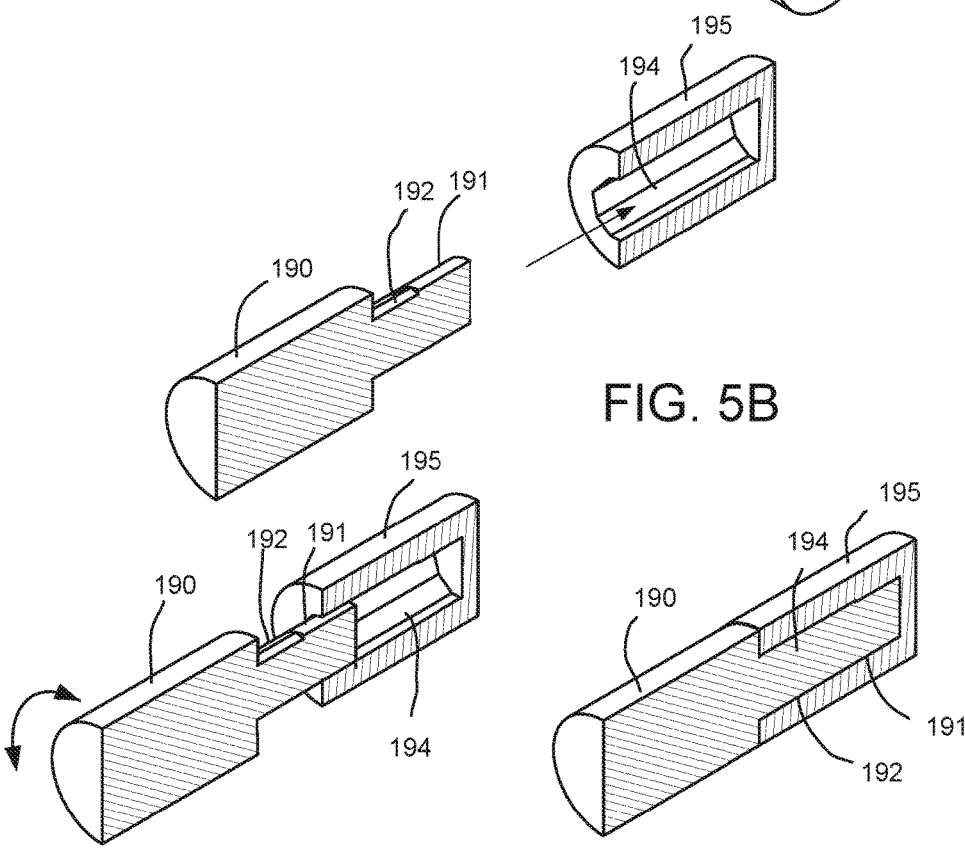
FIG. 5B
FIG. 5C
FIG. 5D

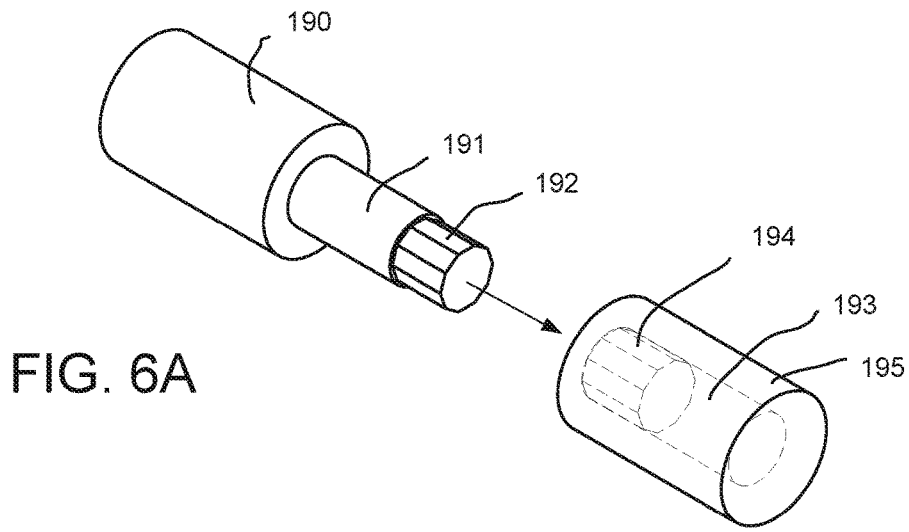
FIG. 6A
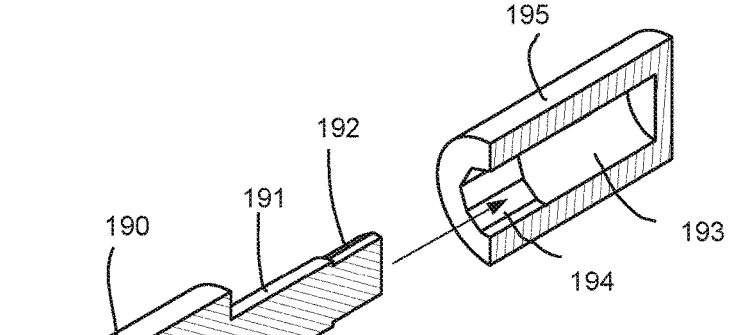
FIG. 6B
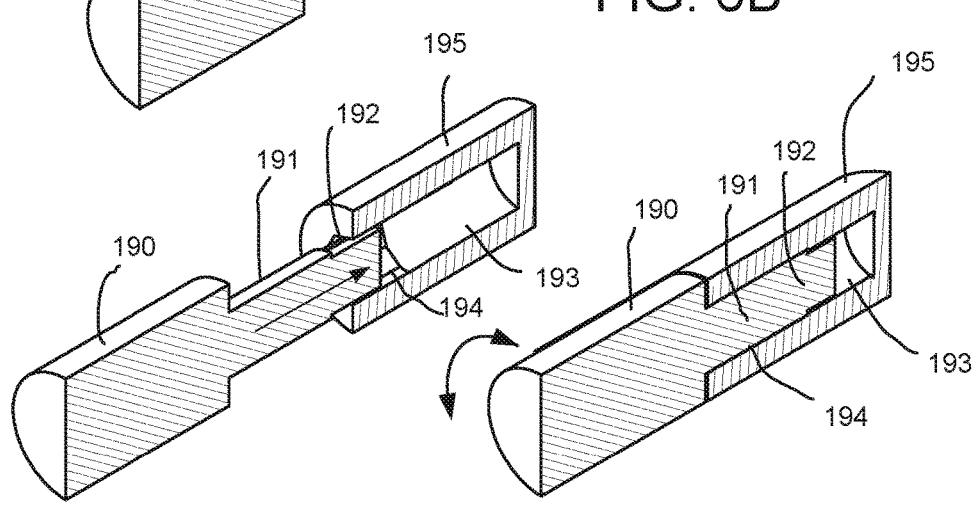
FIG. 6C
FIG. 6D

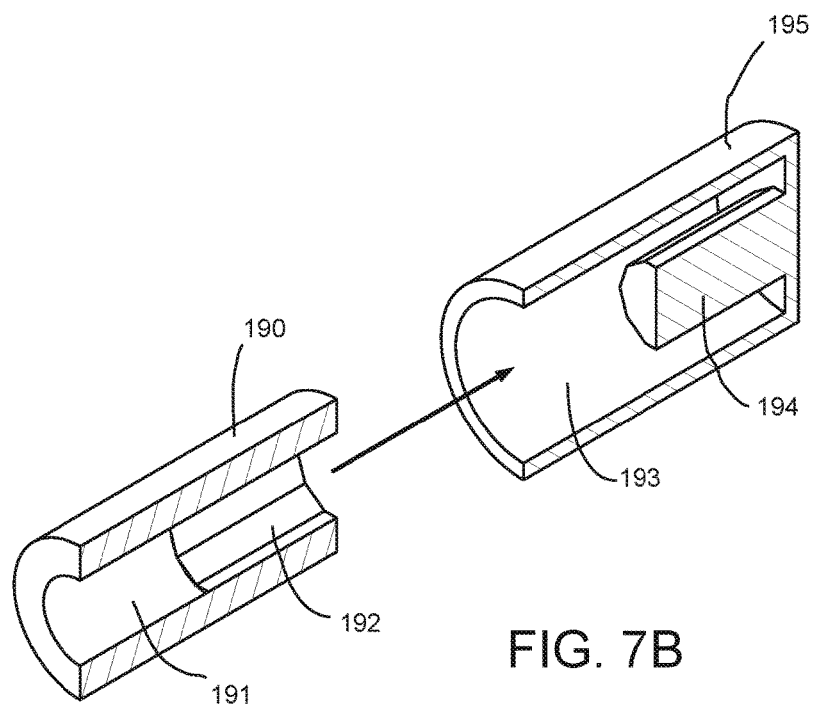
FIG. 7B
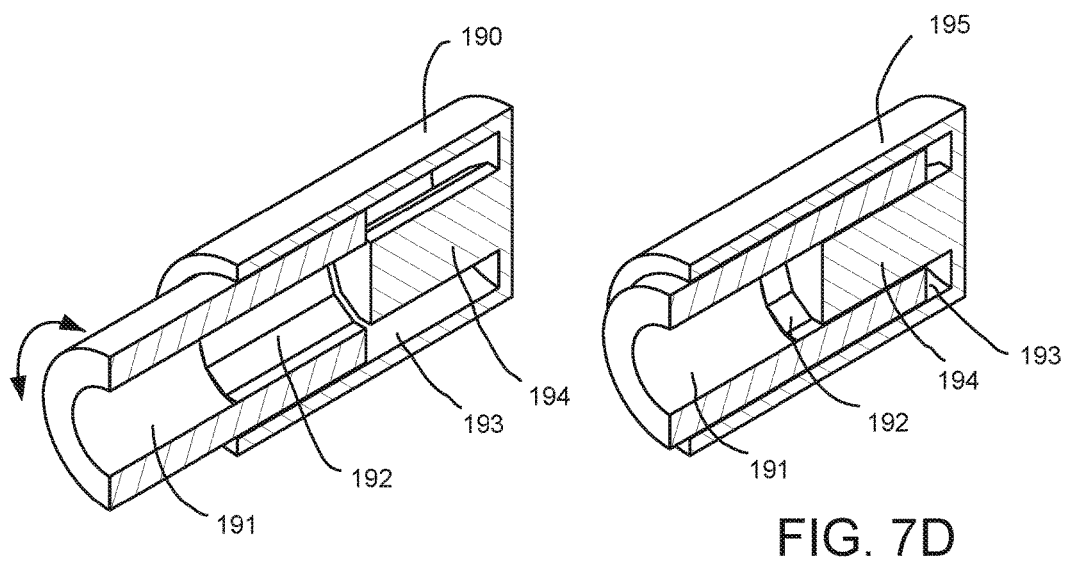
FIG. 7C
FIG. 7D

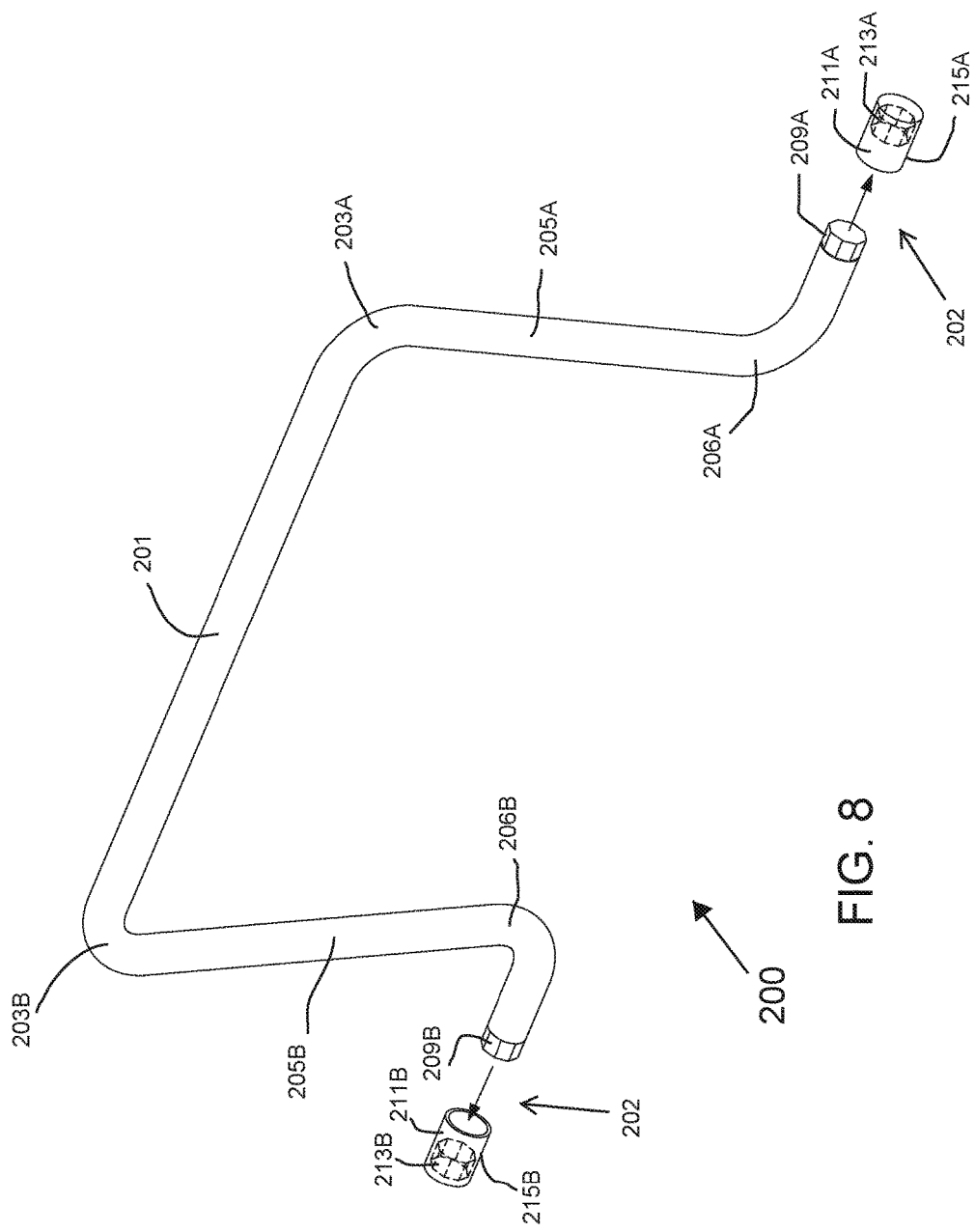

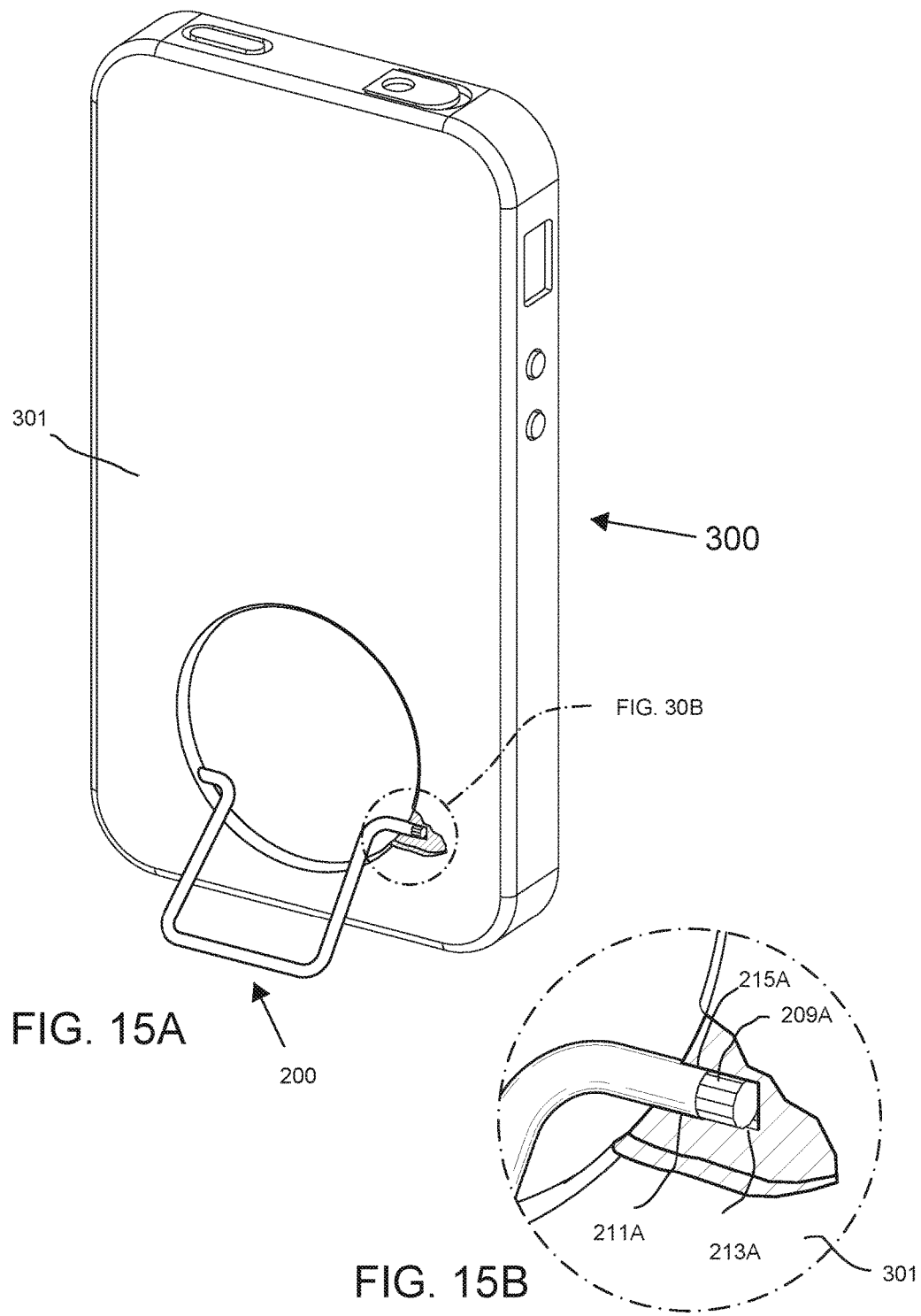

COMPACT ROTATION LOCKING MECHANISMS FOR DETACHABLE LOAD BEARING PIVOTING SUPPORT ELEMENTS

CROSS-REFERENCES TO RELATED APPLICATIONS

This application is a continuation-in-part (CIP) of U.S. patent application Ser. No. 14/874,713, filed Oct. 5, 2015 and claims the benefit of U.S. patent application Ser. No. 14/488,054, filed Sep. 16, 2014, and claims the benefit of U.S. patent application Ser. No. 14/255,711, filed Apr. 17, 2014, and claims the benefit of U.S. Provisional Application 62/064,216 filed Oct. 15, 2014, and U.S. Provisional Application 62/060,353 filed Oct. 6, 2014, and U.S. Provisional Application 61/906,878 filed Nov. 20, 2013, and U.S. Provisional Application 61/878,491 filed Sep. 16, 2013, all of which applications are incorporated by reference in their entireties.

FIELD

This technology relates to simple and compact, detachable, rotation locking, load bearing, support mechanisms for the angular positioning of personal information display and input devices and removable batteries for personal information display and input devices among other applications.

BACKGROUND OF THE INVENTION

Since the introduction of the Apple iPhone in June 2007, and the Apple iPad in April 2010, the number of computing devices known as smart phones and tablets has vastly increased. These devices typically consist of a touch screen that fronts a highly sophisticated, versatile, thin, and lightweight computer that among other things, serves as a point-and-shoot camera, a video camera, and a face-to-face wireless communications device. In certain embodiments, the line between a smart phone and a tablet is blurring as smart phones continue to increase in size and assume most functions of a "tablet" as they narrow in thickness. In fact, a new moniker has been established to refer to such devices; they are called "phablets"; a class of mobile wireless devices designed to combine or straddle the functions of a smart-phone and a tablet. The latest incarnation of these devices is the iPhone 7 and 7 Plus and the Samsung Galaxy S7 and S7 edge, with thicknesses in the neighborhood of 7.1 mm.

While such devices represent marvels of modern communication, voice recording, photography, videography, gaming and the consumption and documentation of information; they all share a major deficiency that limits their usability; the ability to be positioned to various angles and orientations with respect to a base (a resting surface) in order eliminate glare, steady a camera shot, position the video camera at an optimum angle for recording a scene, for communicating wirelessly with another person over an extended period of time without tiring one's hand, as well as for consuming information while freeing both hands to eat, or to perform other tasks concurrently.

Moreover, with the advent of the Samsung Galaxy Note tablets and phablets, the Microsoft Surface tablets, and the 12.9 inch iPad Pro—all of which support a stylus—the display may not only need to be positioned to various angles and orientations, with respect to the base, but it may also need to support the load and the pressure of a human hand pressing a stylus against the display surface of the tablet or phablet at multiple viewing and writing angles, both for ergonomic reasons and to eliminate distracting reflections or glare.

In addition, as the latest generation of smart phones have practically replaced most dedicated point and shoot cameras and have even started encroaching on digital single-lens reflex ("DSLR") cameras, such as the new iPhone 7 Plus, they are being put to use all day long—and even the most robust smart-phone/tablet batteries of today cannot currently provide sustained energy for a 16-hour per day of continued operation without the need for recharging—which makes it imperative to devise a simple, thin, light, and robust mechanism for the smooth and quick interchanging of the batteries of the next generation of smart phones and tablets.

The multitude of offerings from several manufacturers of smart phones, tablets, and tablet accessories reveal that the great majority of current tablets, tablet stands, folios, and covers provide either fixed or limited adjustability; typically resulting in either one or two display angles (with respect to a resting surface or base).

A company that currently offers a display stand or a tablet accessory with several display angles is ZeroChroma, LLC (http://www.zerochroma.com) through their "VarioProtect" and "VarioEdge" and "Vortex" covers for the iPhone and iPad. While the ZeroChroma, LLC designs provide multiple viewing angles that can effectively eliminate glare and provide an ergonomic viewing experience, their designs are relatively complex, are prone to sliding and breaking after repeated use, add substantial weight to the device they enclose, and only provide for a single load bearing viewing angle that can support hand-writing with a stylus without potentially sliding the display during hand-writing.

An analysis of existing display stands, kick stands, and other rotation lock technologies related to electronic display panels revealed that most current rotation lock technologies do not incorporate a rotation locking mechanism at the hinge (rotation joint) but rather rely mostly on notches and grooves that are parallel to the hinge's axis to stop the rotation of a pivoting display panel, as in the case of most tablet covers and stands. Nevertheless, a few companies have recently begun to use different approaches for positioning a display tablet to various angles and orientations with respect to a base; for example, ZeroChroma uses a series of flexible springy "bumps" that are transverse to the axis of rotation of the pivoting support element or stand to fix the rotation of the stand, but this kind of approach makes the mechanism prone to sliding as the springy bumps lose plasticity after repeated use. Microsoft on the other hand appears to use a combination of cams and springs to prop the angular positioning of their Surface computers' kick stands, and Lenovo has introduced a new kickstand hinge with their new 12-inch ideapad Miix 700 that uses a watchband like hinge technology that enables their tablet computers to assume a vast amount of usage positions. However, none of these technologies provide for a load bearing rotation lock mechanism that would enable electronic display devices to support the load and the pressure of a human hand pressing a stylus against the display surface of a tablet at multiple viewing and writing angles, and none that we could find, could accommodate the smooth and quick interchanging of smart phone and tablet batteries on the go. Therefore, a need exists for a compact, thin, light, economical, and robust technology that not only can support a large number of adjustable viewing angles for a display stand, but that can also support the load and the pressure of a human hand pressing a stylus against the display surface of a tablet at multiple viewing and writing angles and that can accommodate the interchanging of smart phone and tablet batteries and on the go.

SUMMARY OF THE INVENTION

I invented and disclose herein a detachable, rotation locking, load bearing, support mechanism including mirrored disks or cylinders with teeth or a combination of both that interlock radially between their inner and outer surface areas, or frontal areas, or both, where one of the disks or cylinders is attached to a fixed surface area and the other disk or cylinder is attached to a common pivoting arm, plate, or other kind of load bearing support element, and where the mirrored disks or cylinders are able to mesh (lock) and un-mesh (unlock) from the other fixed disk or cylinder by protruding or retracting laterally over a continuous or divided, axis, shaft, or channel thereby freezing the angular position of the pivoting arm, plate, or other kind of load bearing support element with respect to the fixed surface area at the time the disks, cylinders, or a combination of both, mesh (lock) with each other and unfreezing the pivoting arm, plate, or other kind of load bearing support element to pivot freely with respect to the fixed surface area when the disks, cylinders, or combination of both un-mesh (unlock) from one another.

Whereas the unlocking is achieved over a divided axis, shaft, or channel, the un-meshing (or unlocking) of the mirrored disks and cylinders will result in a complete detachment (disconnect) of the pivoting load bearing support element from the fixed surface area that is attached to the opposing disk or cylinder.

A practical application of the above concept would consist of a hinge or clamp assembly comprising a first plate or arm including a slot and outer cylindrical bores on opposite sides of the slot, wherein the outer cylindrical bores are coaxial;

a second plate or arm seated in the slot of the first plate or arm and the second plate or arm comprising two mirrored cylinders or stepped cylinders on opposite ends of the second plate or arm that are coaxial with the outer cylindrical bores; wherein each mirrored cylinder or stepped cylinder can slide in opposite direction along the common longitudinal axis of the outer cylindrical bores and engage with an outer cylindrical bore and wherein the second plate or arm moves rotationally relative to the first plate or arm about a longitudinal common axis defined by the full length of the outer cylindrical bores;

a locking mechanism including the two mirrored cylinders or stepped cylinders that are integrated into the second plate or arm and configured to move axially in opposite directions along the longitudinal axis of the outer cylindrical bores, are separated by a common biasing mechanism such as a spring or other kind of pliable structure that urges the mirrored cylinders or stepped cylinders to displace axially in opposite directions; the mirrored cylinders or stepped cylinders having a least one first locking region with faceted sides, ridges, or teeth on an outer or an inner circumference of the cylinders.

at least one chamber coaxial with and receiving one of the mirrored cylinders or stepped cylinders located within each of the outer cylindrical bores of the first plate or arm wherein the at least one chamber includes a non-locking region and a second locking region adjacent or neighboring to the non-locking region along the direction of the longitudinal axis of the bores, wherein the non-locking region includes a smooth internal cylindrical wall and the second locking region includes an internal wall with faceted, ridged or toothed internal surfaces that are configured to receive and interlock with faceted sides, ridges, or teeth of the at least one first locking region on an outer circumference of the mirrored cylinders or stepped cylinders;

and wherein the mirrored cylinders or stepped cylinders have a locked position where the first locking region of the cylinders is interlocking partially or fully with the second locking region of the at least one chamber located within each of the outer cylindrical bores, the mirrored cylinders or stepped cylinders and the second plate or arm that is attached to them are in the locked position, and the second plate or arm is prevented from rotating relative to the outer cylindrical bores and the first plate or arm that is attached to them.

and wherein the mirrored cylinders or stepped cylinders have an unlocked position where the first locking region of the cylinders is fully disengaged from the second locking region and inside the non-locking region of the at least one chamber located within each of the outer cylindrical bores, the mirrored cylinders or stepped cylinders and the second plate or arm that is attached to them are in the unlocked position, and the second plate or arm is free to rotate relative to the outer cylindrical bores and the first plate or arm that is attached to them.

and wherein the mirrored cylinders or stepped cylinders have a detached position where the cylinders are positioned fully outside of the outer cylindrical bores, the mirrored cylinders or stepped cylinders and the second plate or arm that is attached to them are in the detached position, and the second plate or arm is completely detached from the outer cylindrical bores and the first plate or arm that is connected to them.

and wherein the biasing mechanism is configured to urge the mirrored cylinders or stepped cylinders axially along the longitudinal axis of the bores in a direction to engage the first and the second locking regions thereby preventing the first plate or arm and the second plate or arm from pivoting relative to one another;

and wherein, in some embodiments, two release posts are configured to be manually displaced to urge the mirrored cylinders or stepped cylinders axially along the longitudinal axis of the bores in a direction to disengage the first and second locking regions, thereby allowing the second plate or arm to pivot relative to the first plate or arm or to be completely detached from the first plate or arm.

As stated above and provided in this disclosure, the load bearing rotation lock mechanism disclosed herein may be embodied in various designs that enhance the functionality, ergonomic, and enjoyment of electronic displays, input devices, and other devices such as lamps, clamps, and other mechanisms that could benefit from discrete, detachable, load bearing rotation locking mechanisms.

BRIEF DESCRIPTION OF THE DRAWINGS

FIG. 1A shows in partial cross section an exemplary embodiment of a rotation lock mechanism with a cylindrical chamber configured to receive a disk with teeth attached to a shaft. The cylindrical chamber houses a hex socket.

FIG. 1B shows in partial cross section an exemplary embodiment of a rotation lock mechanism consisting of a disk with teeth connected to a multi-faceted shaft just before being inserted into a cylindrical chamber housing a hex socket.

FIG. 1C shows in partial cross section an exemplary embodiment of a rotation lock mechanism consisting of a disk with teeth connected to a multi-faceted shaft positioned in a chamber where the surface is smooth and cylindrical and where the disk with teeth that is connected to the multi-faceted shaft would be allowed to pivot freely.

FIG. 1D shows in partial cross section an exemplary embodiment of a rotation lock mechanism consisting of a disk with teeth connected to a multi-faceted shaft positioned in a chamber housing a hex socket where the disk with teeth that is connected to the multi-faceted shaft would be prevented from pivoting.

FIGS. 3A, 4A, 5A, 6A and 7A illustrate a three dimensional perspective view of multiple permutations of a multi-faceted cylinder and shaft that are fastened to a pivoting support element and a double chambered hollow cylinder or socket that can receive the multi-faceted cylinder and shaft that are fastened to a pivoting support element, wherein either the multi-faceted cylinder or the shaft is about to enter the double chambered hollow cylinder or socket.

FIGS. 3B, 4B, 5B, 6B and 7B illustrate a cross section perspective view of multiple permutations of a multi-faceted cylinder and shaft that are fastened to a pivoting support element and a double chambered hollow cylinder or socket that can receive the multi-faceted cylinder and shaft that are fastened to a pivoting support element, wherein either the multi-faceted cylinder or the shaft is about to enter the double chambered hollow cylinder or socket.

FIGS. 3C, 4C, 5C, 6C and 7C illustrate a cross section perspective view of multiple permutations of a multi-faceted cylinder and shaft that are fastened to a pivoting support element and a double chambered hollow cylinder or socket that can receive the multi-faceted cylinder and shaft that are fastened to a pivoting support element, wherein either the multi-faceted cylinder or the shaft is positioned in the first receptacle of the double chambered hollow cylinder or socket.

FIGS. 3D, 4D, 5D, 6D and 7D illustrate a cross section perspective view of multiple permutations of a multi-faceted cylinder and shaft that are fastened to a pivoting support element and a double chambered hollow cylinder or socket that can receive the multi-faceted cylinder and shaft that are fastened to a pivoting support element, wherein either the multi-faceted cylinder or the shaft is positioned in the second receptacle of the double chambered hollow cylinder or socket.

FIG. 8 Illustrates a non-limiting example of a brace-based stand incorporating a rotation lock mechanism that may be integrated into the back panel of smart phones, tablets, and other devices that would enable users to prop the phone, tablet, or other devices to any desired viewing angle.

FIGS. 12A-15A and 12B-15B together are a sequence of three-dimensional drawings of a brace-based stand and rotation lock mechanism that when displayed one after another provide a flip chart animation showing how the example non-limiting brace-based rotation lock mechanism can be unlocked, rotated, and relocked.

FIGS. 20A-22A and 20B-22B together are a sequence of three-dimensional drawings of a brace-based stand and rotation lock mechanism that when displayed one after another provide a flip chart animation showing how the example non-limiting brace-based stand and rotation lock mechanism can be locked using an alternative placement of the locking parts; where the double chambered hollow cylinder or socket is situated at either end of the brace and the multi-faceted cylinder or shaft is positioned on the rotating ring.

DETAILED DESCRIPTION

Figure 2A:
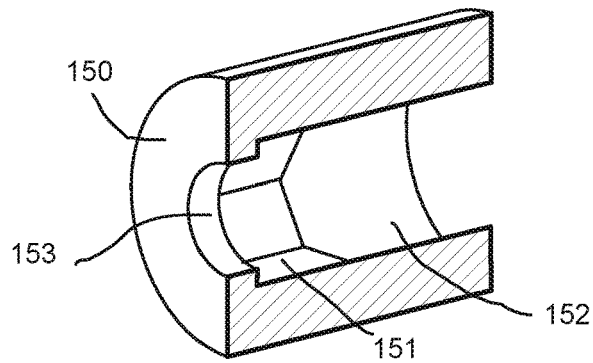
FIG. 2A shows in partial cross section an exemplary embodiment of a rotation lock mechanism with a cylindrical chamber configured to receive a multi-faceted shaft. The cylindrical chamber houses a hex socket.

Concept of the Invention:

FIGS. 1A to 2D illustrate the concept of this invention. These illustrations illuminate the essence of this invention which is that of two disks or cylinders with teeth or a combination of both that can interlock radially between their inner and outer surface areas, or frontal areas, or both, where one of the disks or cylinders is attached to a fixed surface area and the other disk or cylinder is attached to a pivoting arm, plate, or other kind of load bearing support element, and where one of the disks or cylinders is able to mesh (lock) and un-mesh (unlock) from the other disk or cylinder by protruding, retracting, or sliding laterally over a common, continuous or divided axis, shaft, or channel thereby freezing the angular position of the pivoting arm, plate, or other kind of load bearing support element with respect to the fixed surface area at the time the disks, cylinders, or a combination of both, mesh (lock) with each other and unfreezing the pivoting arm, plate, or other kind of load bearing support element to pivot freely with respect to the fixed surface area when the disks, cylinders, or combination of both un-mesh (unlock) from one another.

Whereas the unlocking is achieved over a divided axis, shaft, or channel, the un-meshing (or unlocking) of the disks and cylinders will result in a complete detachment (disconnect) of the pivoting support element from the fixed surface area that is attached to the opposing disk or cylinder.

FIG. 1A illustrates a 3-D cross-sectional perspective representation of an exemplary rotation lock mechanism using a cylindrical chamber 150 configured to receive a disk with teeth attached to a shaft. The cylindrical chamber 150 is divided into a first chamber 151 and a second chamber 152.

The second chamber 152 is positioned at the wide open end of the cylindrical chamber and is round, smooth, and tubular so that when the disk with teeth that is attached to a shaft is positioned in the second chamber 152, a pivoting support element that may be fastened to the shaft that is attached to the disk with teeth is allowed to pivot freely around the axis of the cylindrical chamber 150.

The first chamber 151 that is adjacent to the second chamber is shaped like a socket or aperture that is the inverse of the disk with teeth so that when the ending of the disk with teeth comes in contact with the first chamber they interlock and the pivoting support element that is fastened to the shaft that is attached to the disk with teeth is prevented from pivoting. The figure also shows a circular opening 153 at the edge of the hollowed cylindrical housing into which a structure such as a push-button may be inserted that would disengage the exemplary disk with teeth from the first chamber 151 and into the second chamber 152 where it would be allowed to pivot freely without the need to fully disengage from the cylindrical chamber 150.

FIG. 1B shows a shows a perspective view of a rotation lock mechanism using a cylindrical chamber 150 and a disk with teeth 140 attached to a shaft 130 just before being inserted into second chamber 152 where it would be allowed to pivot freely.

FIG. 1C shows a perspective view of a rotation lock mechanism using a cylindrical chamber 150 containing a disk with teeth 140 attached to a shaft 130 positioned in second chamber 152 where it would be allowed to pivot freely.

FIG. 1D shows a perspective view of a rotation lock mechanism using a cylindrical chamber 150 containing a disk with teeth 140 attached to a shaft 130 just having been inserted into first chamber 151 where it would be prevented from pivoting.

FIG. 2A shows a perspective view of a rotation lock mechanism using a cylindrical chamber 150 configured to receive a multi-faceted or toothed cylinder. The cylindrical chamber 150 is divided into a first chamber 151 and a second chamber 152.

The second chamber 152 is positioned at the wide open end of cylindrical chamber 150 and is round, smooth, and tubular so that when the multi-faceted or toothed cylinder is positioned in the second chamber 152, a pivoting support element that may be fastened to the multi-faceted or toothed cylinder is allowed to pivot freely around the axis of the cylindrical chamber 150.

The first chamber 151 that is adjacent to the second chamber is shaped like a socket or aperture that is the inverse of the multi-faceted or toothed cylinder so that when the ending of the multi-faceted or toothed cylinder comes in contact with the first chamber they interlock and the pivoting support element that is fastened to the multi-faceted or toothed cylinder is prevented from pivoting. The figure also shows a circular opening 153 at the edge of the hollowed cylindrical housing into which a structure such as a push-button may be inserted that would disengage the exemplary multi-faceted or toothed cylinder from the first chamber 151 and into the second chamber 152 where it would be allowed to pivot freely without the need to fully disengage from the cylindrical chamber 150.

Figure 2B:
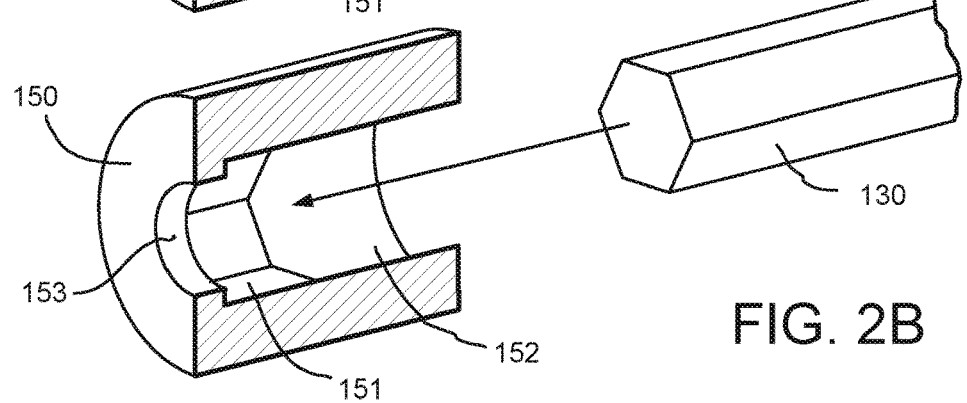
FIG. 2B shows in partial cross section an exemplary embodiment of a rotation lock mechanism consisting of a multi-faceted shaft just before being inserted into a cylindrical chamber housing a hex socket.

FIG. 2B shows a perspective view of a rotation lock mechanism using a cylindrical chamber 150 containing a multi-faceted or toothed cylinder 130 just before being inserted into second chamber 152 where it would be allowed to pivot freely.

Figure 2C:
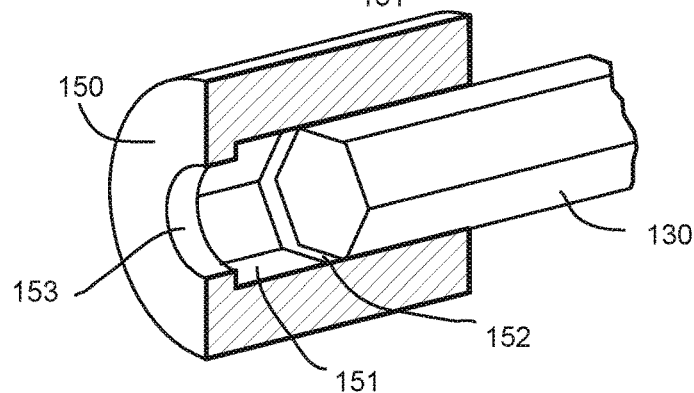
FIG. 2C shows in partial cross section an exemplary embodiment of a rotation lock mechanism consisting a multi-faceted shaft positioned in the section of the cylindrical chamber where the surface is smooth and cylindrical and where the multi-faceted shaft would be allowed to pivot freely.

FIG. 2C shows a perspective view of a rotation lock mechanism using a cylindrical chamber 150 containing a multi-faceted or toothed cylinder 130 positioned in second chamber 152 where it would be allowed to pivot freely.

Figure 2D:
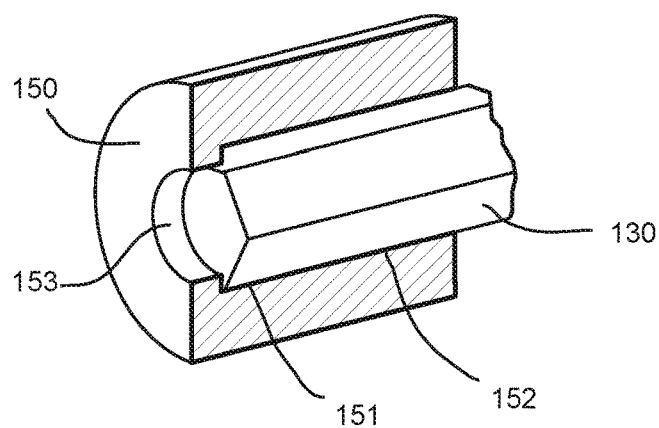
FIG. 2D shows in partial cross section an exemplary embodiment of a rotation lock mechanism consisting of a multi-faceted shaft positioned in the section of the chamber housing a matching multi-faceted hex socket where the multi-faceted shaft would be prevented from pivoting.

FIG. 2D shows a perspective view of a rotation lock mechanism using a cylindrical chamber 150 containing a multi-faceted or toothed cylinder 130 just having been inserted into first chamber 151 where it would be prevented from pivoting.

Exemplary Concept Manifestations:

FIGS. 3A to 7D illustrate exemplary manifestations of the concept of this invention. For the purposes of these non-limiting exemplary manifestations of the concept of this invention, in FIGS. 3A-7D, pivoting element 190 may be assumed to be attached to an arm, plate, or other kind of load bearing support element, and cylindrical chamber 195 may be assumed to be attached to a fixed surface area.

FIG. 3A illustrates a non-limiting exemplary three dimensional perspective view of another manifestation of the concept of this invention. Thus, this example non-limiting manifestation illustrates a three dimensional perspective view of a multi-faceted cylinder 192 that is fastened to pivoting element 190 through a connecting shaft 191 and a cylindrical chamber 195 that is divided into a first chamber 194 and a second chamber 193. The second chamber 193 is positioned at the wide open end of cylindrical chamber 195 and is round, smooth, and tubular so that when multi-faceted cylinder 192 is positioned in the second chamber 193, pivoting element 190 that is fastened to multi-faceted cylinder 192 through connecting shaft 191 is allowed to pivot freely around the axis of cylindrical chamber 195. First chamber 194 that is adjacent to second chamber 193 is a hollow cavity that is shaped like a socket that is the inverse of multi-faceted cylinder 192 so that when multi-faceted cylinder 192 comes in contact with first chamber 194 they interlock and pivoting element 190 that is fastened to multi-faceted cylinder 192 through connecting shaft 191 is prevented from pivoting.

FIG. 3B illustrates a cross section perspective view of multi-faceted cylinder 192 of FIG. 3A wherein multi-faceted cylinder 192 is about to enter cylindrical chamber 195.

FIG. 3C illustrates a cross section perspective view of multi-faceted cylinder 192 of FIG. 3A wherein multi-faceted cylinder 192 is about to enter the inverse multi-faceted socket 194 of cylindrical chamber 195

FIG. 3D illustrates a cross section perspective view of the multi-faceted cylinder 192 of FIG. 3A wherein multi-faceted cylinder 192 is thrust into cylindrical chamber 195 and is interlocked with the inverse multi-faceted socket 194 of cylindrical chamber 195, thereby freezing the rotation of pivoting element 190 relative to cylindrical chamber 195.

FIG. 4A illustrates yet another manifestation of the concept of this invention. Thus, this example non-limiting implementation illustrates a three dimensional perspective view of a multi-faceted cylinder 192 that is fastened to pivoting element 190 on one side and is connected to protruding shaft 191 that is round, smooth, and tubular on the other side, and a cylindrical chamber 195 that is divided into a first chamber 193 and a second chamber 194. The second chamber 194 is a multi-faceted hollow cavity that is shaped like a socket and is positioned at the wide open end of cylindrical chamber 195 and is the inverse of multi-faceted cylinder 192 so that when multi-faceted cylinder 192 comes in contact with first chamber 194 they interlock and pivoting element 190 that is fastened to multi-faceted cylinder 192 is prevented from pivoting. However, when protruding shaft 191 first comes in contact with second chamber 194, pivoting element 190 that is fastened to multi-faceted cylinder 192 is allowed to continue to pivot freely around the axis of cylindrical chamber 195. First chamber 193 that is adjacent to second chamber 194 is round, smooth, and tabular and is used to accommodate protruding shaft 191 when multi-faceted cylinder 192 interlocks with second chamber 194.

FIG. 4B illustrates a cross section perspective view of protruding shaft 191 of FIG. 4A wherein protruding shaft 191 is about to enter cylindrical chamber 195.

FIG. 4C illustrates a cross section perspective view of multi-faceted cylinder 192 of FIG. 4A wherein multi-faceted cylinder 192 is about to enter the inverse multi-faceted socket 194 of cylindrical chamber 195.

FIG. 4D illustrates a cross section perspective view of the multi-faceted cylinder 192 of FIG. 4A wherein multi-faceted cylinder 192 is thrust into cylindrical chamber 195 and is interlocked with the inverse multi-faceted socket 194 of cylindrical chamber 195, thereby freezing the rotation of pivoting element 190 relative to cylindrical chamber 195.

FIG. 5A illustrates yet another manifestation of the concept of this invention. Thus, this example non-limiting implementation illustrates a three dimensional perspective view of a multi-faceted cylinder 192 that is fastened to pivoting element 190 on one side and is connected to protruding shaft 191 that is round, smooth, and tubular on the other side, and a cylindrical chamber 195 configured with a multi-faceted hollow cavity that is shaped like a socket 194 that is the inverse of the multi-faceted cylinder 192 so that when multi-faceted cylinder 192 is thrust into the multi-faceted socket 194, multi-faceted cylinder 192 and cavity 194 interlock freezing the rotation of pivoting element 190 relative to cylindrical chamber 195. However, when protruding shaft 191 that is round, smooth, and tubular first enters the inverse multi-faceted socket 194 of cylindrical chamber 195, pivoting element 190 is allowed to continue pivoting freely around the axis of cylindrical chamber 195.

FIG. 5B illustrates a cross section perspective view of protruding shaft 191 of FIG. 5A wherein protruding shaft 191 is about to enter the inverse multi-faceted socket 194 of cylindrical chamber 195.

FIG. 5C illustrates a cross section perspective view of multi-faceted cylinder 192 of FIG. 5A wherein multi-faceted cylinder 192 is about to enter the inverse multi-faceted socket 194 of cylindrical chamber 195.

FIG. 5D illustrates a cross section perspective view of the multi-faceted cylinder 192 of FIG. 5A wherein multi-faceted cylinder 192 is thrust into cylindrical chamber 195 and is interlocked with the inverse multi-faceted socket 194 of cylindrical chamber 195, thereby freezing the rotation of pivoting element 190 relative to cylindrical chamber 195.

FIG. 6A illustrates yet another manifestation of the concept of this invention. Thus, this example non-limiting manifestation illustrates a three dimensional perspective view of a multi-faceted cylinder 192 that is fastened to pivoting element 190 through a connecting shaft 191 and a cylindrical chamber 195 that is divided into a first chamber 193 and a second chamber 194. The second chamber 194 is positioned at the wide open end of cylindrical chamber 195 and is a hollow cavity that is shaped like a socket that is the inverse of multi-faceted cylinder 192 so that when multi-faceted cylinder 192 comes in contact with second chamber 194 they interlock and pivoting element 190 that is fastened to multi-faceted cylinder 192 through connecting shaft 191 is prevented from pivoting. First Chamber 193 is round, smooth, and tubular so that when multi-faceted cylinder 192 is positioned in first chamber 193, pivoting element 190 that is fastened to multi-faceted cylinder 192 through connecting shaft 191 is allowed to pivot freely around the axis of cylindrical chamber 195.

FIG. 6B illustrates a cross section perspective view of multi-faceted cylinder 192 of FIG. 6A wherein multi-faceted cylinder 192 is about to enter the inverse multi-faceted socket 194 of cylindrical chamber 195, thereby freezing the rotation of pivoting element 190 relative to cylindrical chamber 195.

FIG. 6C illustrates a cross section perspective view of multi-faceted cylinder 192 of FIG. 6A wherein multi-faceted cylinder 192 is interlocked with the inverse multi-faceted socket 194 of cylindrical chamber 195, thereby freezing the rotation of pivoting element 190 relative to cylindrical chamber 195.

FIG. 6D illustrates a cross section perspective view of the multi-faceted cylinder 192 of FIG. 6A wherein multi-faceted cylinder 192 has been thrust into first chamber 193 and pivoting element 190 that is fastened to multi-faceted cylinder 192 through connecting shaft 191 is allowed to pivot freely around the axis of cylindrical chamber 195.

Figure 7A:
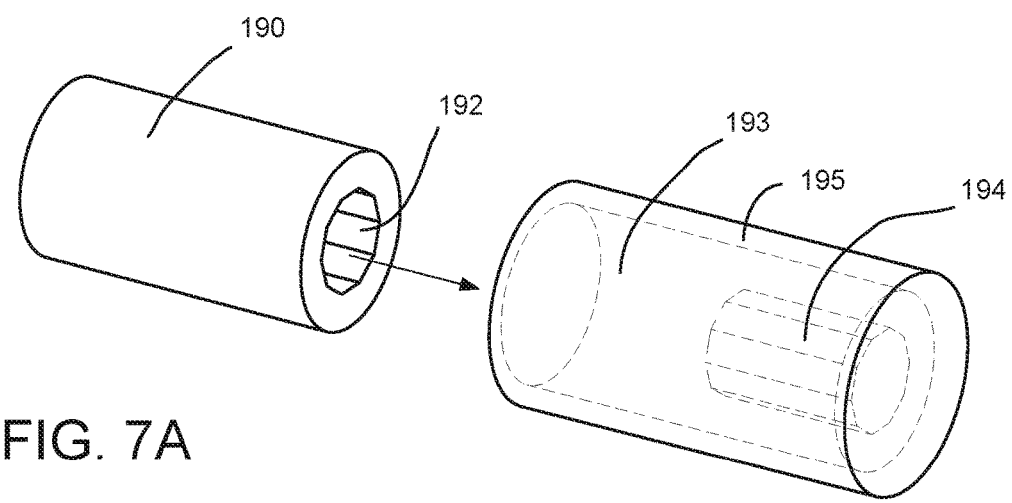

FIG. 7A illustrates yet another manifestation of the concept of this invention using an alternative locking technique. Thus, this example non-limiting manifestation illustrates a three dimensional perspective view of a pivoting element 190 which includes a hollow shaft that includes a locking area 192 that consists of a hollow multi-faceted inner cylinder, and an unlocking area 191 that consists of a hollow round and smooth tubular area, and a wider cylindrical chamber 195 that can envelop the locking and unlocking areas of pivoting element 190 and that is divided into an unlocking area 193 that consist of a hollow round and smooth tubular area and a locking area 194 that consists of a protruding multi-faceted locking shaft. The unlocking area 193 is positioned at the wide open end of cylindrical chamber 195 so that when multi-faceted locking area 192 is positioned inside cylindrical chamber 195, in the unlocking area 193, pivoting element 190 that is fastened to locking area 192 through unlocking area 191 is allowed to pivot freely around the axis of cylindrical chamber 195, but when multi-faceted locking area 192 is thrust further into cylindrical chamber 195, it interlocks with protruding multi-faceted locking shaft 194 and pivoting element 190 that is fastened to multi-faceted locking area 192 through unlocking area 191 is prevented from pivoting.

FIG. 7B illustrates a cross section perspective view of multi-faceted locking area 192 of FIG. 7A wherein multi-faceted locking area 192 is about to enter cylindrical chamber 195.

FIG. 7C illustrates a cross section perspective view of multi-faceted locking area 192 of FIG. 7A wherein multi-faceted locking area 192 is about to intersect with the inverse multi-faceted locking shaft 194 of cylindrical chamber 195.

FIG. 7D illustrates a cross section perspective view of the multi-faceted cylinder 192 of FIG. 7A wherein multi-faceted locking area 192 has been thrust further into cylindrical chamber 195 and is interlocked with the inverse multi-faceted locking shaft 194 of cylindrical chamber 195, thereby freezing the rotation of pivoting element 190 relative to cylindrical chamber 195.

Exemplary Concept Embodiments:

The following figures illustrate how exemplary mechanisms that embody the concept of this invention can lead to a variety of novel and useful designs and applications that may enhance the functionality, ergonomic, and enjoyment of electronic display and input devices.

What primarily differentiates one exemplary mechanism from another is the kind and structure of the interlocking disks and cylinders, the presence, location, and type of a biasing structure that biases one of the disks or cylinders along their common axis, shaft, or channel, and the type of user-manipulable controls for engaging and disengaging the interlocking disks or cylinders e.g. press or pull and release of a button or other control.

The displayed embodiments are shown for exemplary purposes; the various parts shown in the provided illustrations, such as gears, shafts, hinges, openings, springs, buttons, and plates can have various shapes and sizes to fit the desired form and function of the devise in which they are integrated.

Pivoting Brace Rotation Lock Mechanism

FIG. 8 illustrates an exemplary embodiment of the illustrated exemplary concept manifestation of FIGS. 3A-3D where a multi-faceted cylinder that is attached to a pivoting element is thrust into a hollow inverse multi-faceted chamber of a multi-chambered cylindrical socket that is attached to a fixed surface in order to interlock and freeze the rotational position of the pivoting element with respect to the fixed surface at the time the multi-faceted cylinder was thrust into the inverse multi-faceted chamber of the socket. In this non-limiting example, the wire or brace-based stand 200 incorporating a rotation lock mechanism 202 on either ends of the wire or brace-based stand may be integrated into the back panel of smart phones, tablets, and other devices, or into the back panel of a smart phone or tablet enclosure that would enable users to prop the phones, tablets, or other devices to multiple viewing angles. The pivoting support element 200 which may consist of an Omega shaped structure with two legs 205A and 205B, a cross member connecting the legs 201, and malleable joints 203A, 203B, 206A and 206B may be seated in a recess of a back panel of a smart phone enclosure, a tablet enclosure, or a tablet support plate, wherein the pivoting support element 200 is fastened to, or terminated, with two multi-faceted or toothed cylinders 209A and 209B that may be machined or cast. The multi-faceted or toothed cylinders may be inserted into two divided cylindrical sockets 215A and 215B that are configured to receive the multi-faceted or toothed cylinders 209A and 209B. The cylindrical sockets 215A and 215B may be embedded in a sidewall of a recess in the back panel of a smart phone or tablet enclosure. The multi-faceted or toothed cylinders 209A and 209B and cylindrical sockets 215A and 215B share a common axis aligned with the axis of the pivoting support element 200. The divided cylindrical chambers 215A and 215B comprise a first chamber 211A and 211B and a second chamber 213A and 213B respectively.

The first chambers 211A and 211B are positioned at the opening end of cylindrical sockets 215A and 215B, are round, smooth, and tubular so that when the multi-faceted or toothed cylinders 209A and 209B are positioned in the first chambers 211A and 211B of cylindrical sockets 215A and 215B, the fastened pivoting support element 200 is allowed to pivot freely around the axis of the cylindrical sockets.

The second chambers 213A and 213B that are at the closed end of the cylindrical sockets 215A and 215B, are hollow cavities with side walls that are the inverse of the multi-faceted or toothed cylinders 209A and 209B so that when the endings of the multi-faceted or toothed cylinders 209A and 209B come in contact with the second chambers 213A and 213B, they interlock, and the fastened pivoting support element 200 is prevented from pivoting.

Figure 9A:
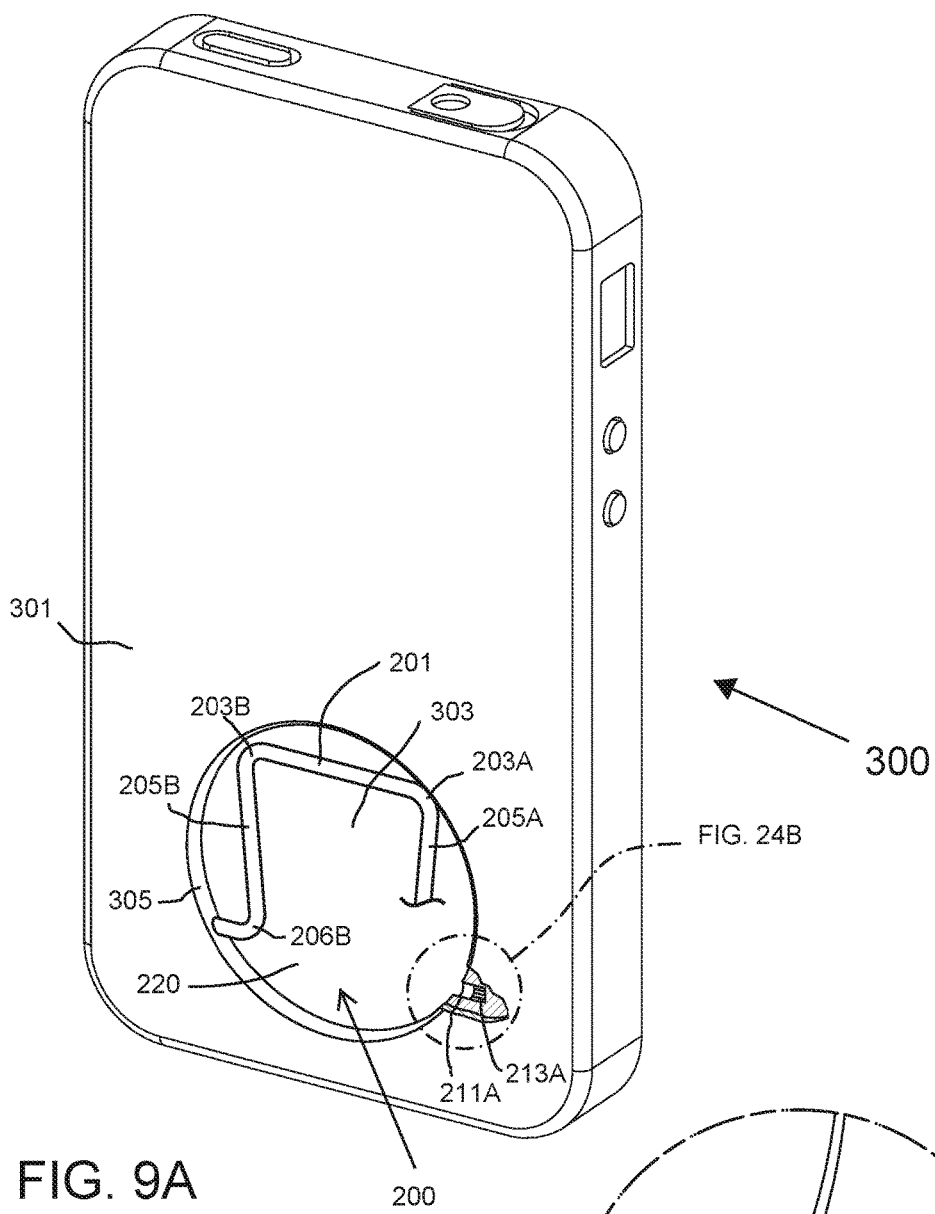
FIGS. 9A & 9B Illustrates a non-limiting example of a brace-based stand and rotation lock mechanism situated in the back of a smart phone and a close up view of the inner walls of one of the two cylindrical chambers housing a socket that are imbedded in the wall of the cavity housing the brace.
Figure 9B:
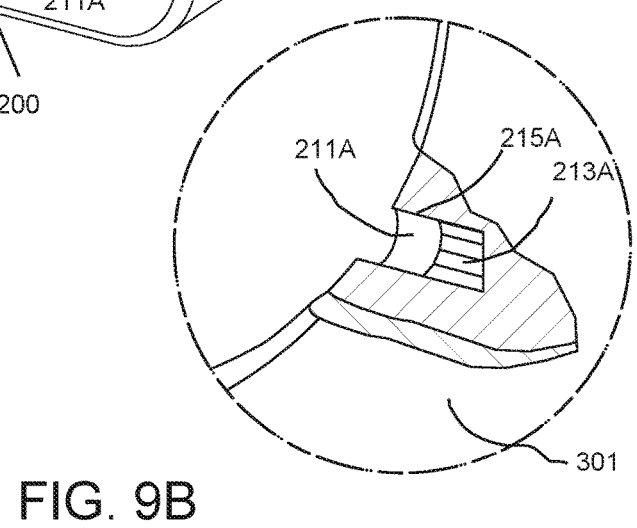

FIGS. 9A & 9B Illustrates a non-limiting example of a brace-based stand and rotation lock mechanism 200 situated in the back of a smart phone 300 and a close up view of the inner walls of the first chamber 211A and the second chamber 213A of socket 215A that is imbedded in the wall 305 of the cavity 303 housing the brace 200.

Figure 10A:
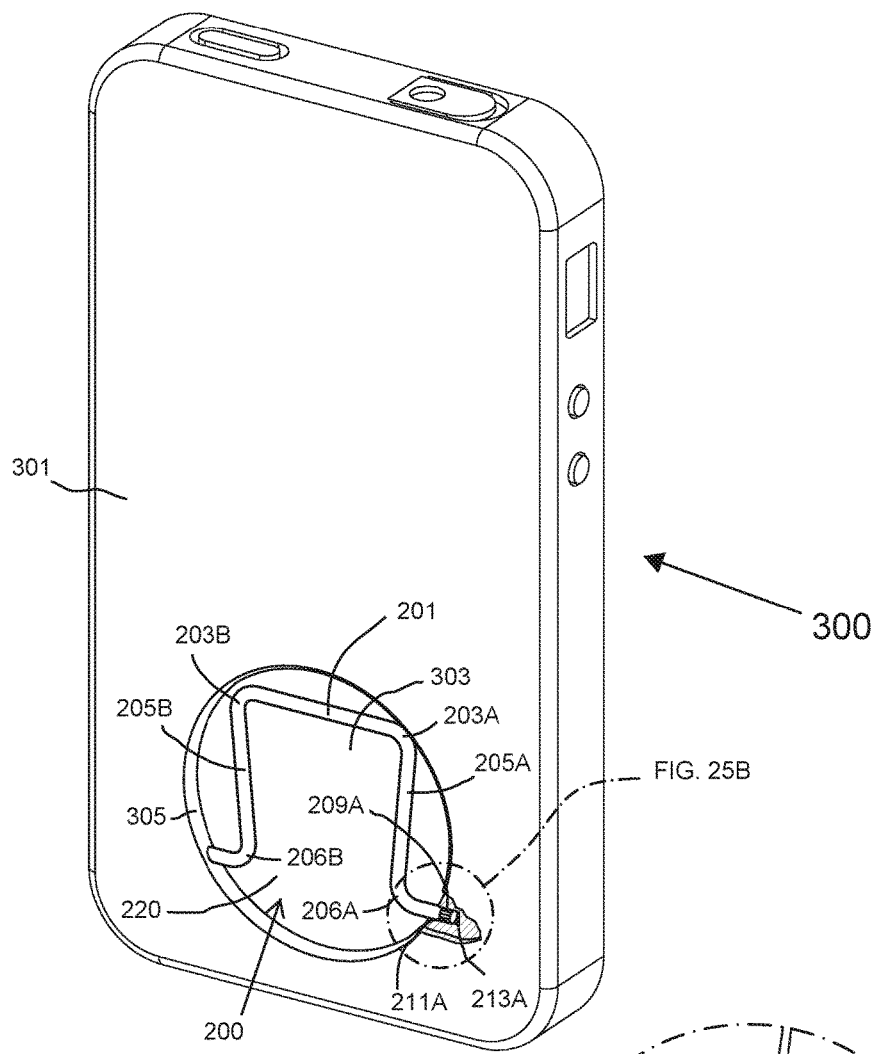
FIGS. 10A & 10B Illustrates a non-limiting example of a brace-based stand and rotation lock mechanism situated in the back of a smart phone and a close up view of how the ends of the brace interlock with the inner walls of the cylindrical chambers that are imbedded in the wall of the cavity housing the brace.
Figure 10B:
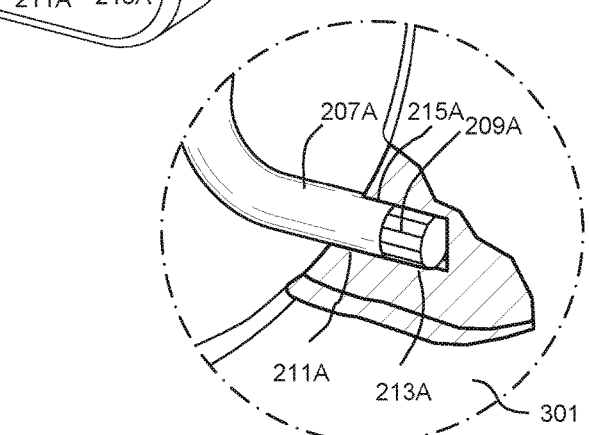

FIGS. 10A & 10B Illustrates a non-limiting example of a brace-based stand and rotation lock mechanism 200 situated in the back of a smart phone 300 and a close up view of how one end of the brace 209A interlocks with second chamber 213A of socket 215A that is imbedded in the wall 305 of the cavity 303 housing the brace 200.

Figure 11:
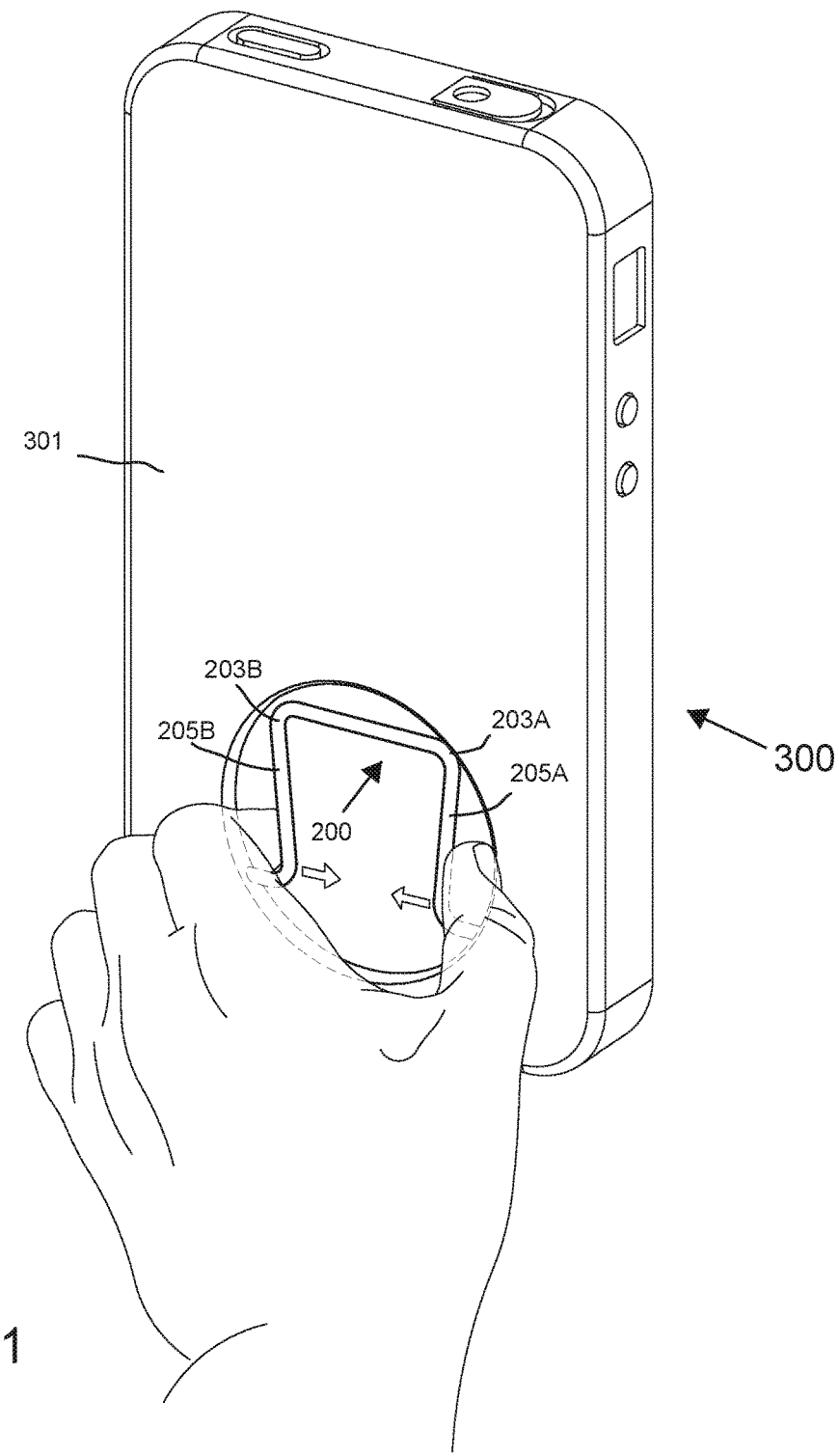
FIG. 11 Illustrates a human hand squeezing the brace-based stand and rotation lock mechanism situated in the back of a smart phone, unlocking it, prior to deployment as a support stand.

FIG. 11 Illustrates a human hand squeezing the brace-based stand and rotation lock mechanism 200 situated in the back 301 of a smart phone 300, unlocking it, prior to deployment as a support stand.

FIGS. 12A-15A and 12B-15B together are a sequence of three-dimensional drawings and close-up views of a brace-based stand and rotation lock mechanism 200 that when displayed one after another provide a flip chart animation showing how the example non-limiting brace-based rotation lock mechanism 200 can be unlocked, rotated, and relocked.

Figure 12A:
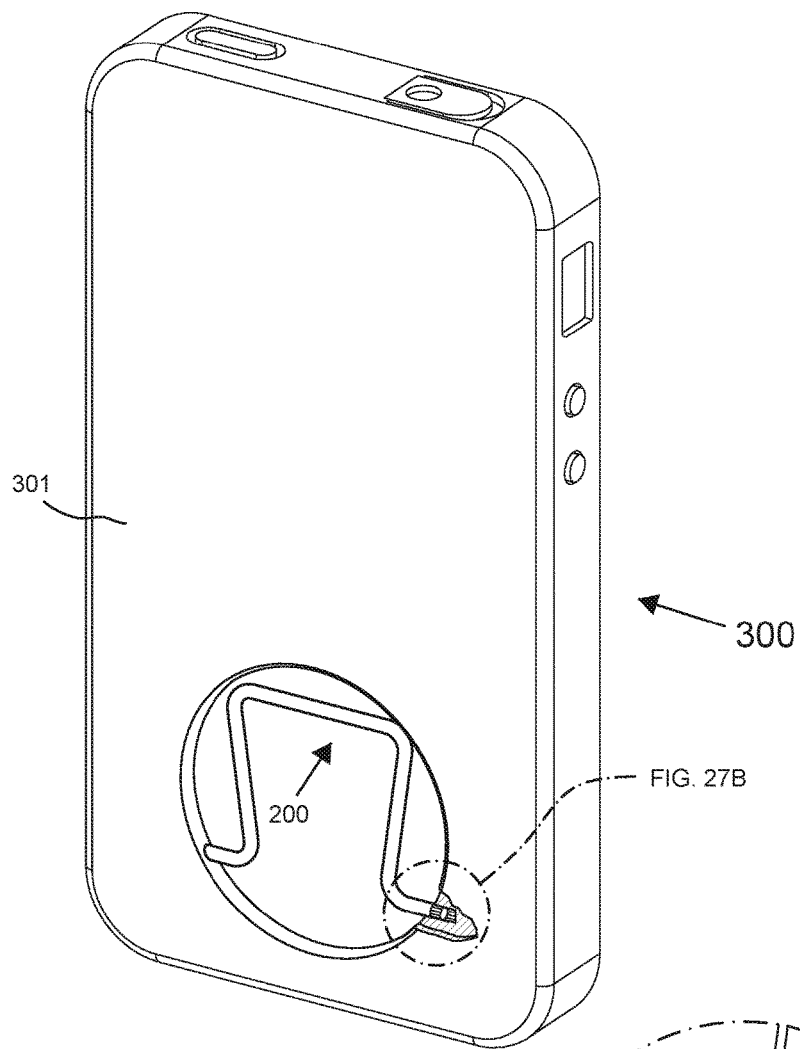
Figure 12B:
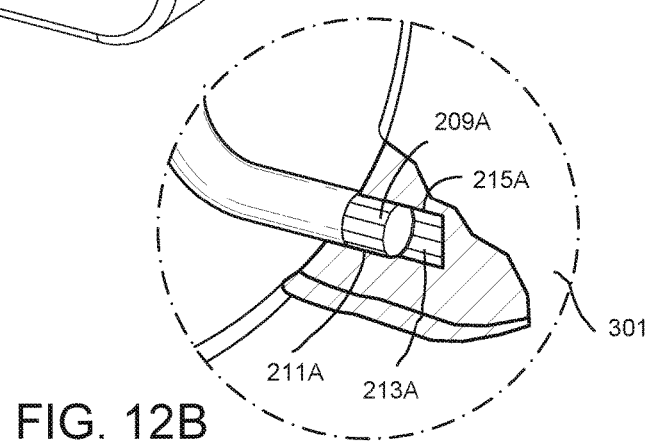

FIGS. 12A and 12B show the brace-based stand and rotation lock mechanism 200 in the unlocked position where the ends of the brace 209A and 209B are positioned in the first chambers 211A and 211B of cylindrical sockets 215A and 215B.

Figure 13A:
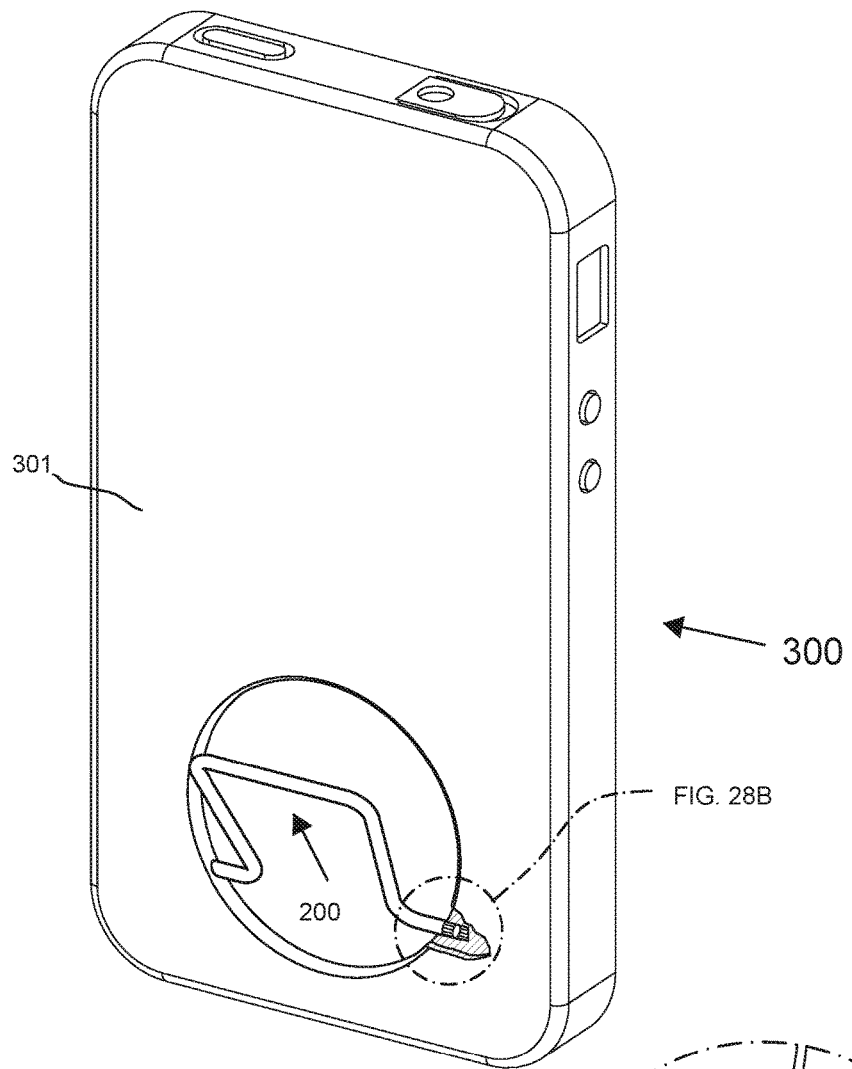
Figure 13B:
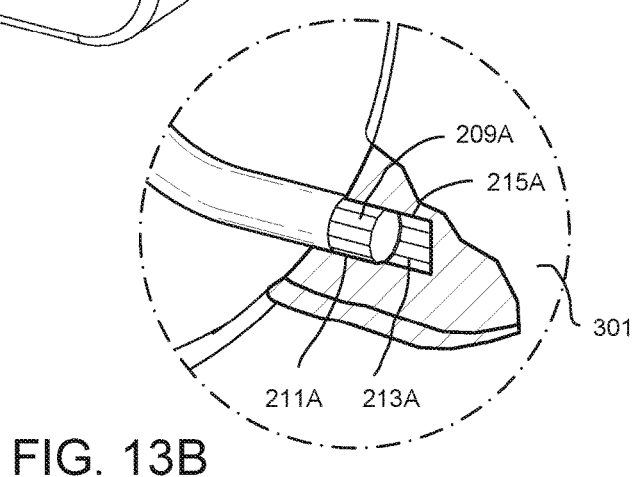

FIGS. 13A and 13B show the brace-based stand and rotation lock mechanism 200 in the unlocked position and being deployed to support the exemplary smart phone 300.

Figures 14A, 14B:
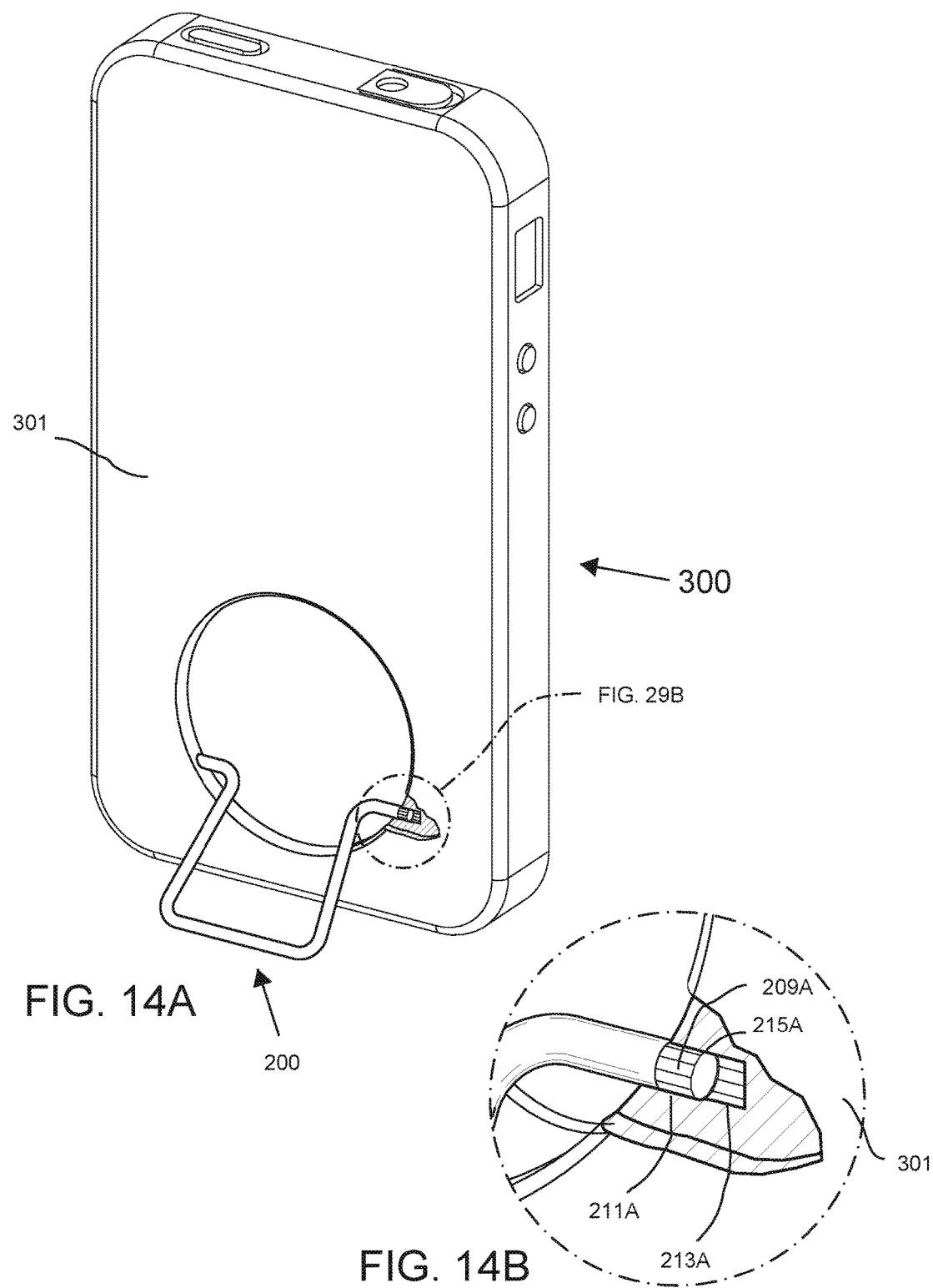

FIGS. 14A and 14B show the brace-based stand and rotation lock mechanism 200 still in the unlocked position after having been fully deployed to support the exemplary smart phone 300.

FIGS. 15A and 15B show the brace-based stand and rotation lock mechanism 200 in a final locked and deployed position supporting the exemplary smart phone 300.

Figure 16:
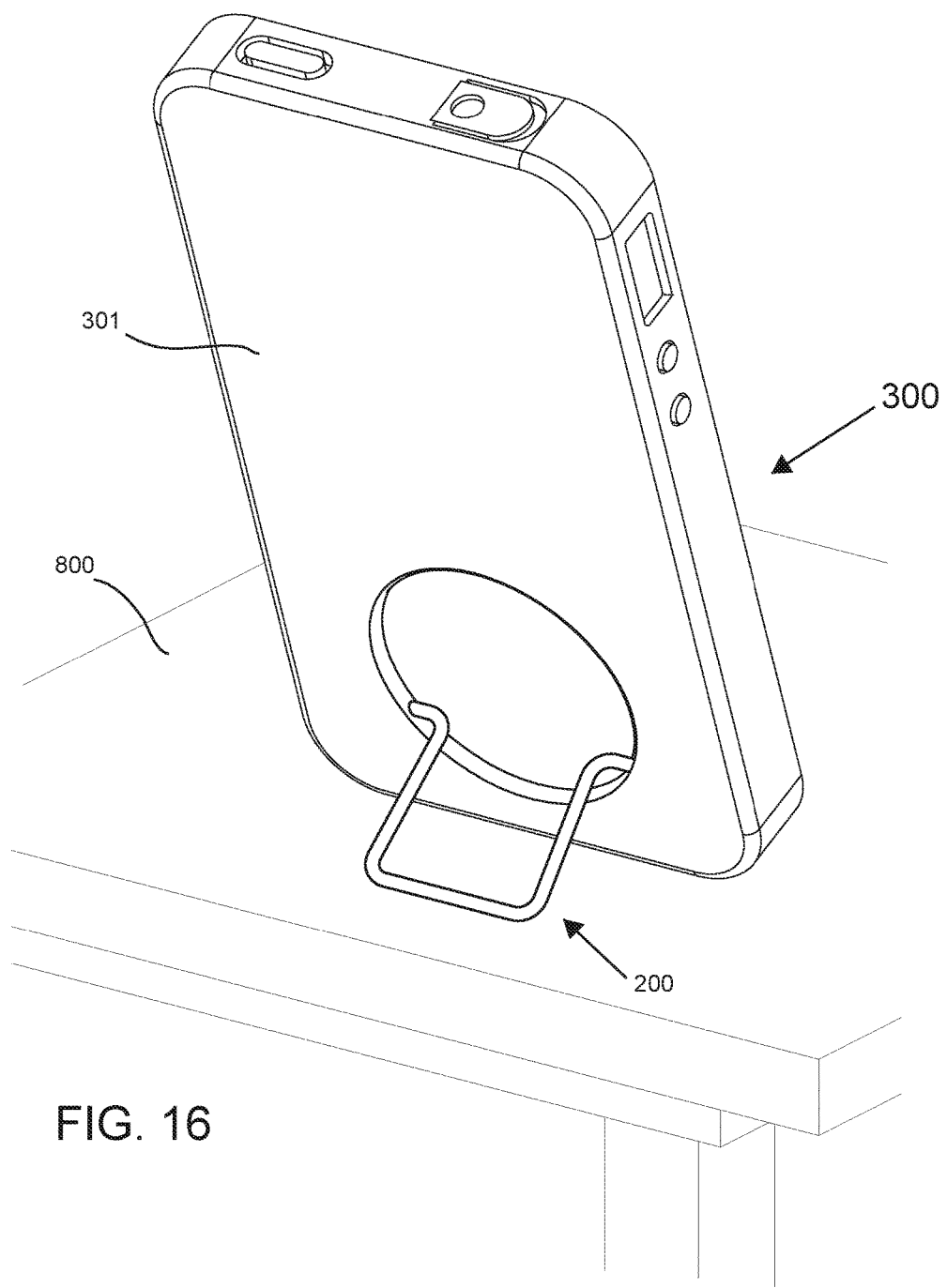
FIG. 16 Illustrates an example three-dimensional representation of a brace-based stand and rotation lock mechanism after the angular position of the brace had been adjusted and the brace released with the smart phone in a backward leaning portrait position.

FIG. 16 Illustrates an example three-dimensional representation of a brace-based stand and rotation lock mechanism 200 after the angular position of the brace had been adjusted and the brace released with the smart phone 300 resting on a flat surface in a backward leaning portrait position.

Figure 17:
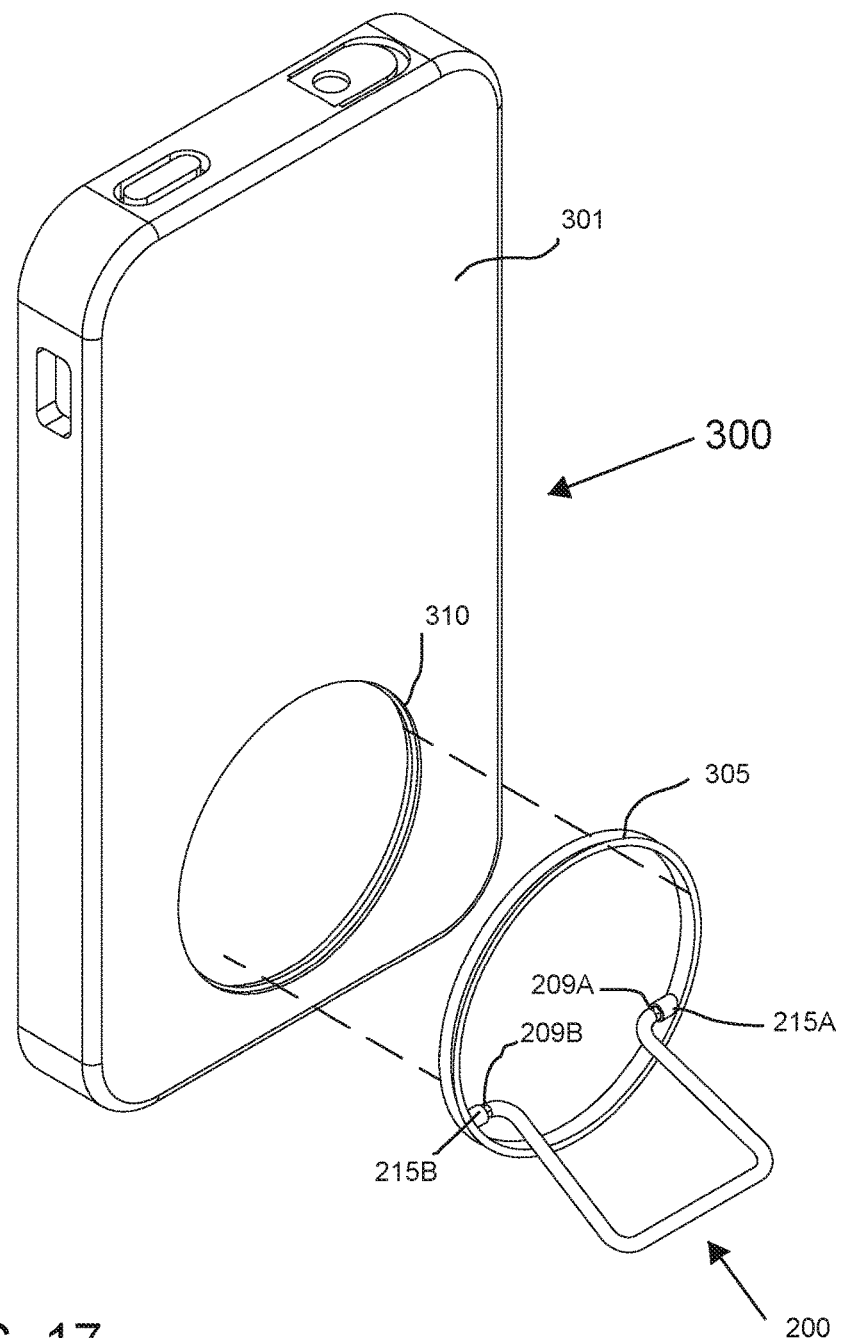
FIG. 17 illustrates an example three dimensional perspective view of how the brace-based stand and rotation locking mechanism can be mounted on a rotating ring.

FIG. 17 illustrates an example three dimensional perspective view of how the brace-based stand and rotation locking mechanism 200 can be mounted on a ring 305 that can be integrated into the back of a smart phone or the back of a smart phone protective enclosure 301 and rotated to provide angular support to the smart phone in both the portrait or landscape orientations. The Ring 305 is shaped with a groove in the middle that can latch onto a circular notch on the matching ring 310 that is located on the back of the smart phone or smart phone protective enclosure thereby allowing ring 305 to rotate freely around ring 310. Also, the brace-based stand and rotation lock mechanism 200 is mounted on ring 305 by attaching the cylindrical sockets 215A and 215B on the perimeter of ring 305 instead of having them embedded in the wall of the cavity housing the brace 200.

Figure 18A:
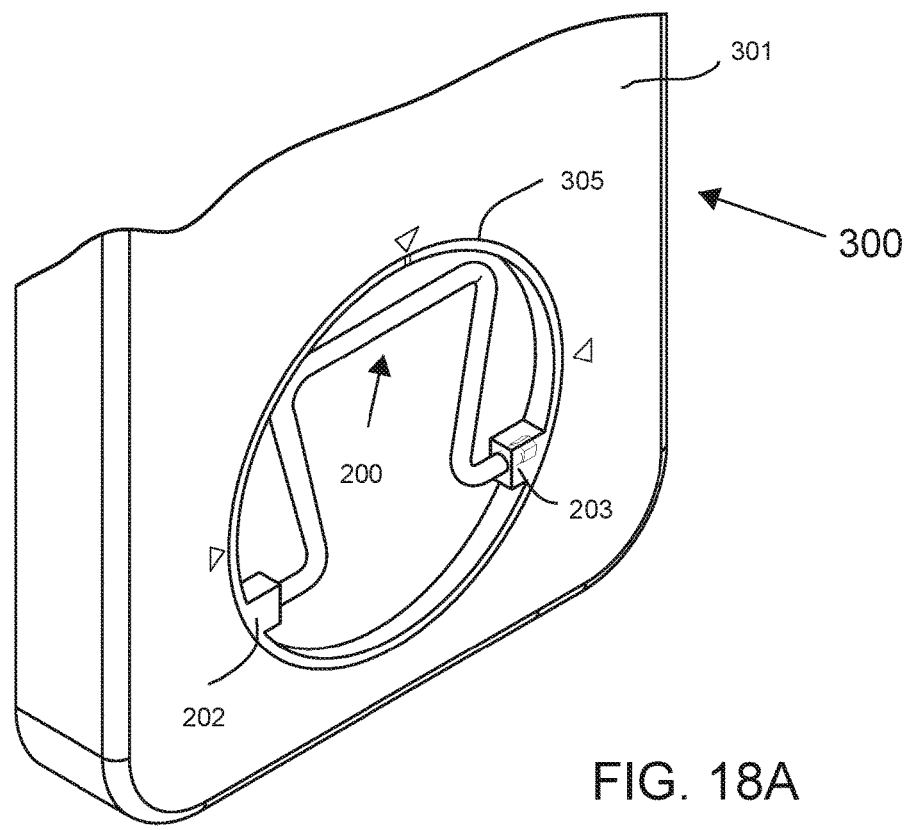
FIGS. 18A-18C illustrate a three-dimensional perspective view of how a brace-based stand and rotation lock mechanism mounted on a rotating ring can swivel from a portrait orientation to a landscape orientation to fix the angular position of a smart phone, tablet, or other type of device.
Figures 18B, 18C:
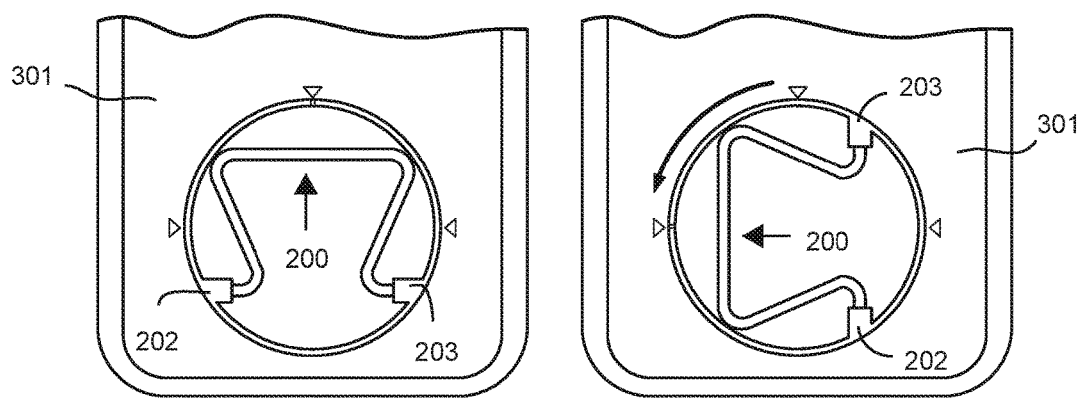

FIGS. 18A-18C illustrate a sequence of how a brace-based stand and rotation lock mechanism 200 mounted on a rotating ring 305 can swivel from a portrait orientation to a landscape orientation to fix the angular position of a smart phone, tablet, or other type of device.

Figure 19:
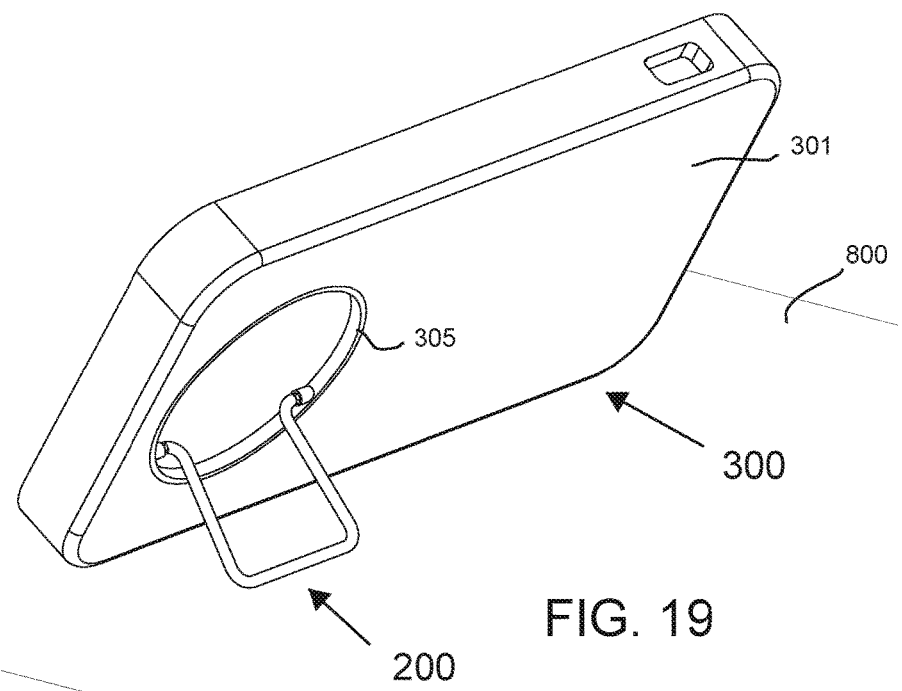
FIG. 19 Illustrates an example three-dimensional representation of a brace-based stand and rotation lock mechanism after the rotating ring has been swiveled to the landscape orientation and the angular position of the brace had been adjusted and the brace released with the smart phone in a backward leaning landscape orientation.
Figure 20A:
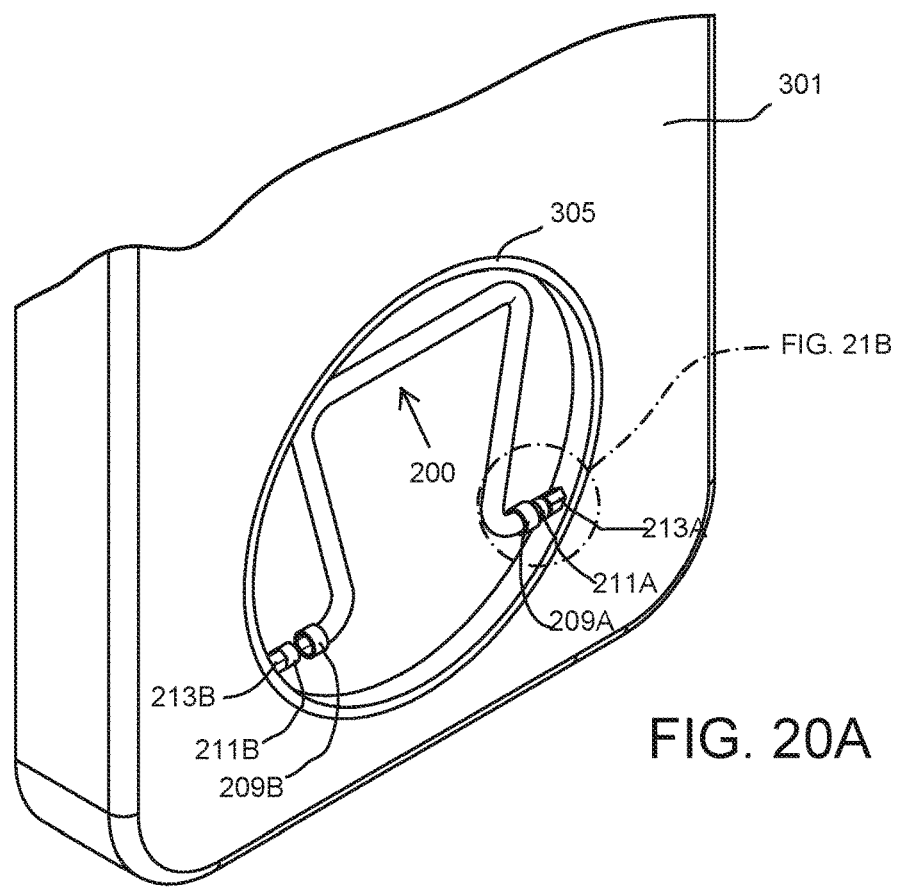
Figure 20B:
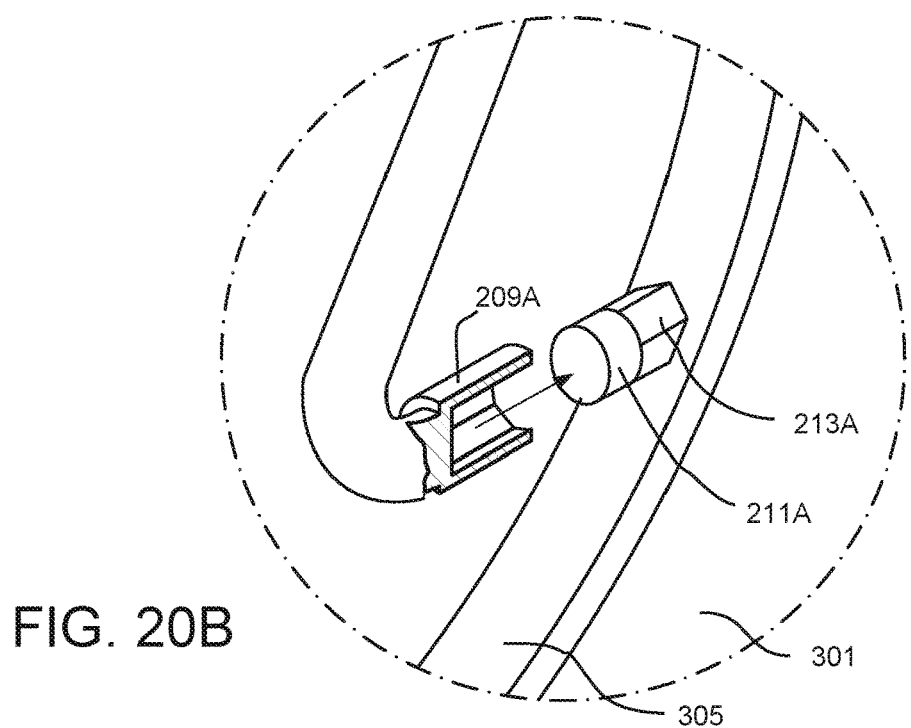
Figure 21A:
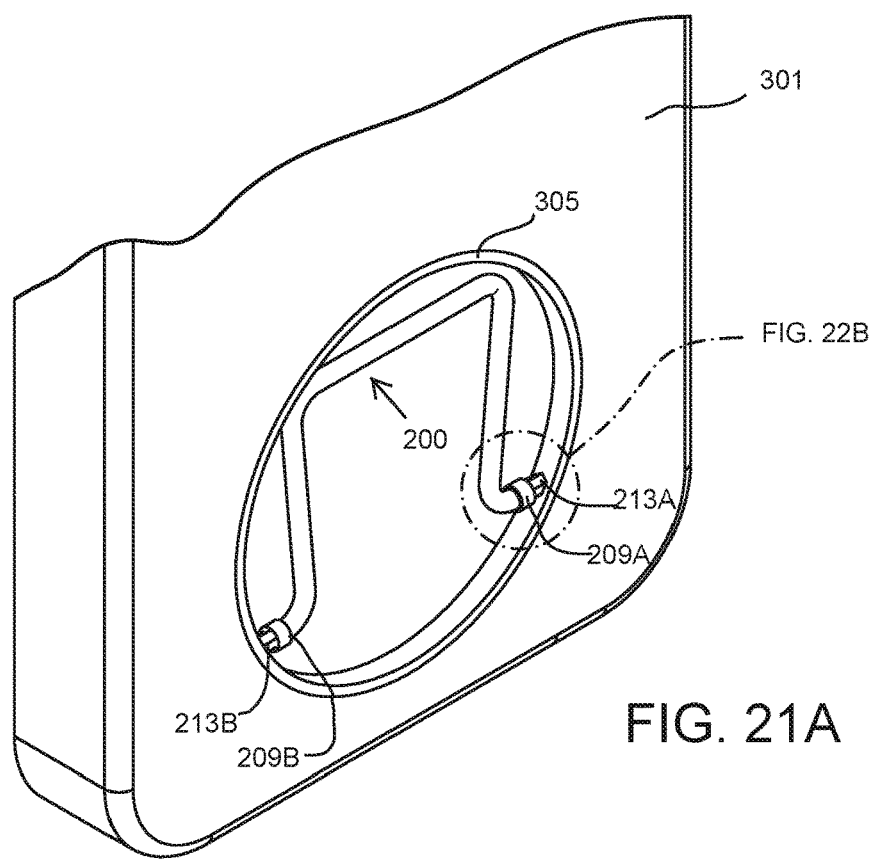
Figure 21B:
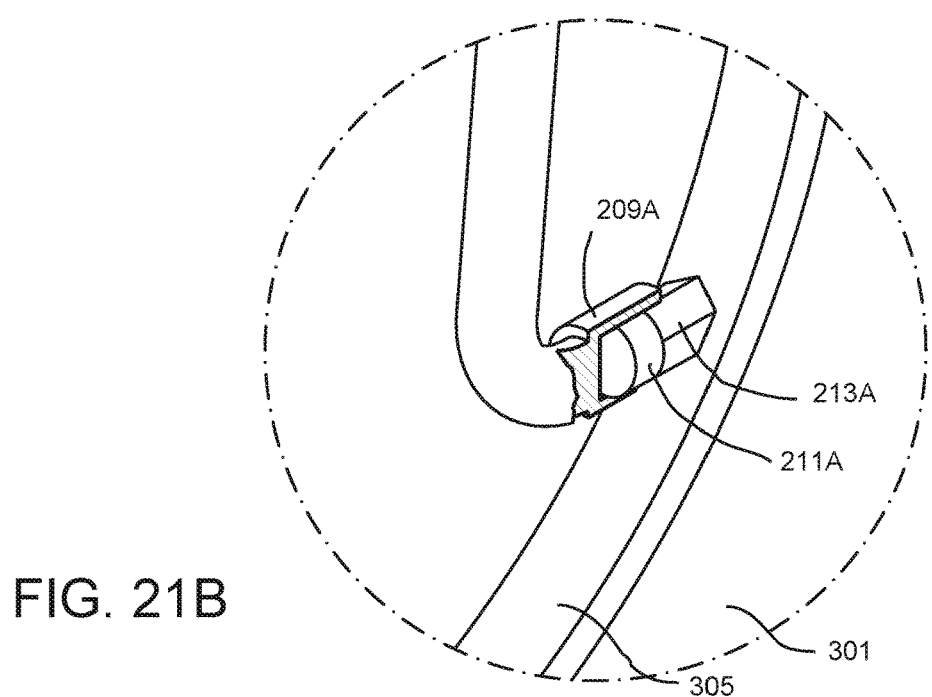
Figure 22A:
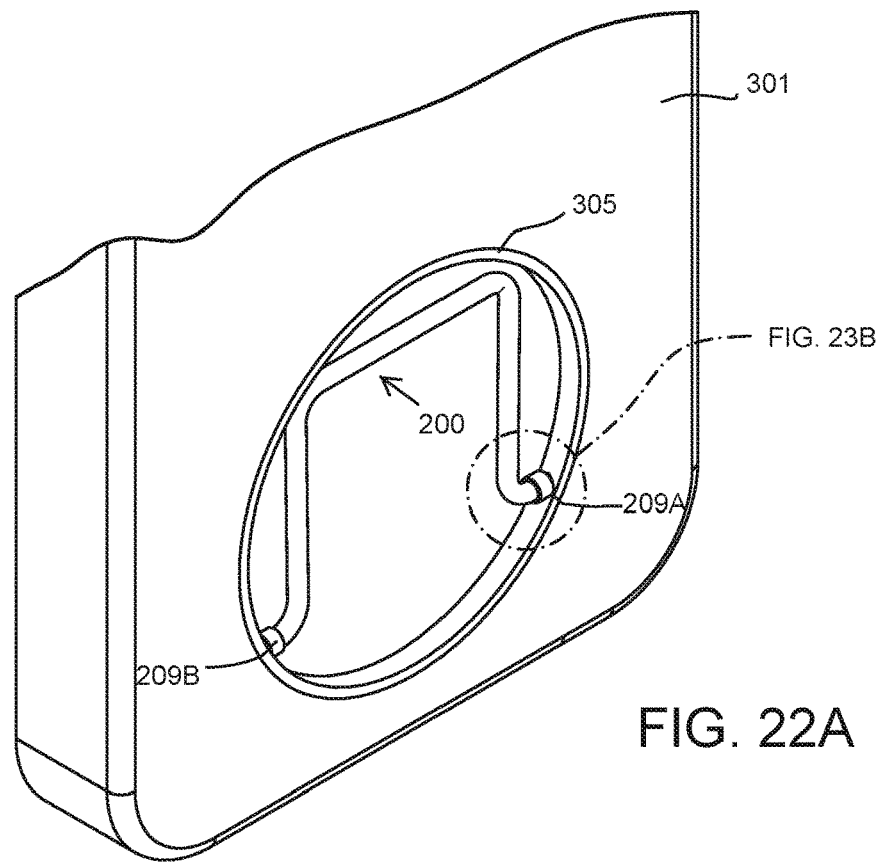
Figure 22B:
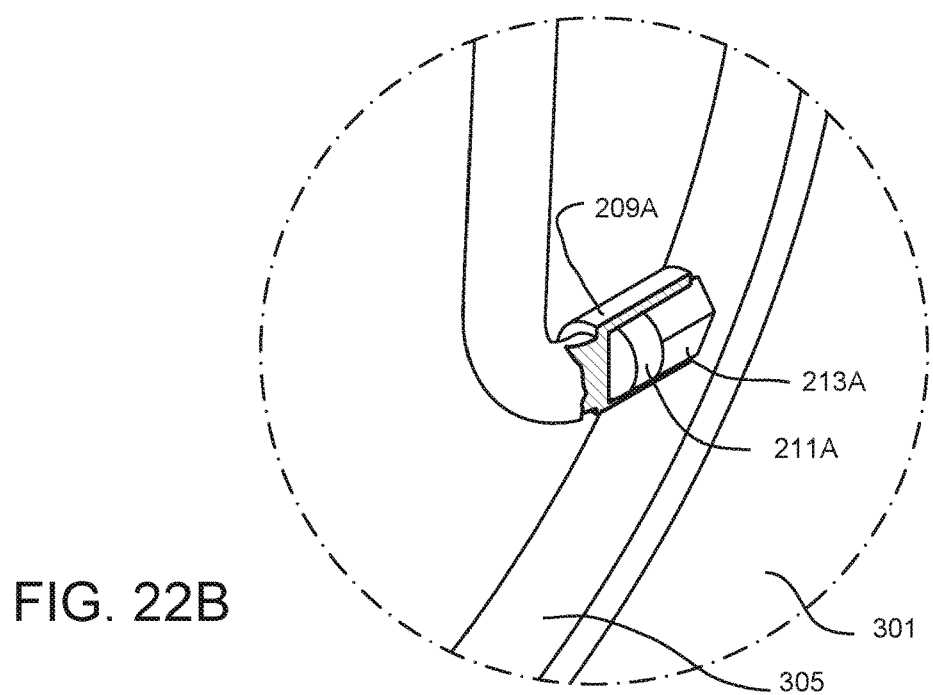

FIG. 19 Illustrates an example three-dimensional representation of a brace-based stand and rotation lock mechanism 200 after the rotating ring 305 has been swiveled to the landscape orientation and the angular position of the brace had been adjusted and the brace released with the smart phone in a backward leaning landscape orientation.

FIGS. 20A-22A and 20B-22B together are a sequence of three-dimensional drawings and close up views of a brace-based stand and rotation lock mechanism that when displayed one after another provide a flip chart animation showing how the example non-limiting brace-based stand and rotation lock mechanism 200 can be locked using an alternative placement of the locking parts; where the double chambered hollow cylinders or sockets 209A and 209B are situated at either end of the brace 200 and multi-faceted cylinders 213A and 213B, and smooth cylinders 211A and 211B are positioned on the rotating ring 305.

Figure 23:
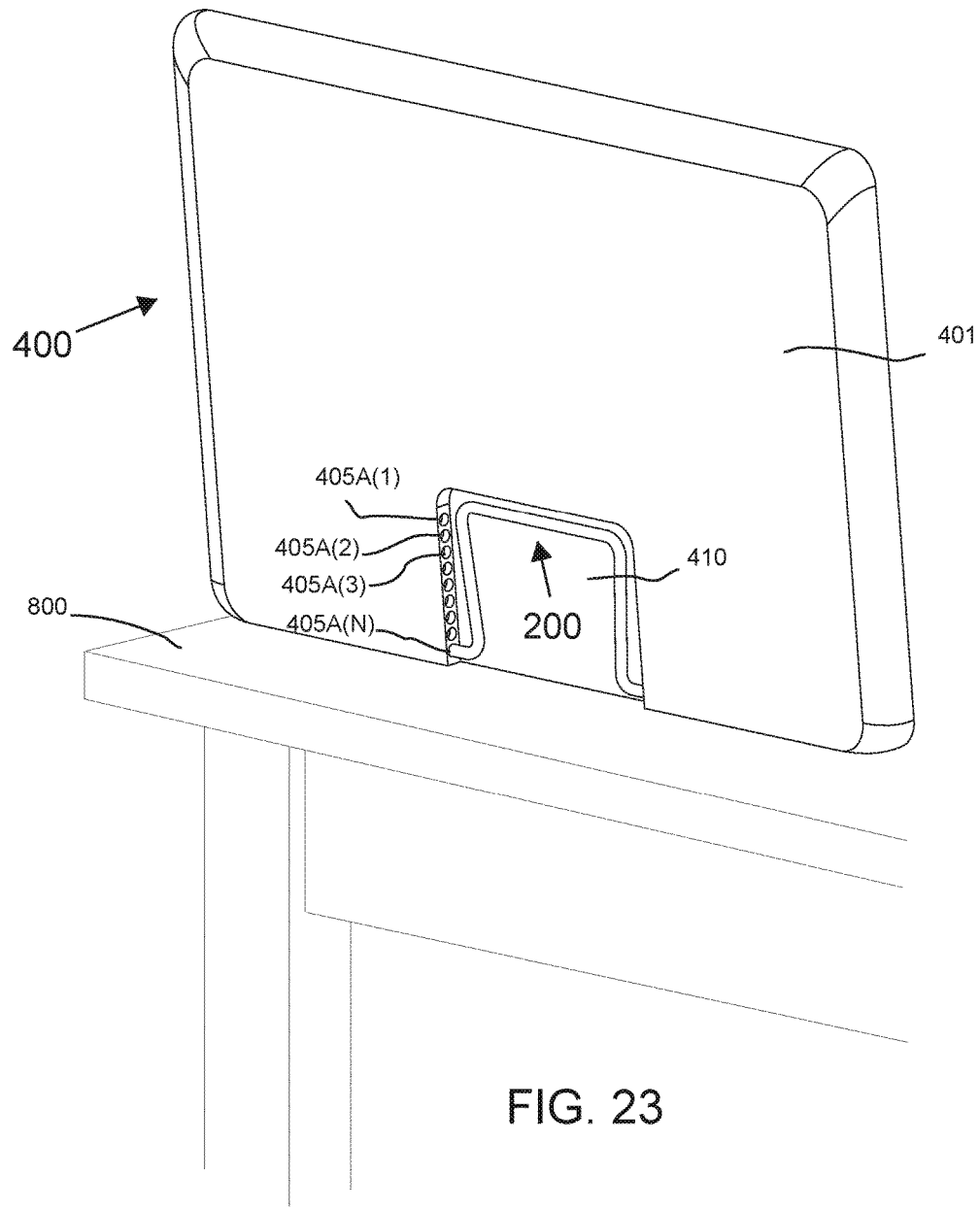
FIG. 23 illustrates a three dimensional perspective view of a non-limiting exemplary embodiment of a back panel for a tablet computer that can house a brace-based support stand and rotation lock mechanism that can prop up a display panel to various angular positions. The back panel includes a recess that encompass multiple double-chambered locking cylinders on the left and right sides of the recess walls.

FIG. 23 illustrates a three dimensional perspective view of a non-limiting exemplary embodiment of a back panel 401 for a tablet computer 400 or a protective cover for a tablet computer 400 that can house a brace-based support stand and rotation lock mechanism 200 that can prop up any kind of display panel to various angular positions. The back panel 401 includes a recess 410 that encompasses multiple double-chambered locking cylinders 405A(1) to 405A(N) on the left and 405B(1) to 405B(N) on the right sides of the recess walls.

Figure 24:
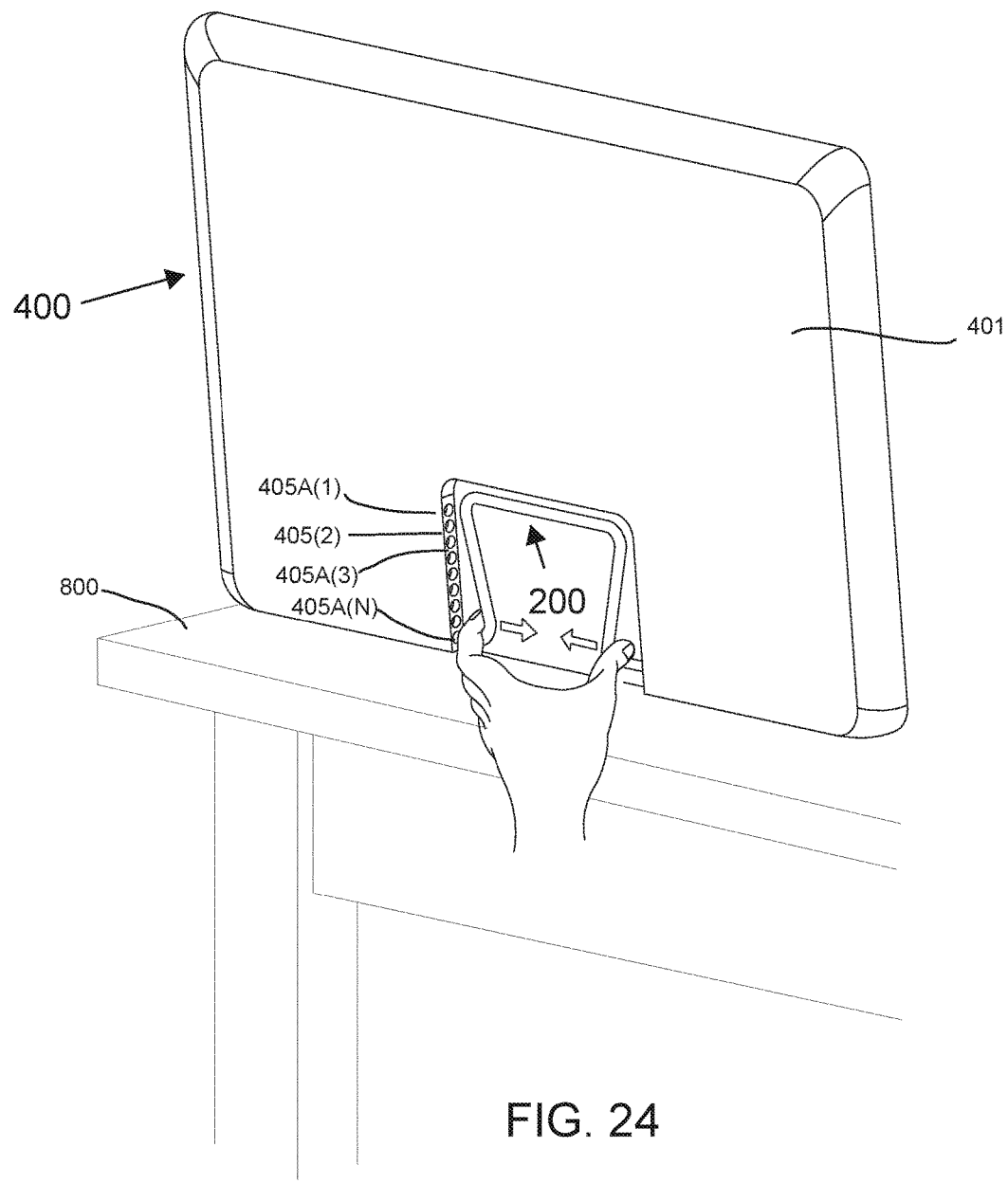
FIG. 24 Illustrates a human hand squeezing the brace-based stand and rotation lock mechanism situated in the back of the tablet computer, unlocking it, prior to deployment as a support stand.

FIG. 24 Illustrates a human hand squeezing the brace-based stand and rotation lock mechanism 200 situated in the back of the tablet computer 400 by displacing the ends of the brace 209A and 209B from first chambers 211A and 211B of cylindrical sockets 215A and 215B into second chambers 213A and 213B, thereby freeing the brace to rotate prior to deployment as a support stand.

Figure 25:
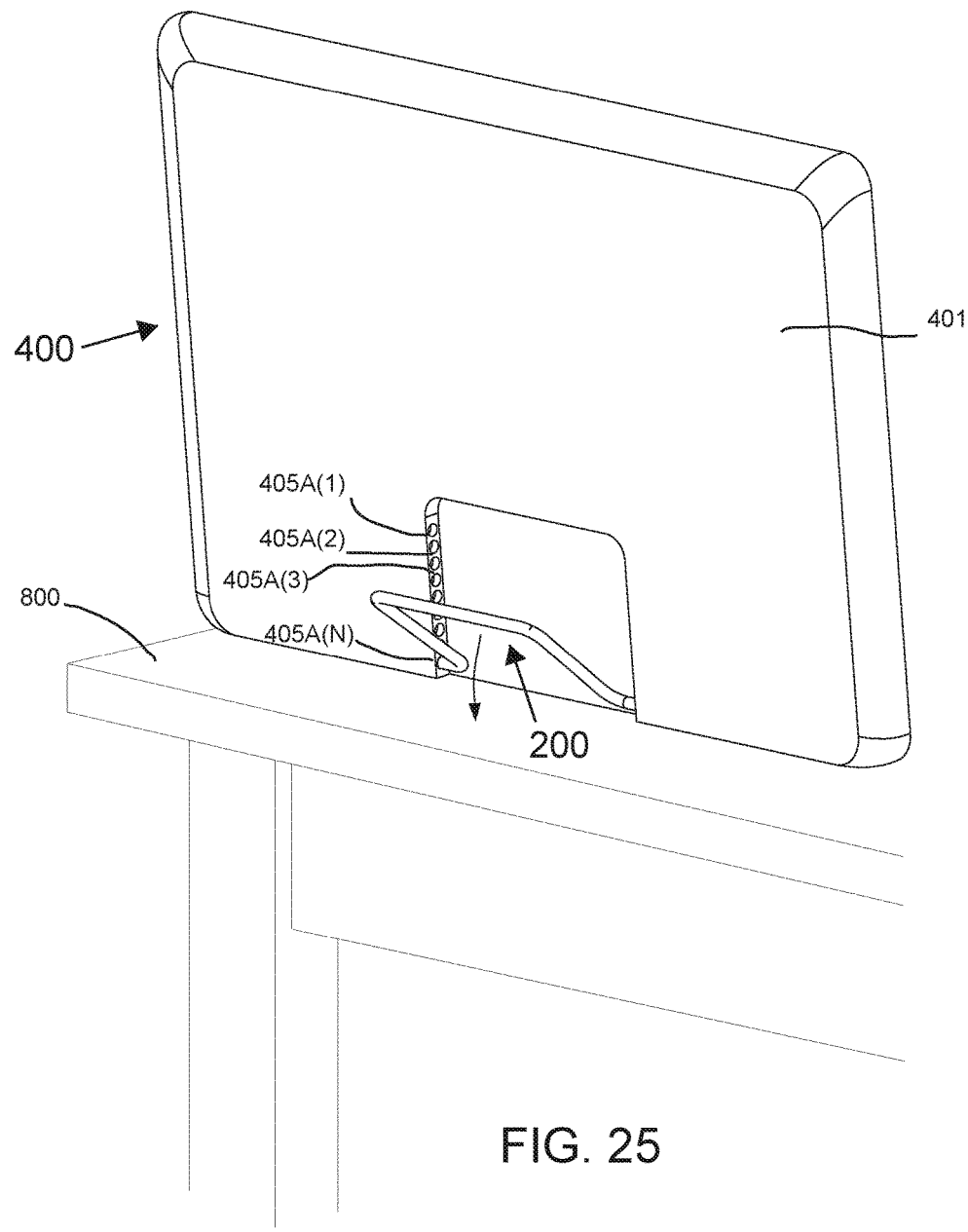
FIG. 25 Illustrates the brace-based stand and rotation lock mechanism situated in the back of the tablet computer being deployed as a support stand.

FIG. 25 Illustrates the brace-based stand and rotation lock mechanism 200 situated in the back of the tablet computer 400 being deployed as a support stand against a flat surface 800.

Figure 26:
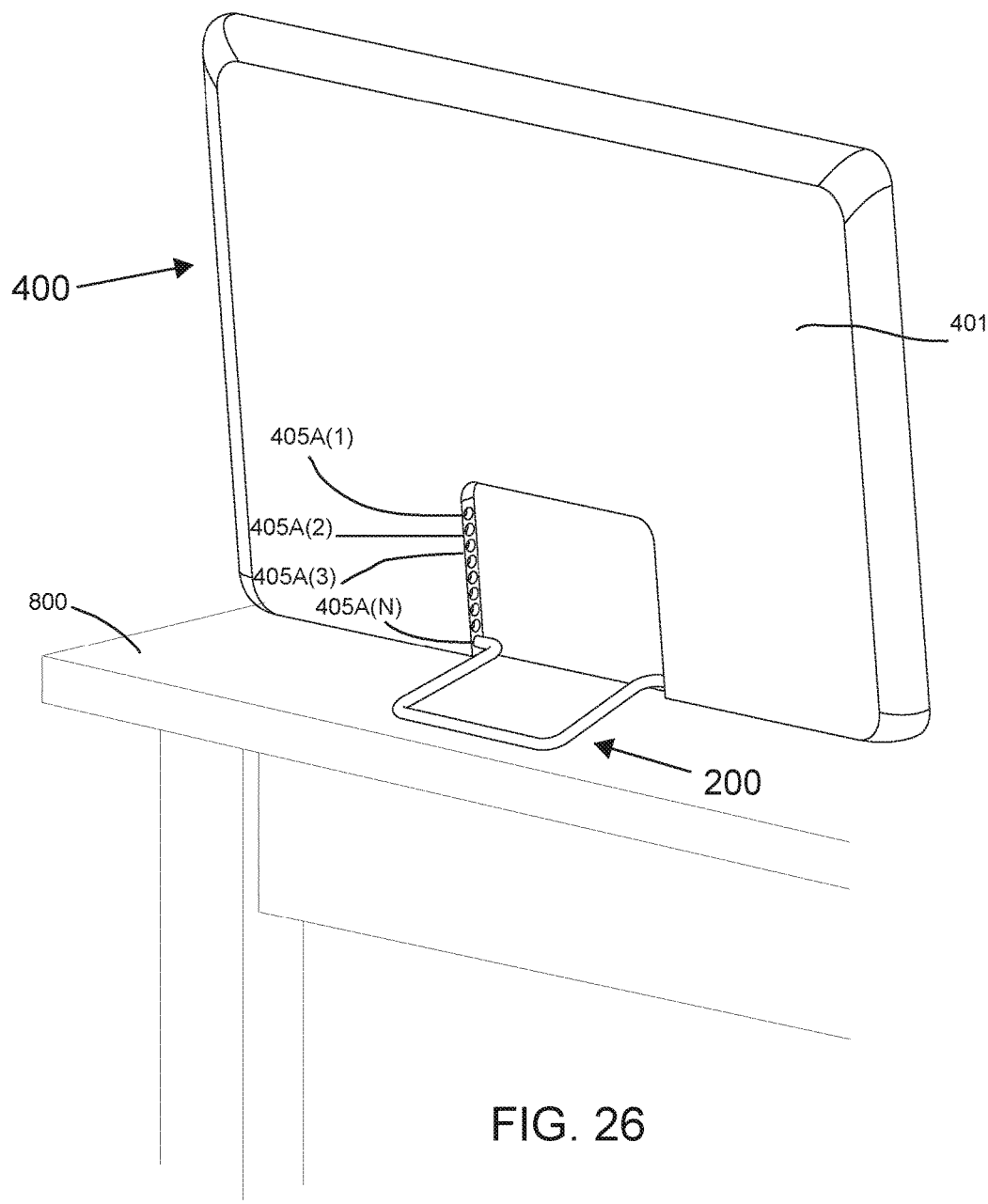
FIG. 26 Illustrates the brace-based stand and rotation lock mechanism situated in the back of the tablet computer deployed as a support stand.

FIG. 26 Illustrates the brace-based stand and rotation lock mechanism situated 200 in the back of the tablet computer 400 fully deployed as a support stand against fixed surface 800.

Figure 27:
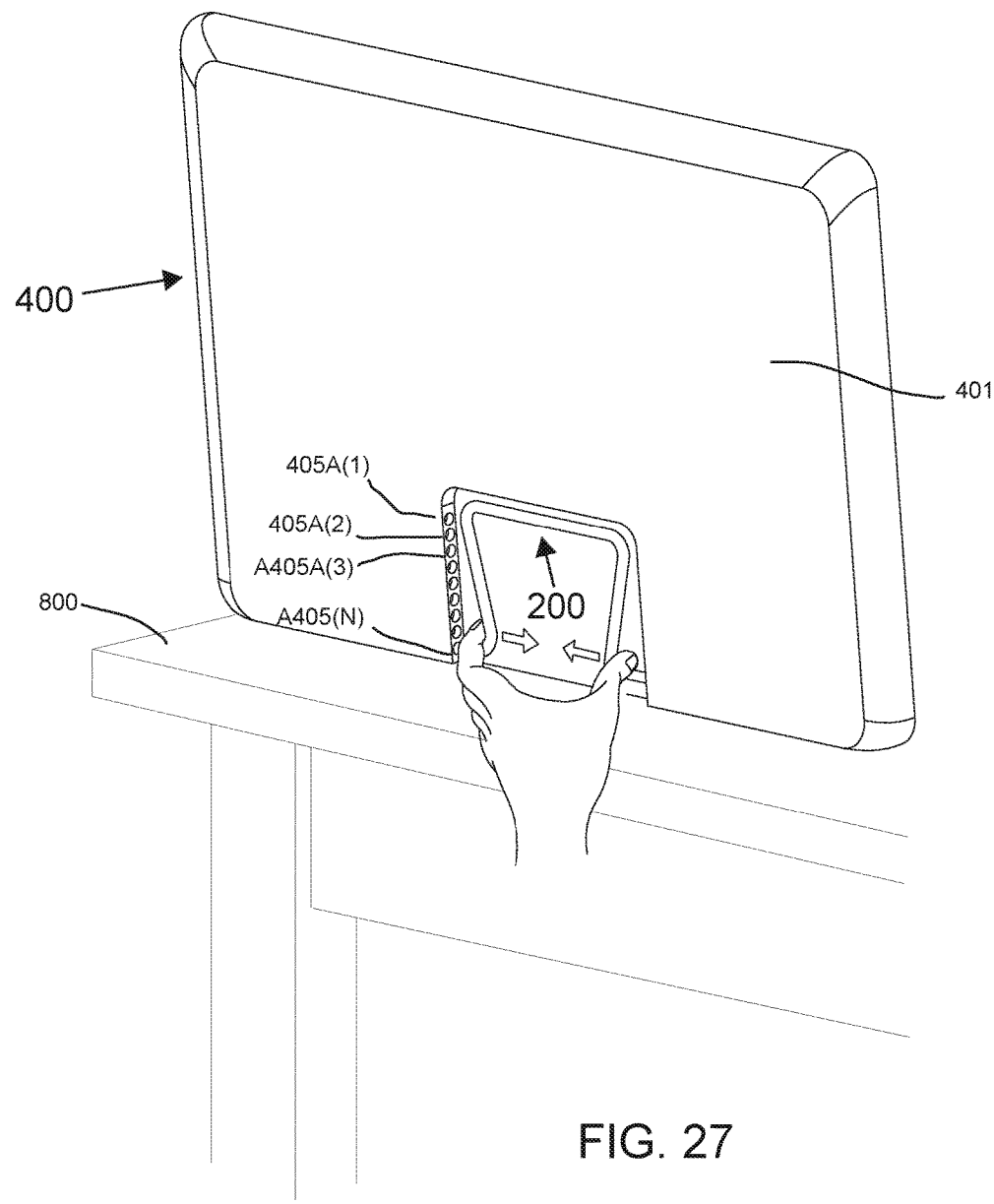
FIG. 27 Illustrates a human hand squeezing the brace-based stand and rotation lock mechanism situated in the back of the tablet computer.

FIG. 27 Illustrates a human hand squeezing the brace-based stand and rotation lock mechanism 200 situated in the back of the tablet computer 400.

Figure 28:
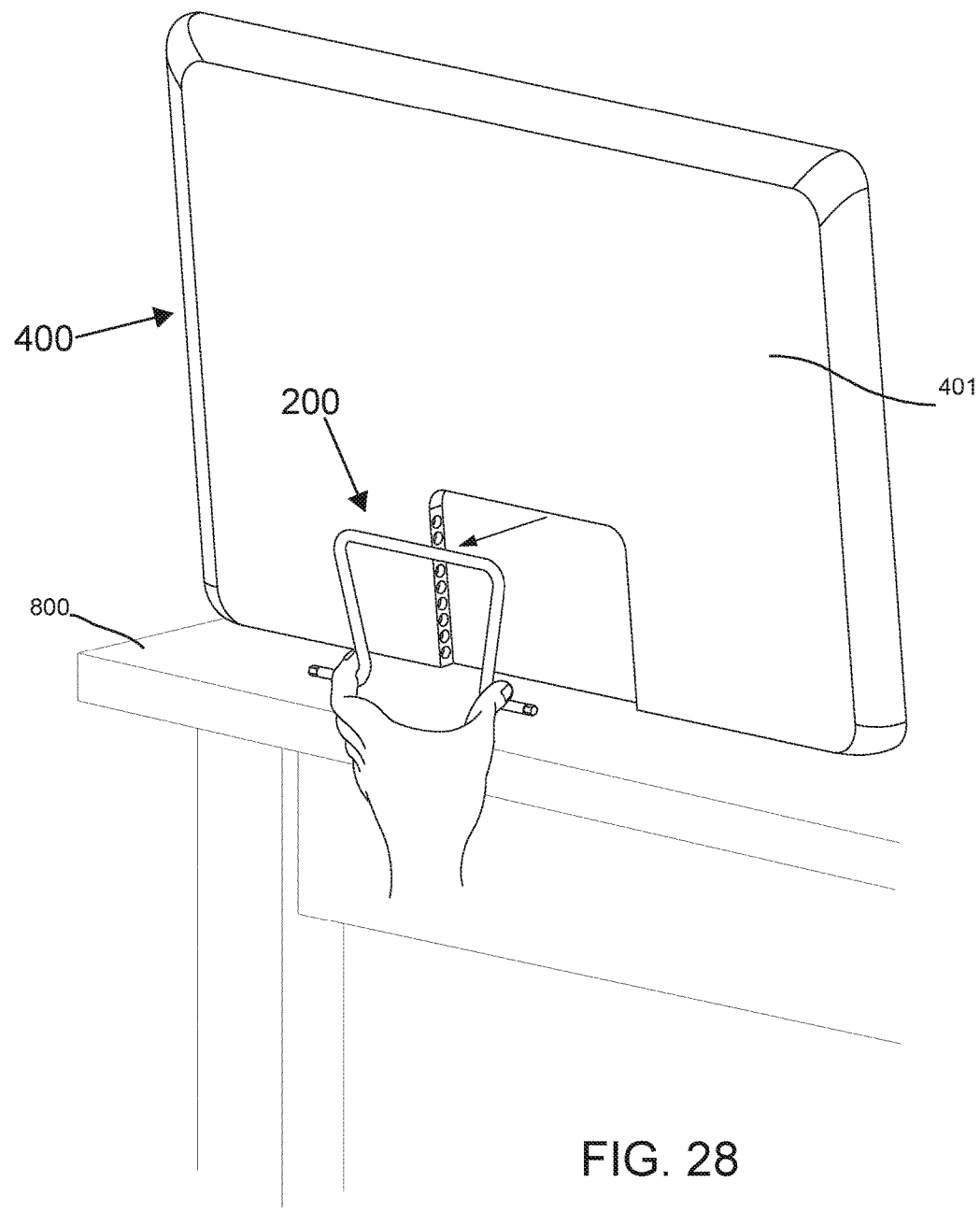
FIG. 28 Illustrates a human hand removing the brace-based stand and rotation lock mechanism situated in the back of the tablet computer.

FIG. 28 Illustrates a human hand removing the brace-based stand and rotation lock mechanism 200 situated in the back of the tablet computer 400 by displacing the ends of the brace 209A and 209B completely out of cylindrical sockets 215A and 215B, thereby completely detaching the brace 200 from the back of tablet computer 400.

Figure 29:
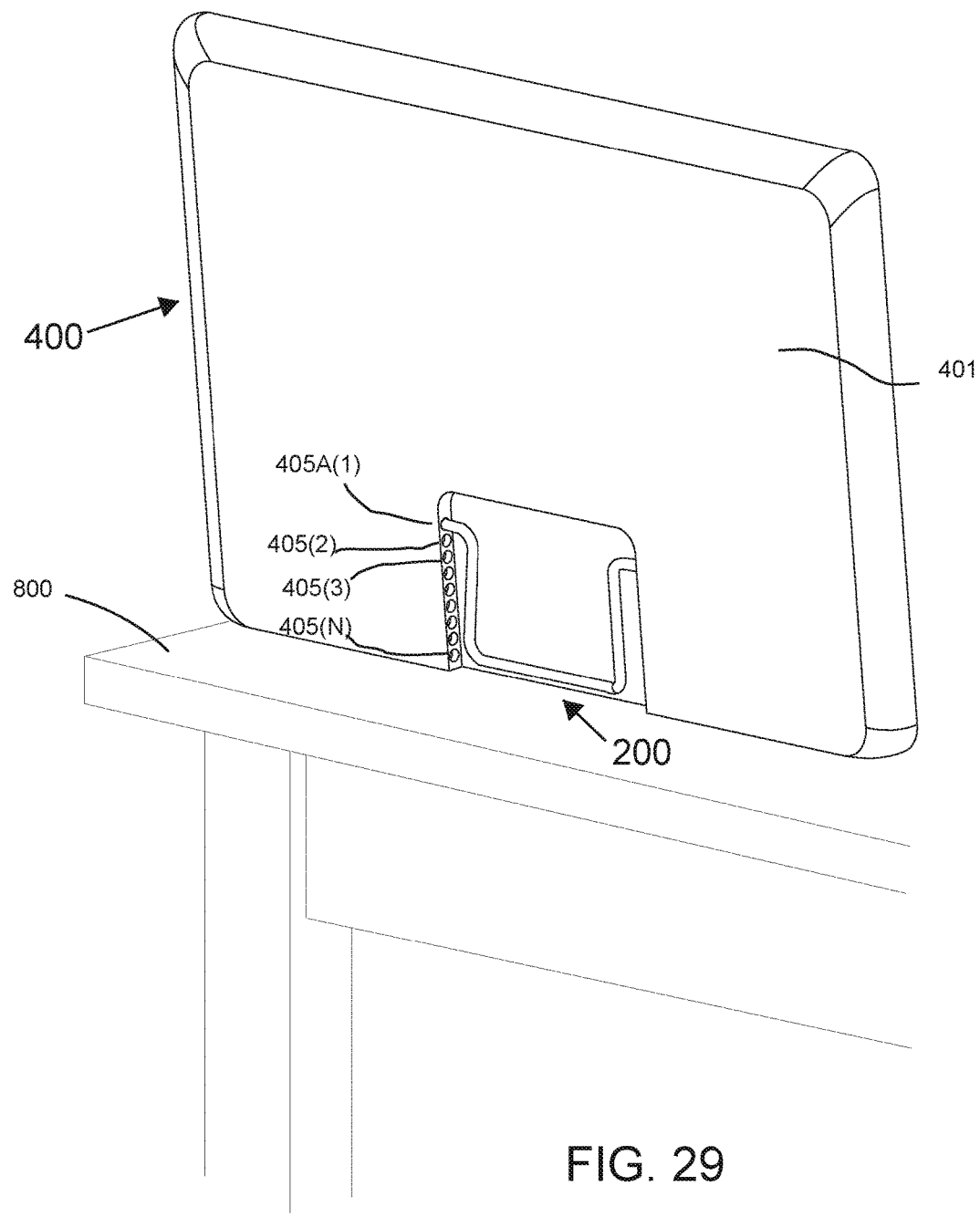
FIG. 29 Illustrates the brace-based stand and rotation lock mechanism situated in an alternative configuration in the back of the tablet computer.

FIG. 29 Illustrates the brace-based stand and rotation lock mechanism 200 reinserted into the back of tablet computer 400 in an alternative configuration.

Figure 30:
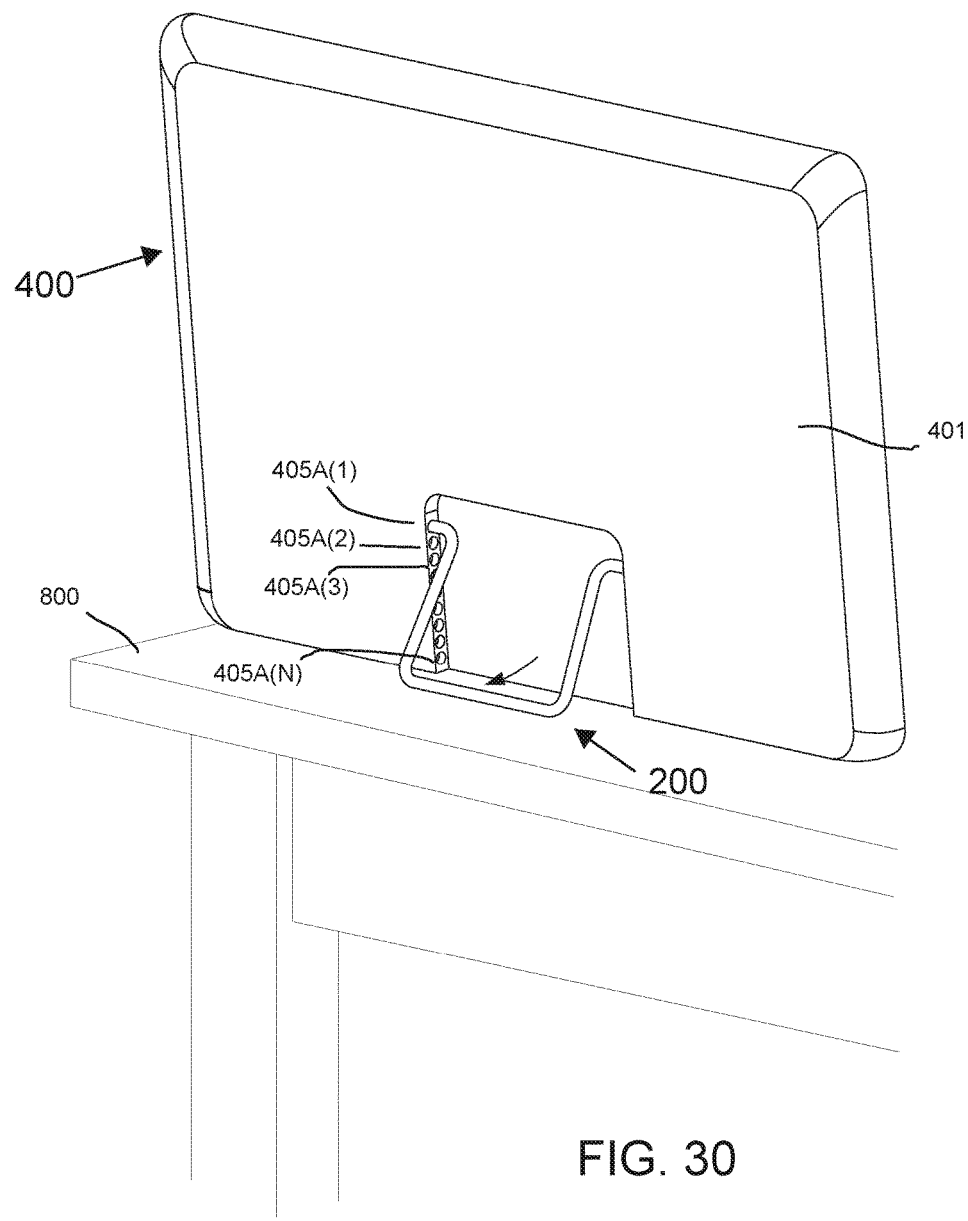
FIG. 30 Illustrates the brace-based stand and rotation lock mechanism situated in the back of the tablet computer being deployed as a support stand.

FIG. 30 Illustrates the brace-based stand and rotation lock mechanism 200 having been deployed as a support stand to tablet computer 400 in its new seated configuration.

Figure 31:
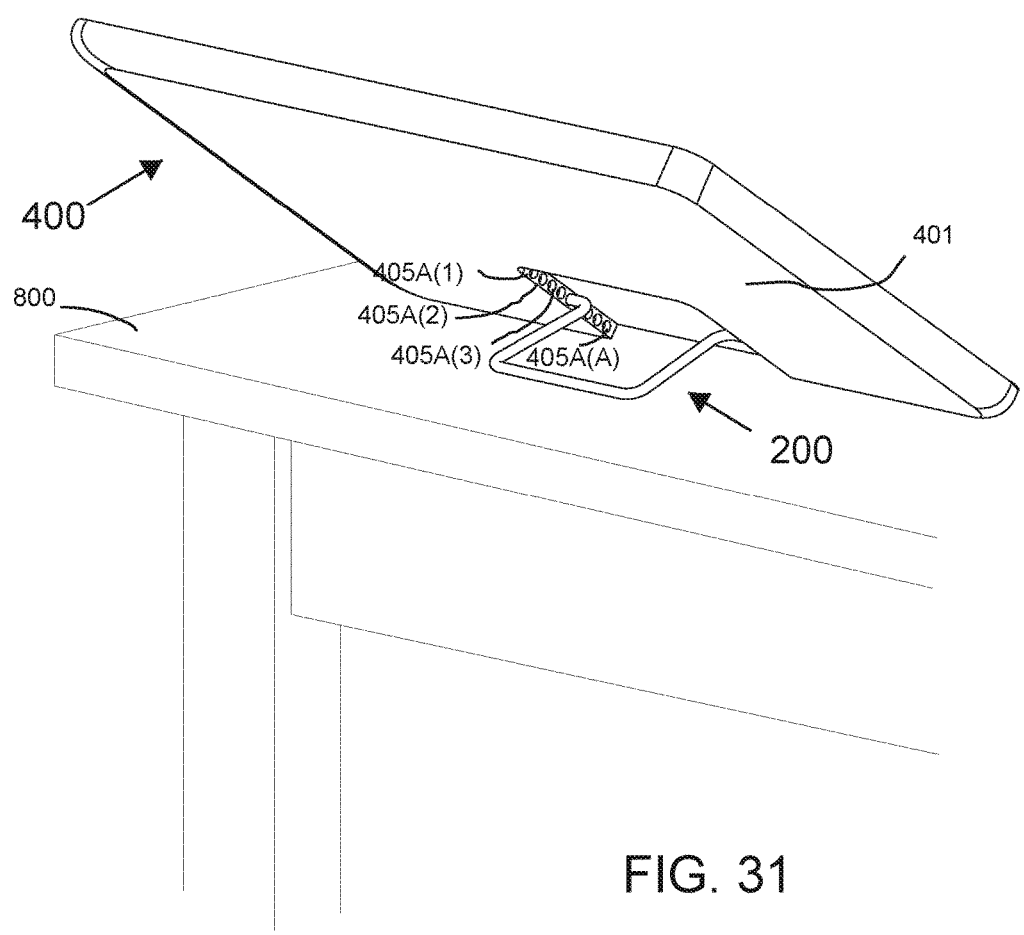
FIG. 31 Illustrates the brace-based stand and rotation lock mechanism situated in the back of the tablet computer being deployed as a support stand in an alternative configuration.

FIG. 31 Illustrates the brace-based stand and rotation lock mechanism 200 situated in the back of tablet computer 400 being deployed as a stand in an alternative support configuration.

Figure 32:
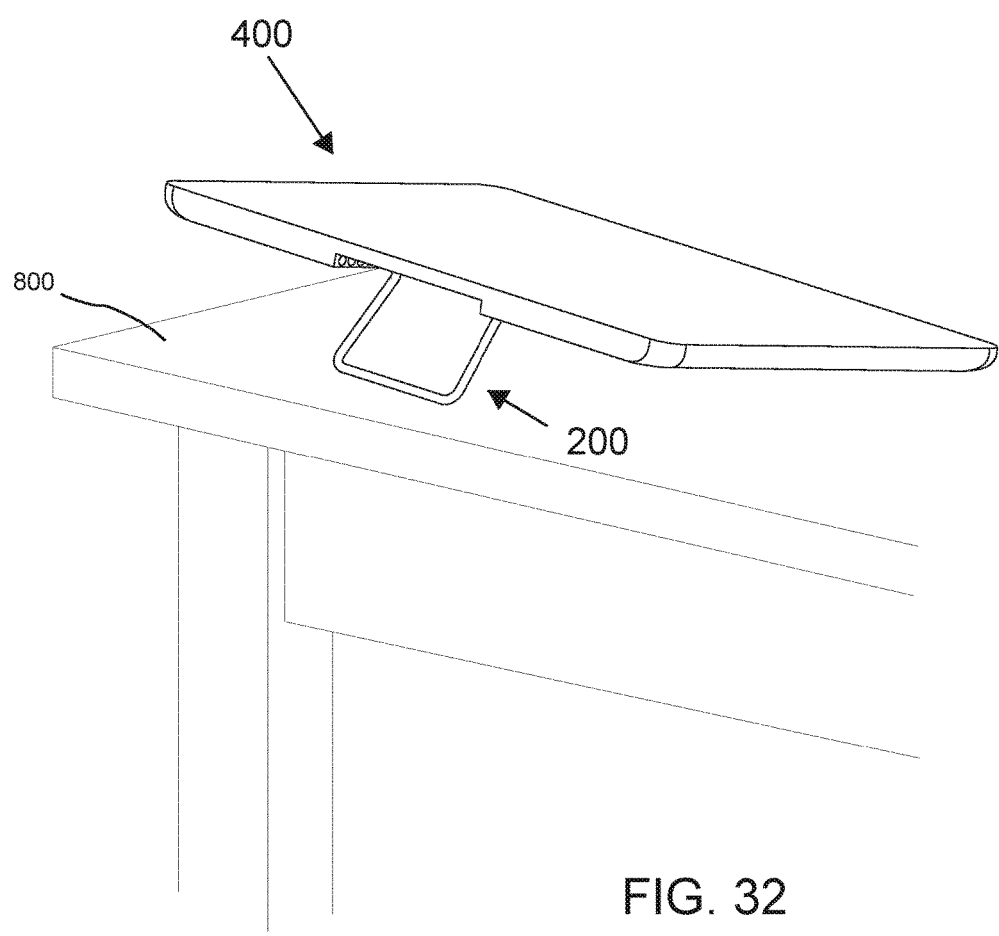
FIG. 32 Illustrates the brace-based stand and rotation lock mechanism situated in the back of the tablet computer being deployed as a support stand in yet another alternative configuration.

FIG. 32 Illustrates the brace-based stand and rotation lock mechanism 200 situated in the back of the tablet computer 400 being deployed as a stand in yet another alternative support configuration.

Sliding Cylinders Rotation Lock Mechanism

Figure 33:
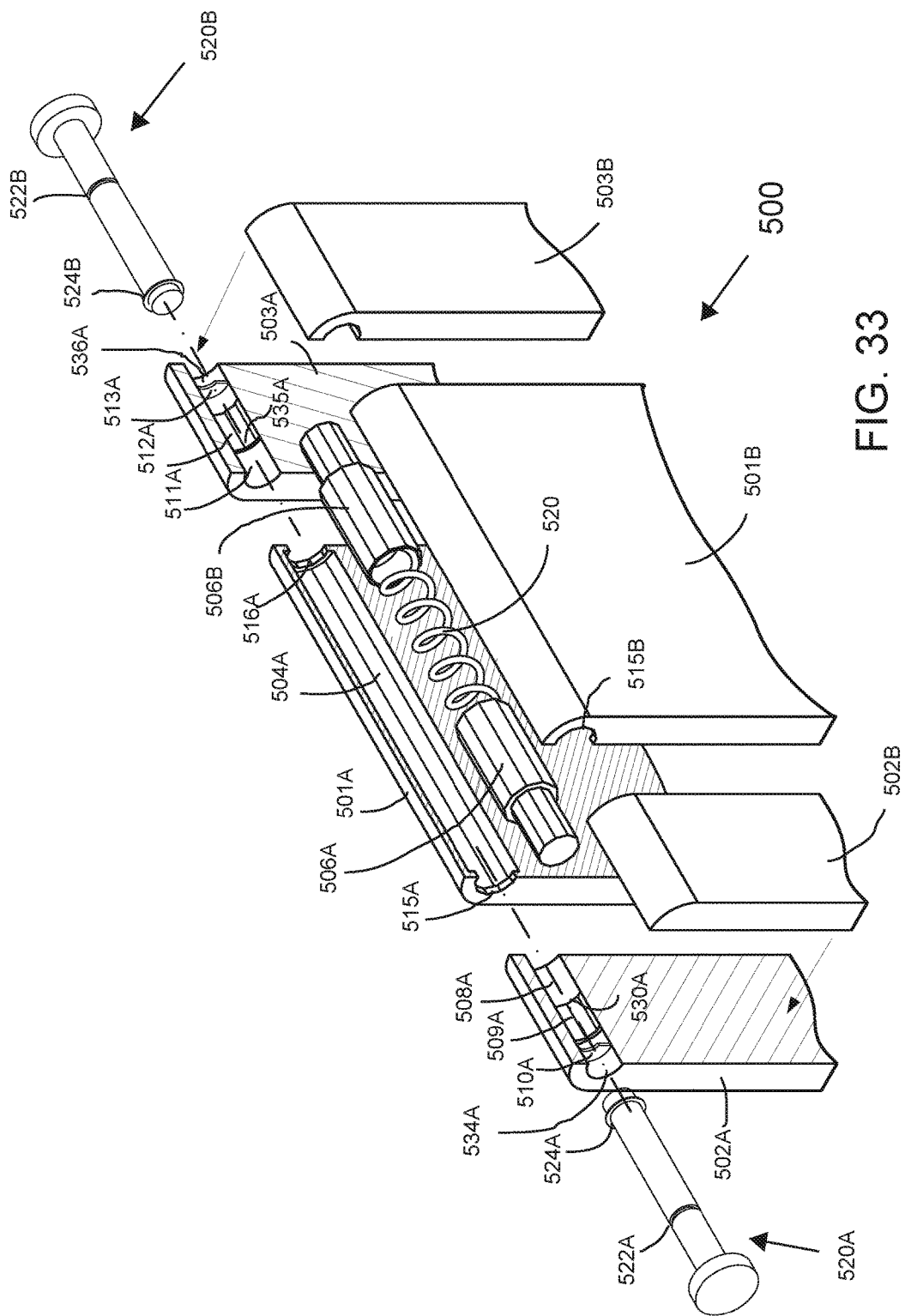
FIG. 33 Illustrates a three-dimensional perspective view of an exemplary embodiment of a sliding cylinders rotation lock mechanism.

FIG. 33 illustrates a three-dimensional ("3D") perspective view of an exemplary embodiment of a sliding cylinders rotation lock mechanism.

This mechanism is also based on the illustrated exemplary concept manifestation of FIGS. 3A-3D where a multi-faceted cylinder that is attached to a pivoting element is thrust into an inverse multi-faceted chamber of a multi-chambered socket that is attached to a fixed surface in order to interlock and freeze the rotational position of the pivoting element with respect to the fixed surface at the time the multi-faceted cylinder was thrust into the multi-faceted chamber of the multi-chambered socket—but whereas the exemplary concept manifestations of FIGS. 3A-3D are based on one multi-faceted cylinder interlocking with one inverse multi-faceted socket, the non-limiting exemplary embodiment of the Sliding Cylinders Rotation Lock Mechanism employs a pivoting element 501A,B that is traversed by a channel 504A,B that encloses a pair of retractable stepped multi-faceted cylinders 506A and 506B that are aligned on opposite ends of a biasing spring 520 inside the channel 504A,B. The spring 520 biases the retractable stepped multi-faceted cylinders 506A and 506B into protruding outside the channel 504A,B to interlock with a pair of aligned multi-chambered sockets 530A,B and 535A,B that are imbedded in fixed surfaces 502A,B and 503A,B on either side of the channel 504A,B. Fixed surfaces, 502A,B and 503A,B, are an integral unit, such as a back panel of an electronic device.

The stepped multi-faceted cylinders are prevented from rotating and falling out of channel 504A,B by retaining, multi-faceted, orifices 515A,B and 516A,B. The stepped multi-faceted sliding cylinders 506A and 506B may be further stabilized and prevented from rotation inside channel 504A,B if the inner walls of channel 504A,B are also made to be multi-faceted and inversely matching the multi-faceted outer cylinders of the stepped sliding cylinders 506A and 506B.

The multi-faceted cylinders 506A and 506B and cylindrical sockets 530A and 535A share a common axis aligned with the axis of the pivoting support element 501A,B. The divided cylindrical chambers 530A and 535A comprise a first chamber 508A,B and 511A,B; a second chamber 509A,B and 512A,B; and a third chamber 534A,B and 536A,B respectively.

The first chambers 508A,B and 511A,B are positioned at the opening end of cylindrical sockets 530A and 535A, are round, smooth, and tubular so that when the multi-faceted cylinders 506A and 506B are positioned in the first chambers 508A,B and 511A,B of cylindrical sockets 530A,B and 535A,B, the fastened pivoting support element 501A,B is allowed to pivot freely around its axis of rotation.

The second chambers 509A,B and 512A,B that are adjacent to the first chambers 508A,B and 511A,B, are hollow cavities with side walls that are the inverse of the multi-faceted cylinders 506A and 506B so that when the endings of the multi-faceted cylinders 506A and 506B come in contact with the second chambers 509A,B and 512A,B, they interlock, and the fastened pivoting support element 501A,B is prevented from pivoting.

The third chambers 534A,B and 536A,B are adjacent to the second chambers 509A,B and 512A,B and include disk-shaped flat rings 510A,B and 513A,B with a hole in the middle to support and allow the passage of plungers 520A and 520B.

Plungers 520A and 520B are used to thrust multi-faceted cylinders 506A and 506B out of the first and second chambers to unlock or to detach pivoting element 501A,B from fixed surfaces 502A,B and 503A,B. Plungers 520A and 520B include groves 522A and 522B at one end of their shafts. These groves interlock with flat rings 510A and 513A of multi-chambered sockets 530A and 535A in order to provide support to the plungers and tactile feedback that the plungers have reached a displacement milestone, such as when the stepped multi-faceted cylinders are out of the second chambers and into the first chambers and the pivoting element 501A,B is allowed to pivot freely. Circular rings 524A and 524B, at the other end of the plungers' shaft, are mainly used to prevent the shaft of the plungers 520A and 520B from falling out of their respective multi-chambered socket enclosures.

Figure 34:
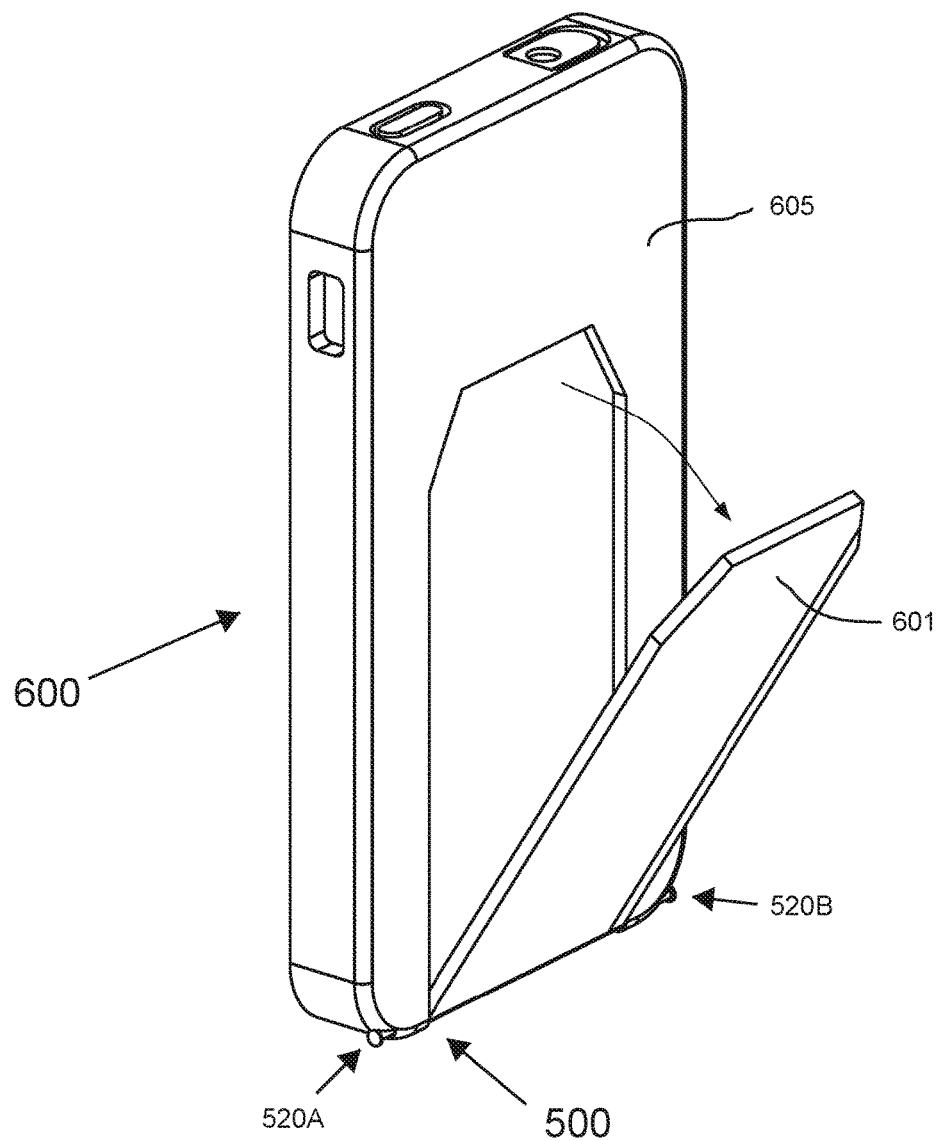
FIG. 34 illustrates a three-dimensional perspective view of an exemplary embodiment of a sliding cylinders rotation lock mechanism implemented in a detachable stand that can double as a removable battery for a smart phone.

FIG. 34 illustrates a 3D perspective view of an exemplary embodiment of a sliding cylinders rotation lock mechanism 500 implemented in a detachable stand that can double as a removable battery for a smart phone 600.

FIG. 34 shows the detachable pivoting support element 601 deploying from the back panel 605 of smart phone 600 with plungers 520A and 520B on either side of pivoting support element 601. In some embodiments, detachable pivoting support element 601 may also double as a detachable battery for the smart phone 600.

Figure 35:
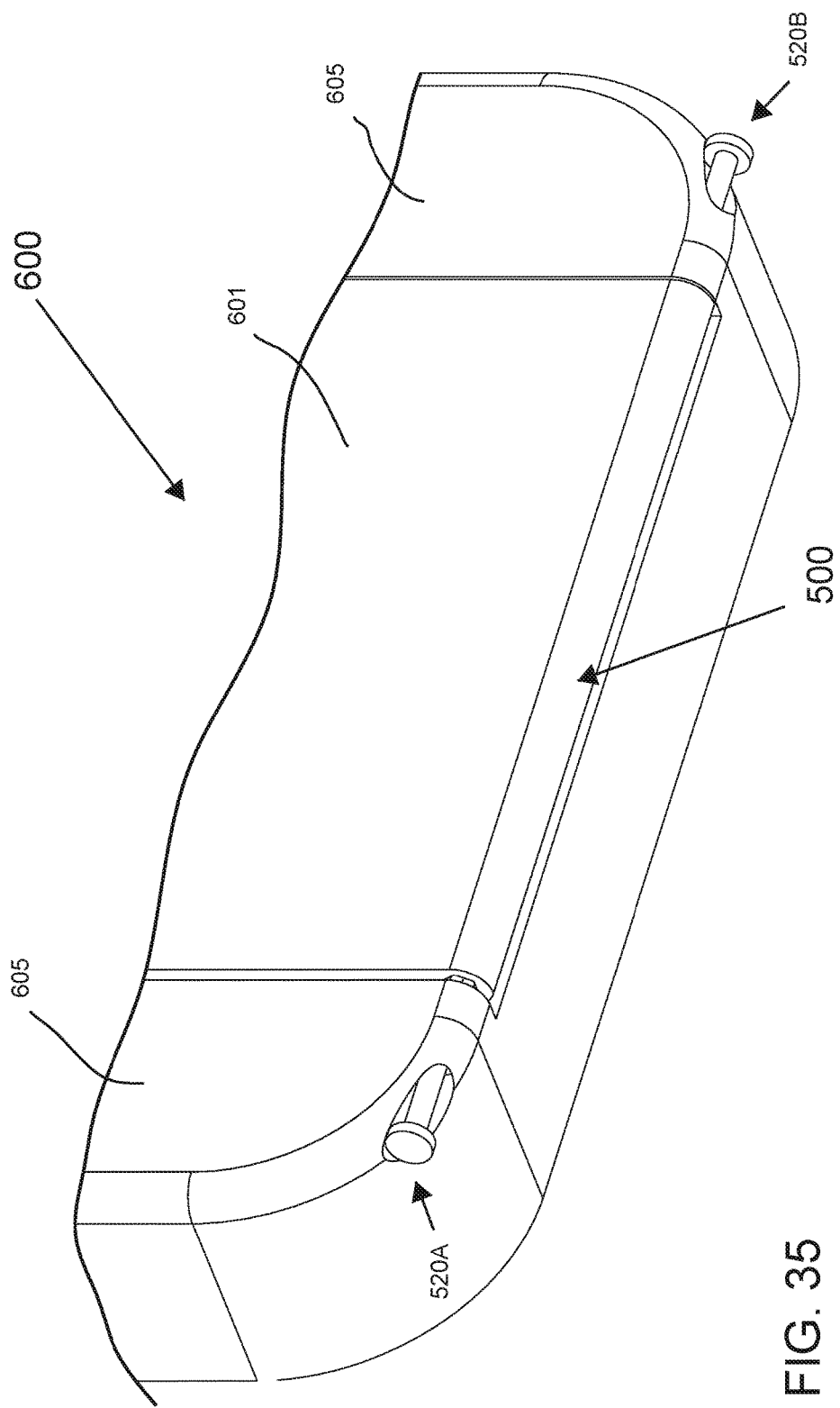
FIG. 35 illustrates a 3D close-up view of how an exemplary embodiment of a sliding cylinders rotation lock mechanism can be implemented in a detachable stand for a smart phone.

FIG. 35 illustrates a 3D close-up view of how an exemplary embodiment of a sliding cylinders rotation lock mechanism 500 can be implemented in a detachable stand for a smart phone 601. This close up also illustrates a practical design where the plungers of the rotation lock mechanism do not extend beyond the frame of the smart phone.

Figure 36:
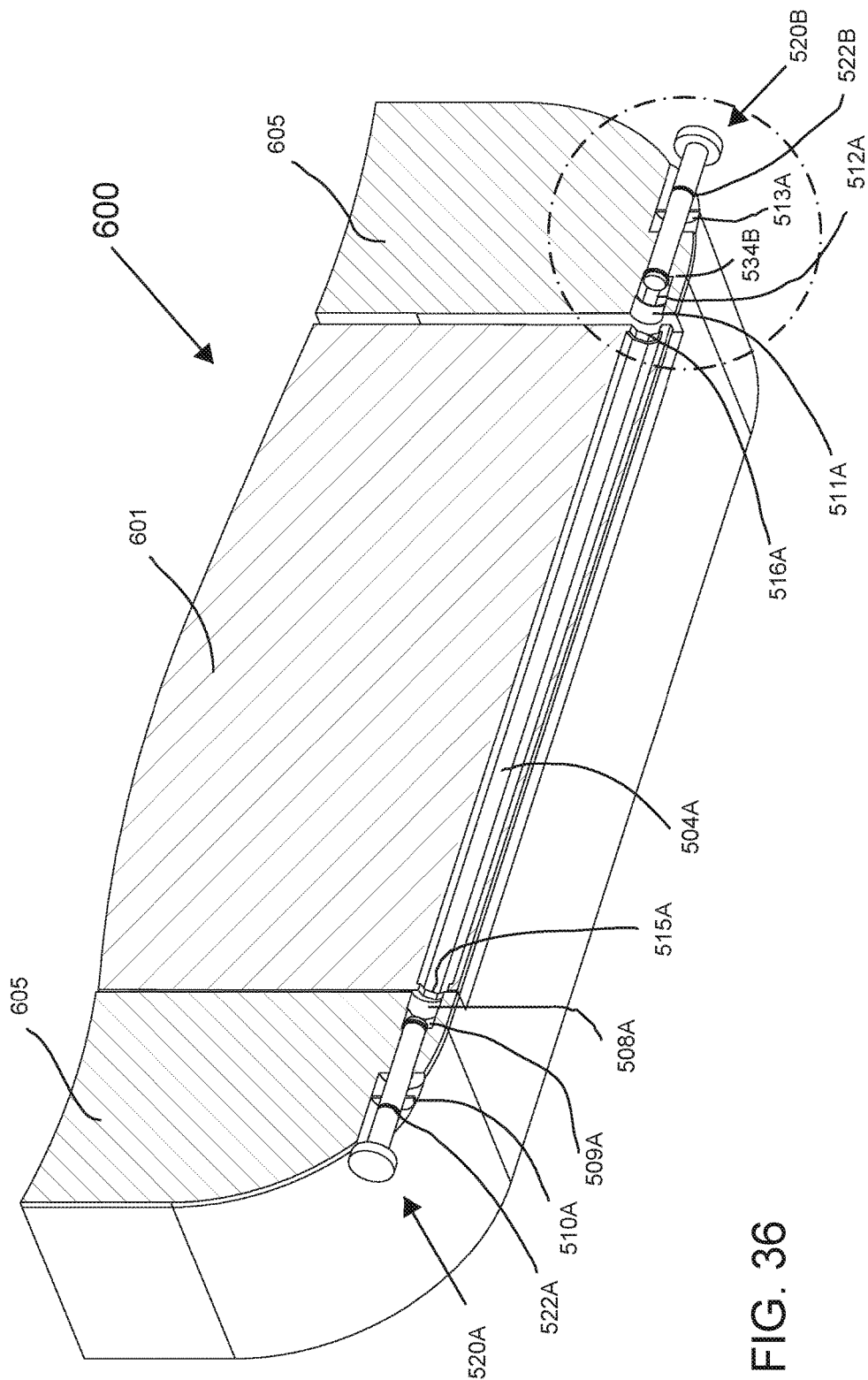
FIG. 36 illustrates a cross-sectional close-up representation of how an exemplary embodiment of a sliding cylinders rotation lock mechanism may be implemented in a detachable stand for a smart phone.

FIG. 36 illustrates a 3D close-up cross-sectional representation of how an exemplary embodiment of the sliding cylinders rotation lock mechanism 500 of FIG. 33 may be implemented in a detachable stand for a smart phone 601—with special emphasis on how the plungers 520A and 520B may be positioned in the default position.

Figure 37:
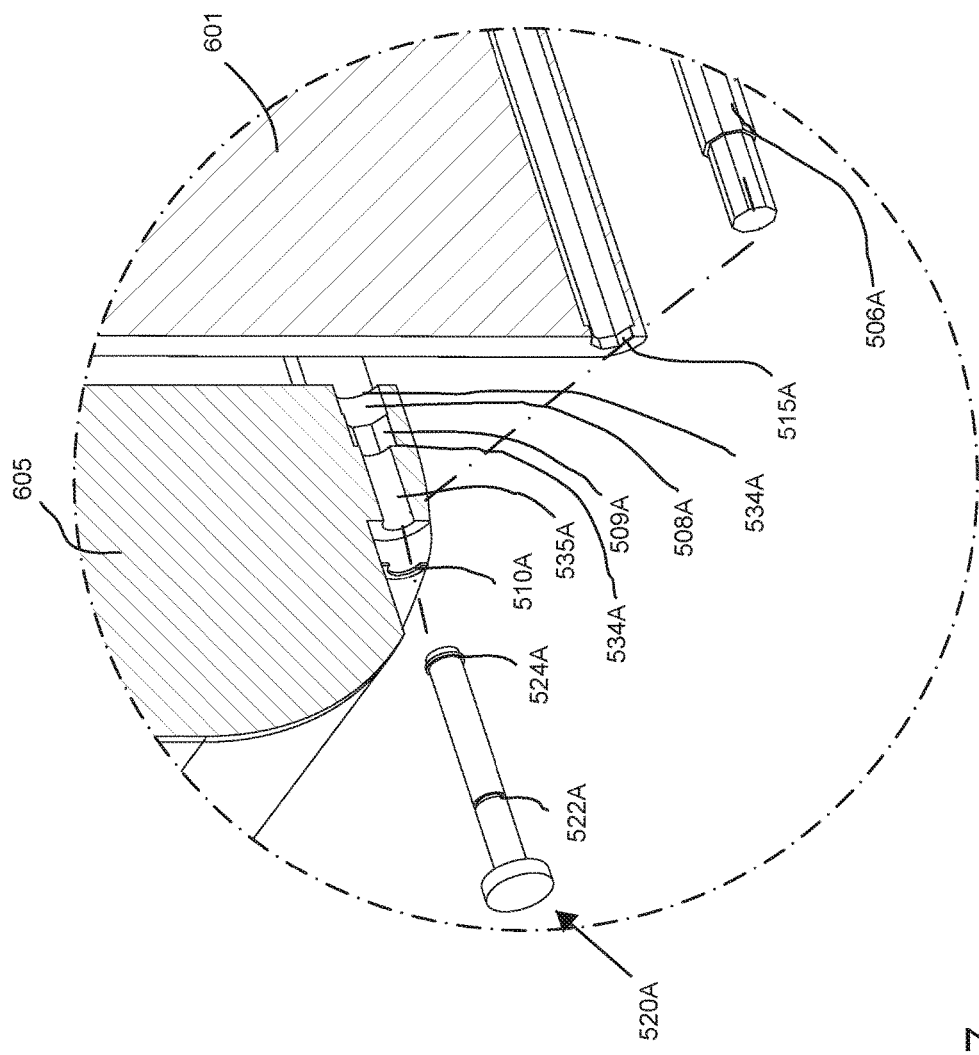
FIG. 37 illustrates a magnified close-up cross-sectional representation of how an exemplary embodiment of a sliding cylinders rotation lock mechanism may be implemented in a detachable stand for a smart phone.

FIG. 37 illustrates a 3D magnified cross-sectional representation of one side of the exemplary embodiment of the sliding cylinders rotation lock mechanism of FIG. 36—with special emphasis on how the plungers and the stepped cylinders fit within the sliding cylinders rotation lock mechanism.

Figure 38:
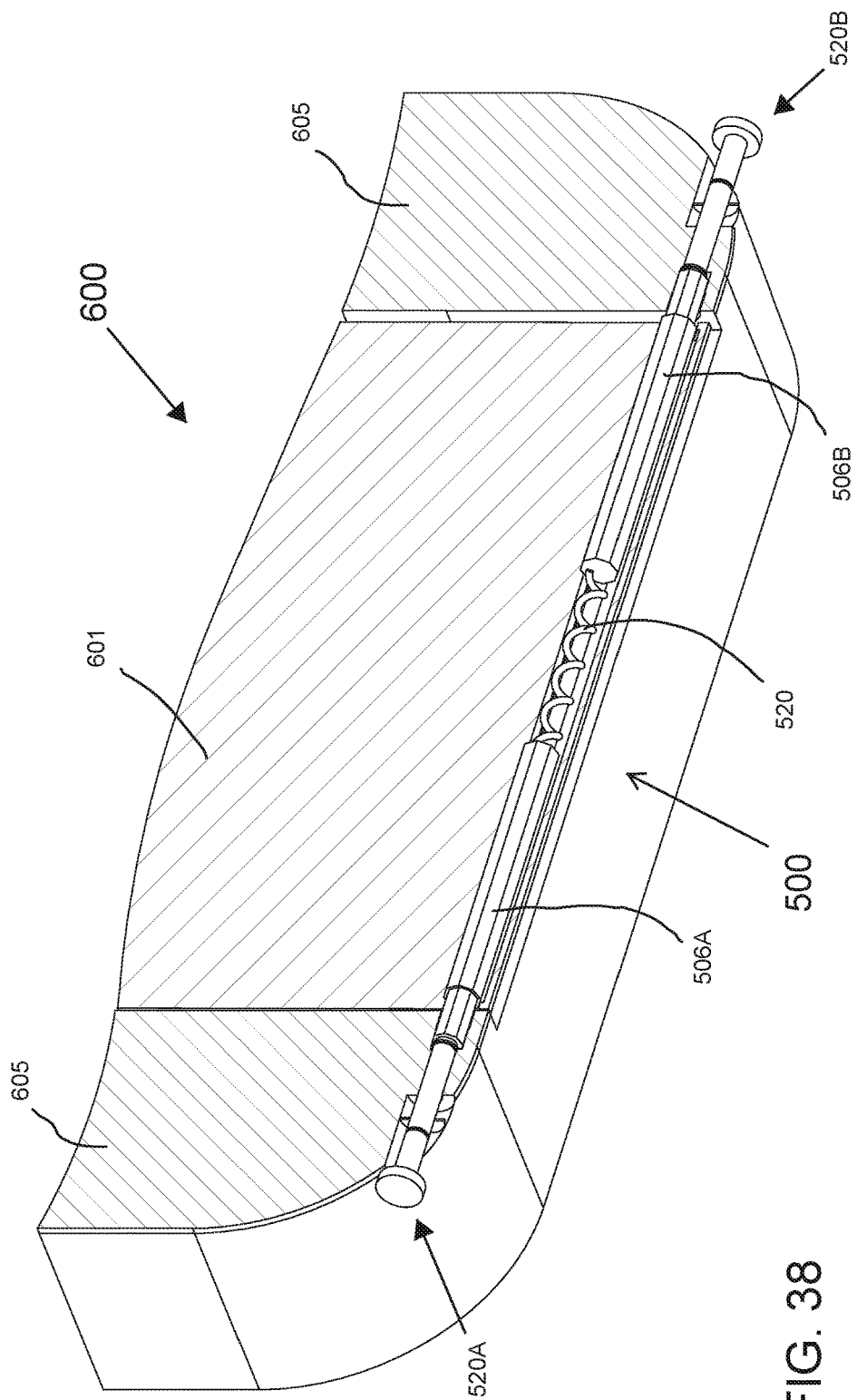
FIG. 38 illustrates a cross-sectional representation of an exemplary embodiment of a sliding cylinders rotation lock mechanism in a detachable stand for a smart phone with the sliding cylinders in a locked position and the detachable stand flush with the back panel of the smart phone.

FIG. 38 illustrates a 3D cross-sectional representation of the exemplary embodiment of the sliding cylinders rotation lock mechanism 500 in a detachable stand for a smart phone with the sliding cylinders in the locked default position—and the detachable stand 601 flush with the back panel 605 of the smart phone.

Figure 39:
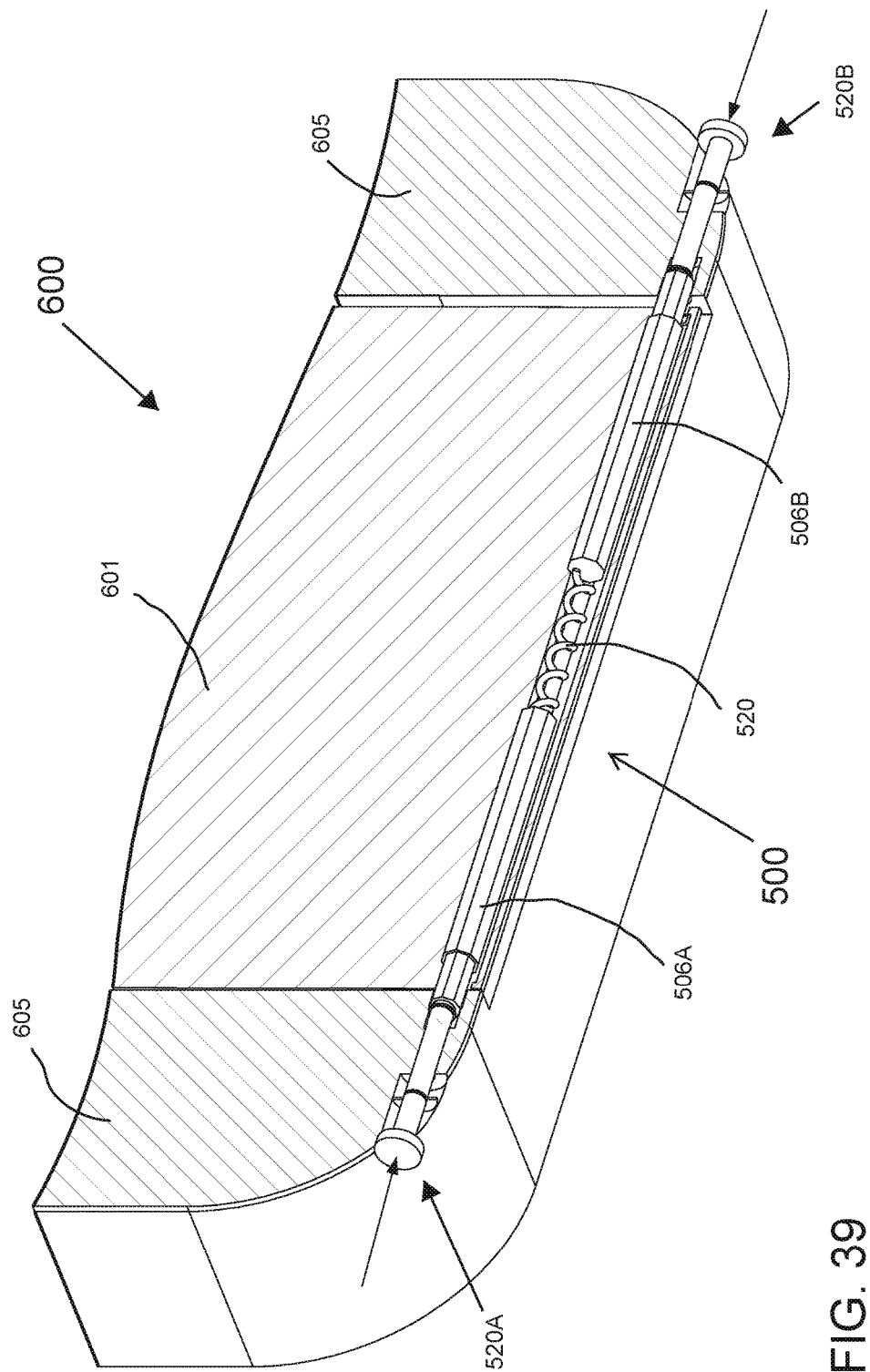
FIG. 39 illustrates a cross-sectional representation of an exemplary embodiment of a sliding cylinders rotation lock mechanism in a detachable stand for a smart phone with the sliding cylinders in the unlocked position and the detachable stand still flush with the back panel of the smart phone.

FIG. 39 illustrates a 3D cross-sectional representation of an exemplary embodiment of the sliding cylinders rotation lock mechanism of FIG. 38 with the spring 520 compressed and the sliding cylinders 506A and 506B pushed in by the plungers 520A and 520B—and in the unlocked position—freeing the detachable stand 601 to rotate with respect to the back panel 605.

Figure 40:
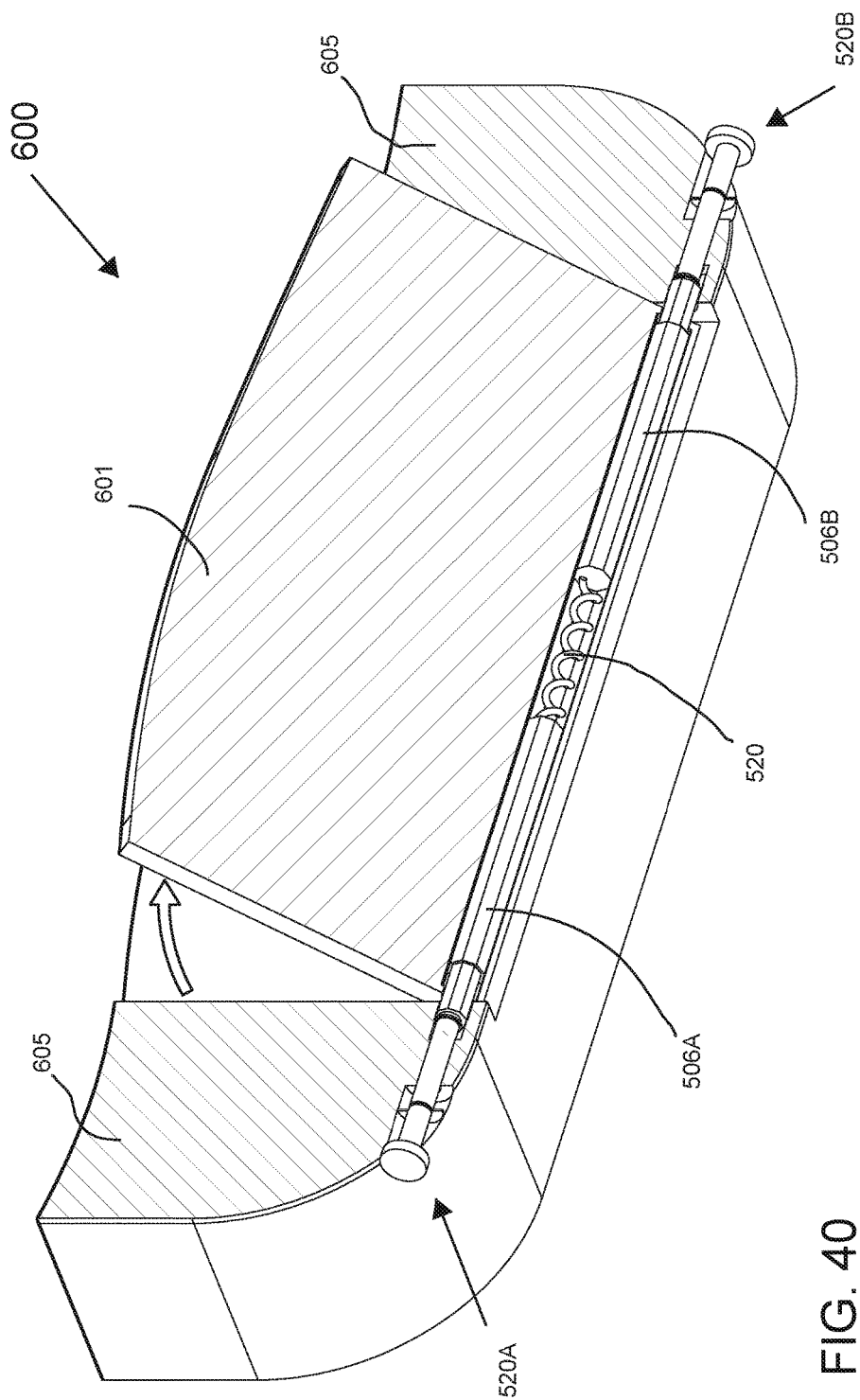
FIG. 40 illustrates a cross-sectional representation of an exemplary embodiment of a sliding cylinders rotation lock mechanism in a detachable stand for a smart phone with the detachable stand being deployed as a support stand.

FIG. 40 illustrates a 3D cross-sectional representation of the exemplary embodiment of the sliding cylinders rotation lock mechanism of FIG. 39 with the detachable stand 601 pivoting with respect to back panel 605 and being deployed as a support stand.

Figure 41:
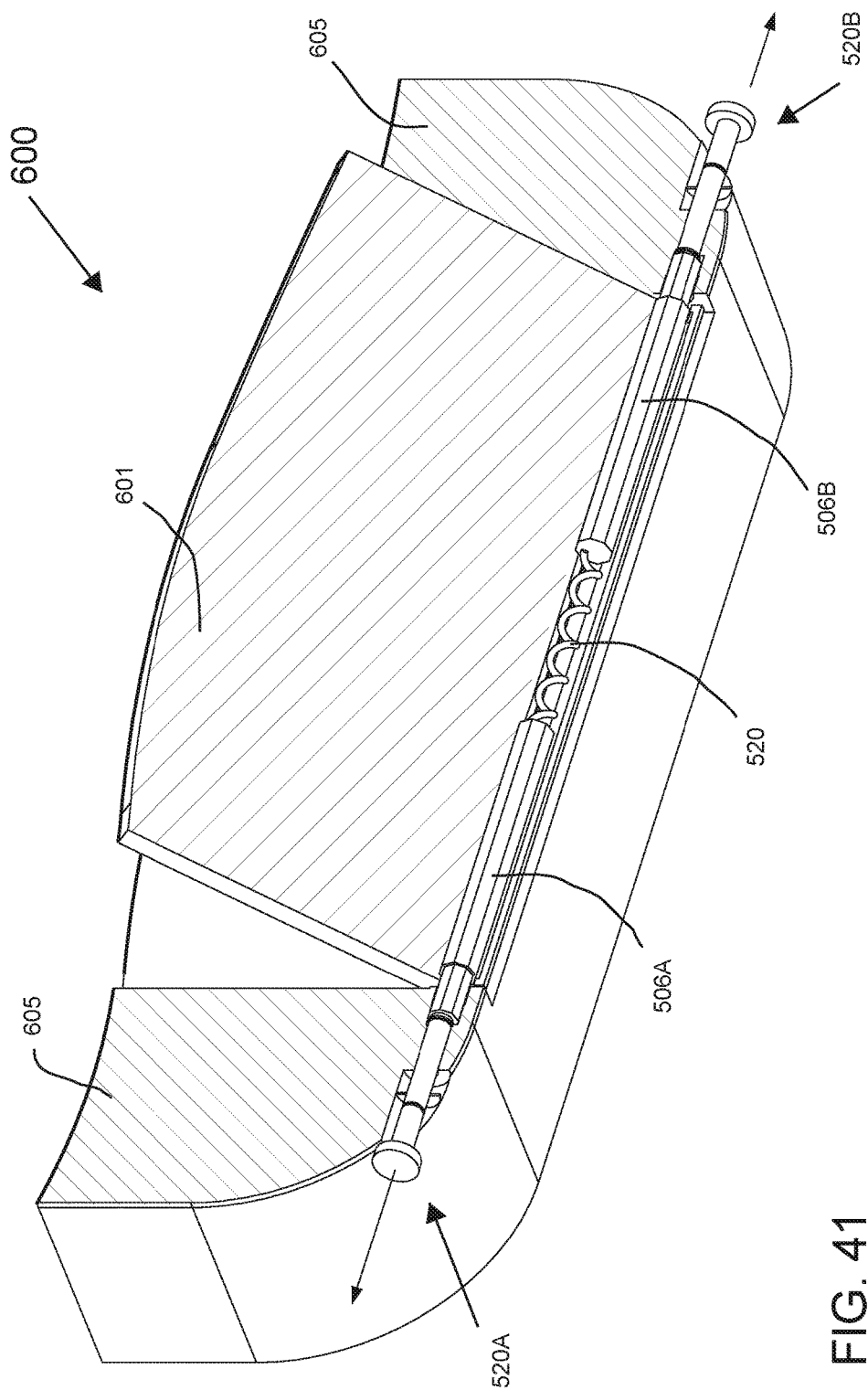
FIG. 41 illustrates a cross-sectional representation of an exemplary embodiment of a sliding cylinders rotation lock mechanism in a detachable stand for a smart phone with the detachable stand set at a fixed angular position.

FIG. 41 illustrates a 3D cross-sectional representation of the exemplary embodiment of the sliding cylinders rotation lock mechanism of FIG. 40 with the spring decompressed, the sliding cylinders and the plungers pushed back to their default position, and detachable stand 601 set in a fixed angular position with respect to back panel 605.

Figure 42:
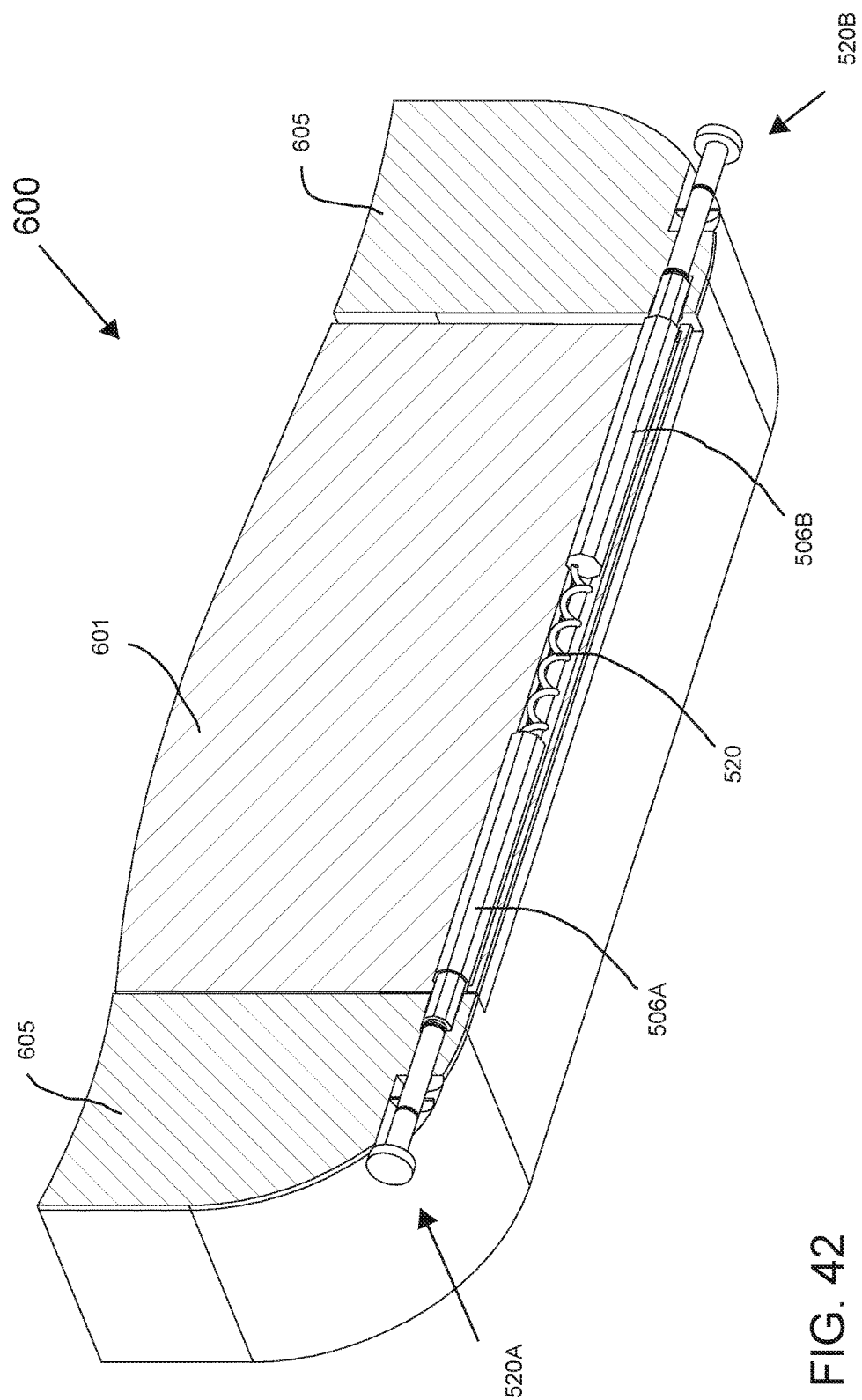
FIG. 42 illustrates a cross-sectional representation of an exemplary embodiment of a sliding cylinders rotation lock mechanism in a detachable stand for a smart phone with the sliding cylinders in the locked position and the detachable stand flush with the back panel of the smart phone.

FIG. 42 illustrates a 3D cross-sectional representation of the exemplary embodiment of the sliding cylinders rotation lock mechanism of FIG. 41 with detachable stand 601 back in its default position—flush with back panel 605.

Figure 43:
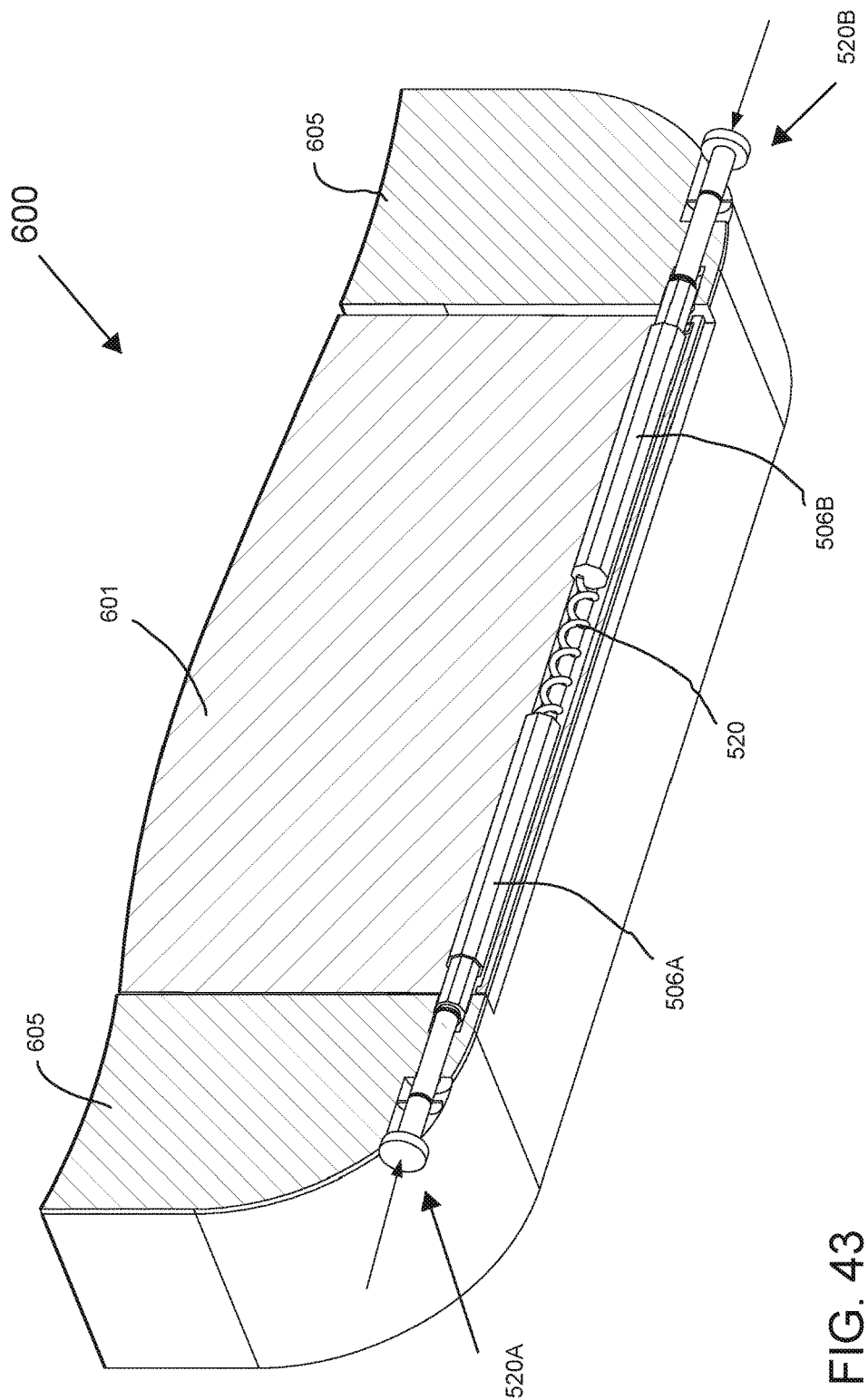
FIG. 43 illustrates a cross-sectional representation of an exemplary embodiment of a sliding cylinders rotation lock mechanism in a detachable stand for a smart phone with the sliding cylinders in the unlocked position but the detachable stand still flush with the back panel of the smart phone.

FIG. 43 illustrates a 3D cross-sectional representation of the exemplary embodiment of the sliding cylinders rotation lock mechanism of FIG. 42 with the spring 520 compressed and the sliding cylinders 506A and 506B pushed in by the plungers 520A and 520B—and in the unlocked position—freeing detachable stand 601 to rotate with respect to back panel 605.

Figure 44:
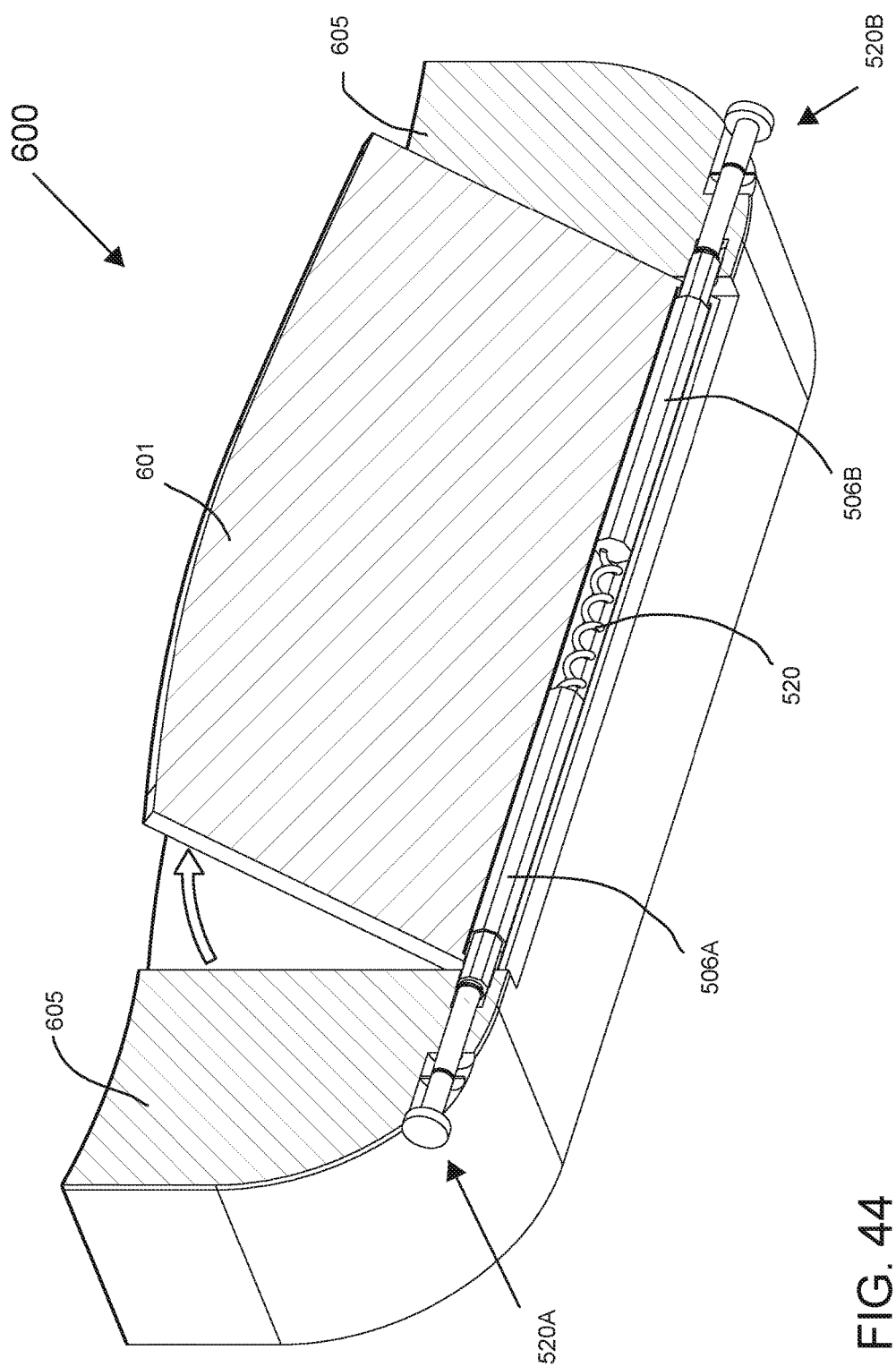
FIG. 44 illustrates a cross-sectional representation of an exemplary embodiment of a sliding cylinders rotation lock mechanism in a detachable stand for a smart phone with the detachable stand being deployed from the flush position.

FIG. 44 illustrates a 3D cross-sectional representation of the exemplary embodiment of the sliding cylinders rotation lock mechanism of FIG. 43 with detachable stand 601 pivoting with respect to back panel 605 and being deployed as a support stand.

Figure 45:
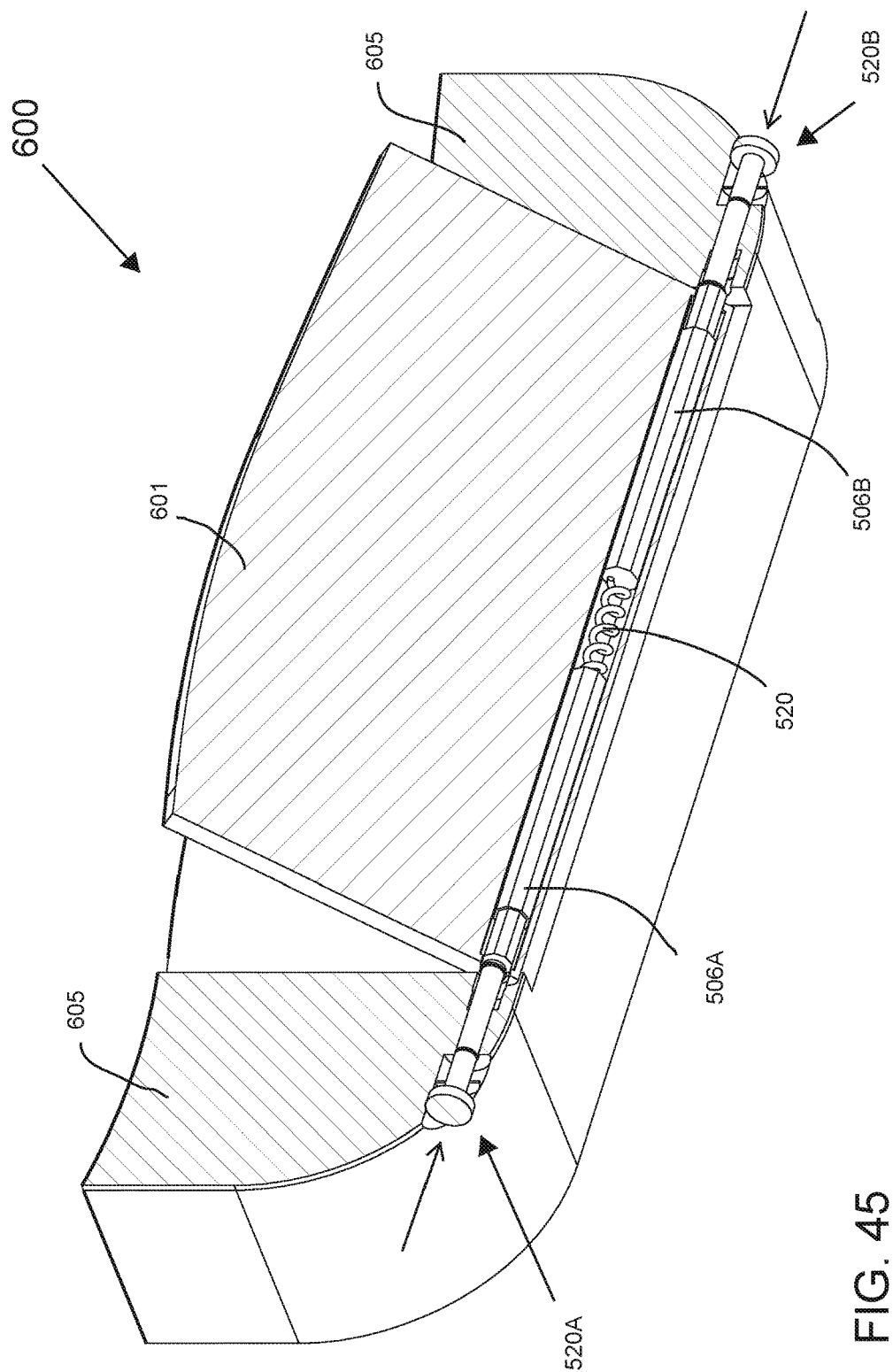
FIG. 45 illustrates a cross-sectional representation of an exemplary embodiment of a sliding cylinders rotation lock mechanism in a detachable stand for a smart phone with the pincers thrusting the sliding cylinders completely out of the back panel of the smart phone.

FIG. 45 illustrates a 3D cross-sectional representation of the exemplary embodiment of the sliding cylinders rotation lock mechanism of FIG. 44 with the spring 520 compressed further and the sliding cylinders 506A and 506B pushed in deeper into detachable stand 601—and completely out of back panel 605.

Figure 46:
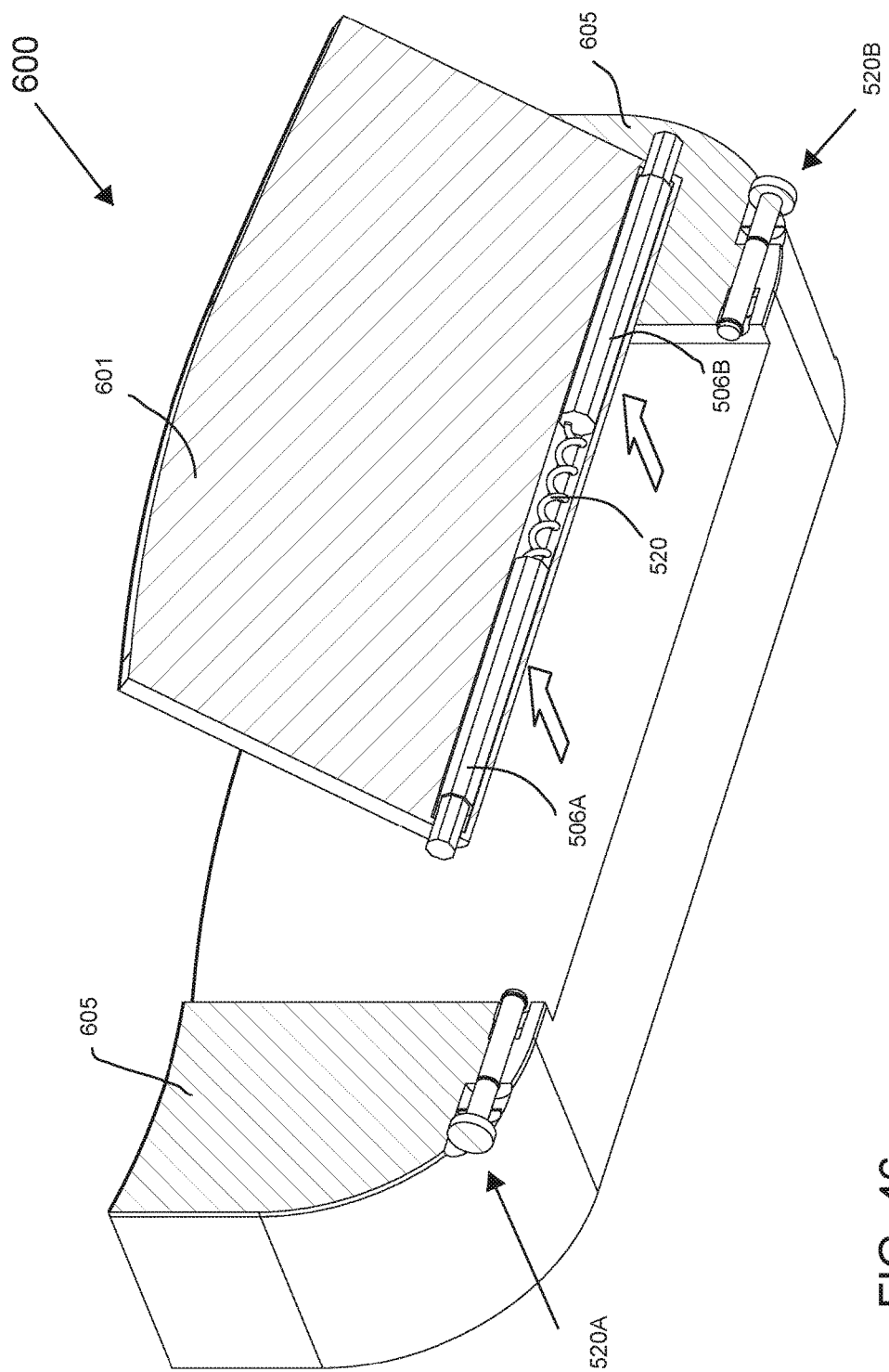
FIG. 46 illustrates a cross-sectional representation of an exemplary embodiment of a sliding cylinders rotation lock mechanism in a detachable stand for a smart phone with the hinge pincers thrusting the sliding cylinders completely out of the back panel of the smart phone and the detachable stand completely detached from the back of the smart phone.

FIG. 46 illustrates a 3D cross-sectional representation of the exemplary embodiment of the sliding cylinders rotation lock mechanism of FIG. 45 with detachable stand 601 completely detached and pulled out of back panel 605 of the smart phone 600.

Figure 47:
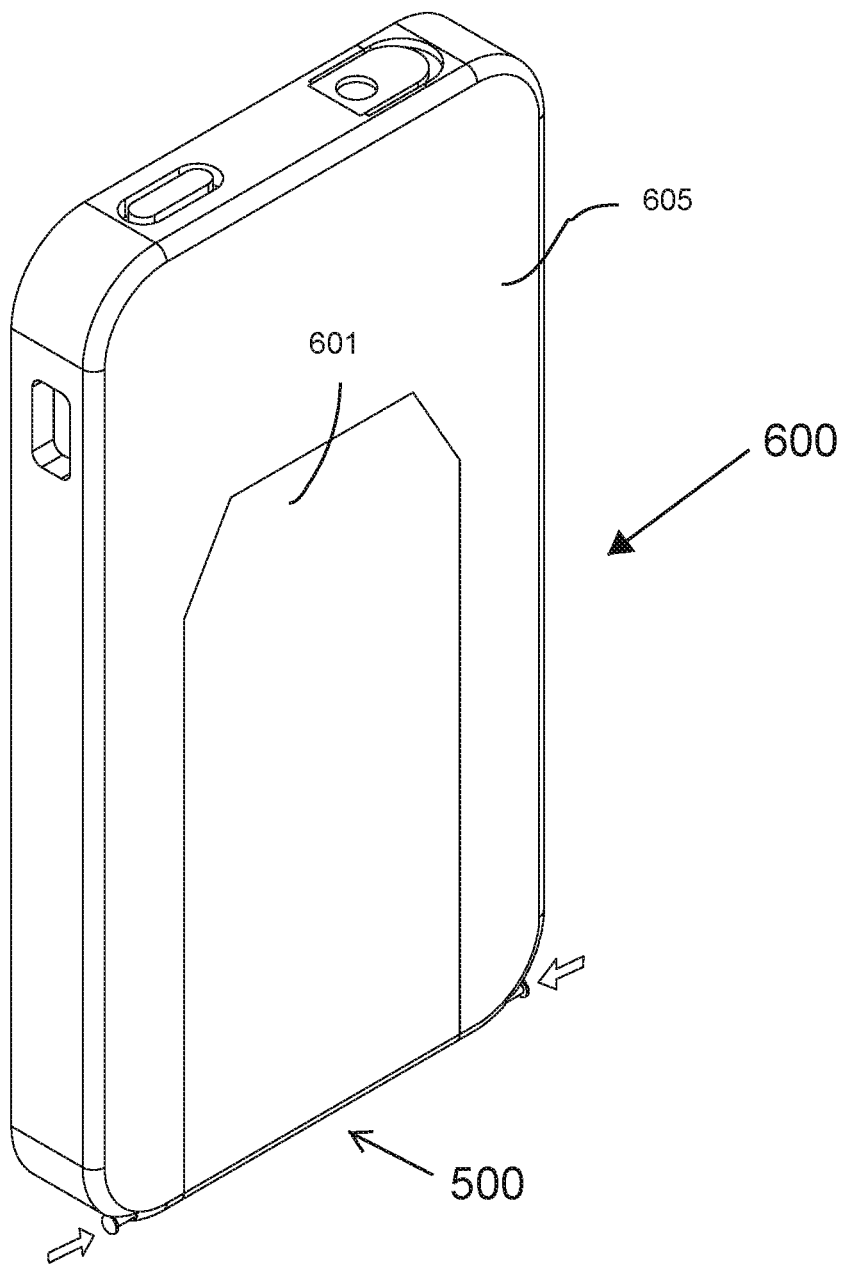
FIG. 47 illustrates a three-dimensional perspective view of an exemplary embodiment of a sliding cylinders rotation lock mechanism implemented as a detachable stand of a smart phone with the detachable stand in the flush position with the back panel of the smart phone.

FIG. 47 illustrates a 3D perspective view of an exemplary embodiment of a sliding cylinders rotation lock mechanism 500 implemented as a detachable stand 601 of a smart phone 600 with the detachable stand 601 in the flush position with the back panel 605 of the smart phone 600.

Figure 48:
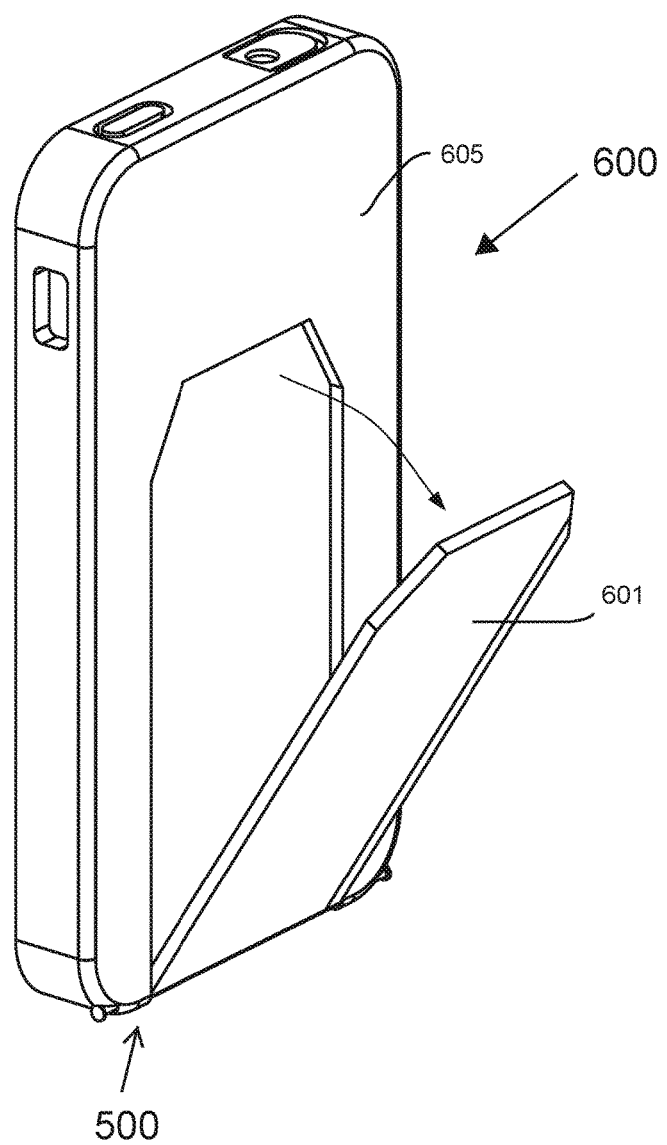
FIG. 48 illustrates a three-dimensional perspective view of an exemplary embodiment of a sliding cylinders rotation lock mechanism implemented as a detachable stand of a smart phone with the detachable stand being deployed away from the back panel of the smart phone.

FIG. 48 illustrates a 3D perspective view of an exemplary embodiment of a sliding cylinders rotation lock mechanism 500 implemented in a detachable stand 601 of a smart phone 600 with the detachable stand 601 being deployed away from the back panel 605 of the smart phone 600.

Figure 49:
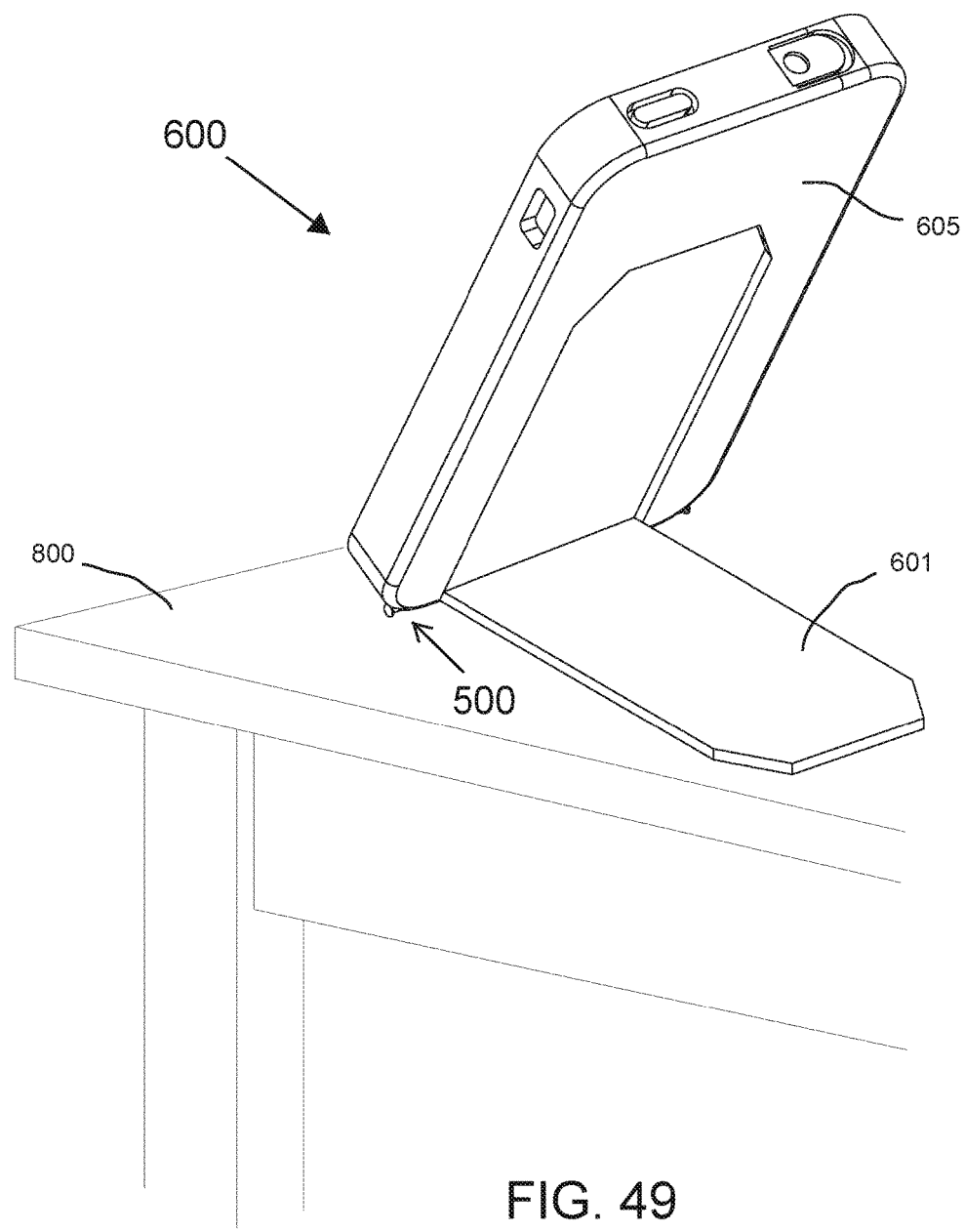
FIG. 49 illustrates a three-dimensional perspective view of an exemplary embodiment of a sliding cylinders rotation lock mechanism implemented as a detachable stand of a smart phone with the detachable stand fully deployed and propping the smart phone in the portrait orientation.

FIG. 49 illustrates a 3D perspective view of an exemplary embodiment of a sliding cylinders rotation lock mechanism 500 implemented in a detachable stand 601 of a smart phone 600 with the detachable stand 601 fully deployed and propping up the smart phone 600 in the portrait orientation.

Figure 50:
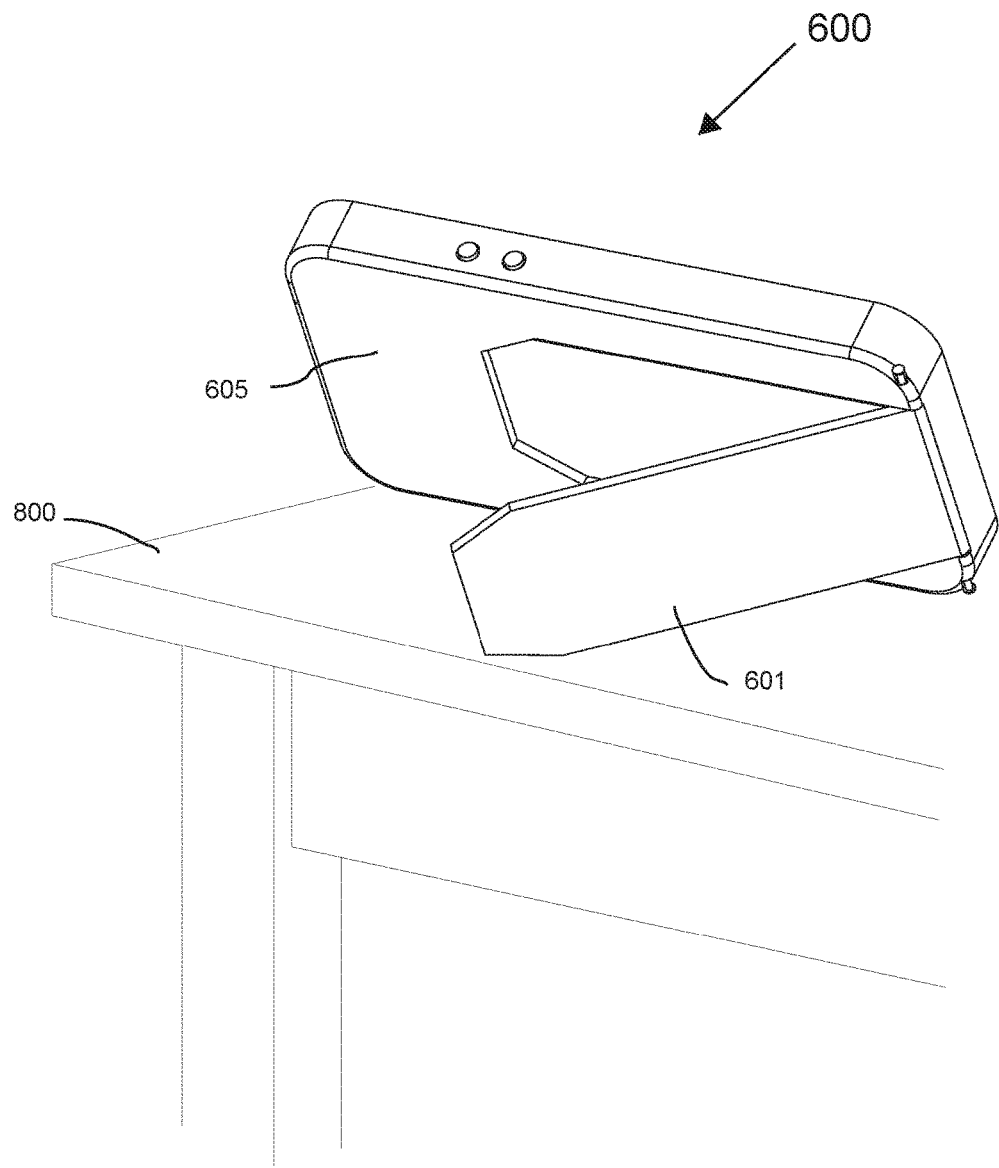
FIG. 50 illustrates a three-dimensional perspective view of an exemplary embodiment of a sliding cylinders rotation lock mechanism implemented as a detachable stand of a smart phone with the detachable stand fully deployed and propping the smart phone in the landscape orientation.

FIG. 50 illustrates a 3D perspective view of an exemplary embodiment of a sliding cylinders rotation lock mechanism 500 implemented in a detachable stand 601 of a smart phone 600 with the detachable stand 601 fully deployed and propping up the smart phone 600 in the landscape orientation.

Figure 51:
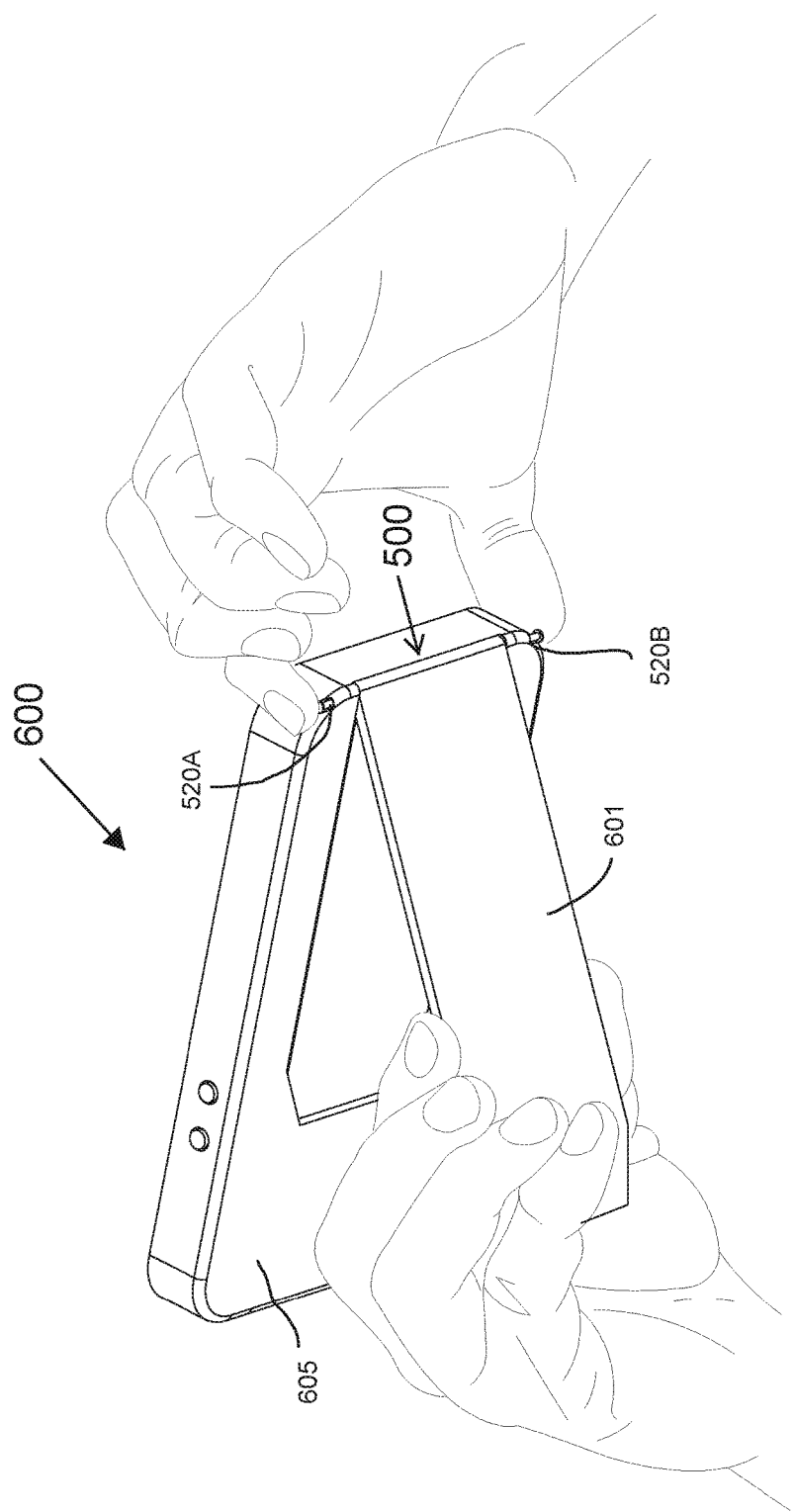
FIG. 51 illustrates a three-dimensional perspective view of an exemplary embodiment of a sliding cylinders rotation lock mechanism implemented as a detachable stand of a smart phone with human hands pressing the hinge pincers deeper in order to disassociate the detachable stand from the back panel of the smart phone.

FIG. 51 illustrates a 3D perspective view of an exemplary embodiment of a sliding cylinders rotation lock mechanism 500 implemented in a detachable stand 601 of a smart phone 600 with human hands pressing the hinge pincers 520A and 520B deeper into the rotation lock mechanism 500 in order to disassociate the detachable stand 601 from the back panel 605 of the smart phone 600.

Figure 52:
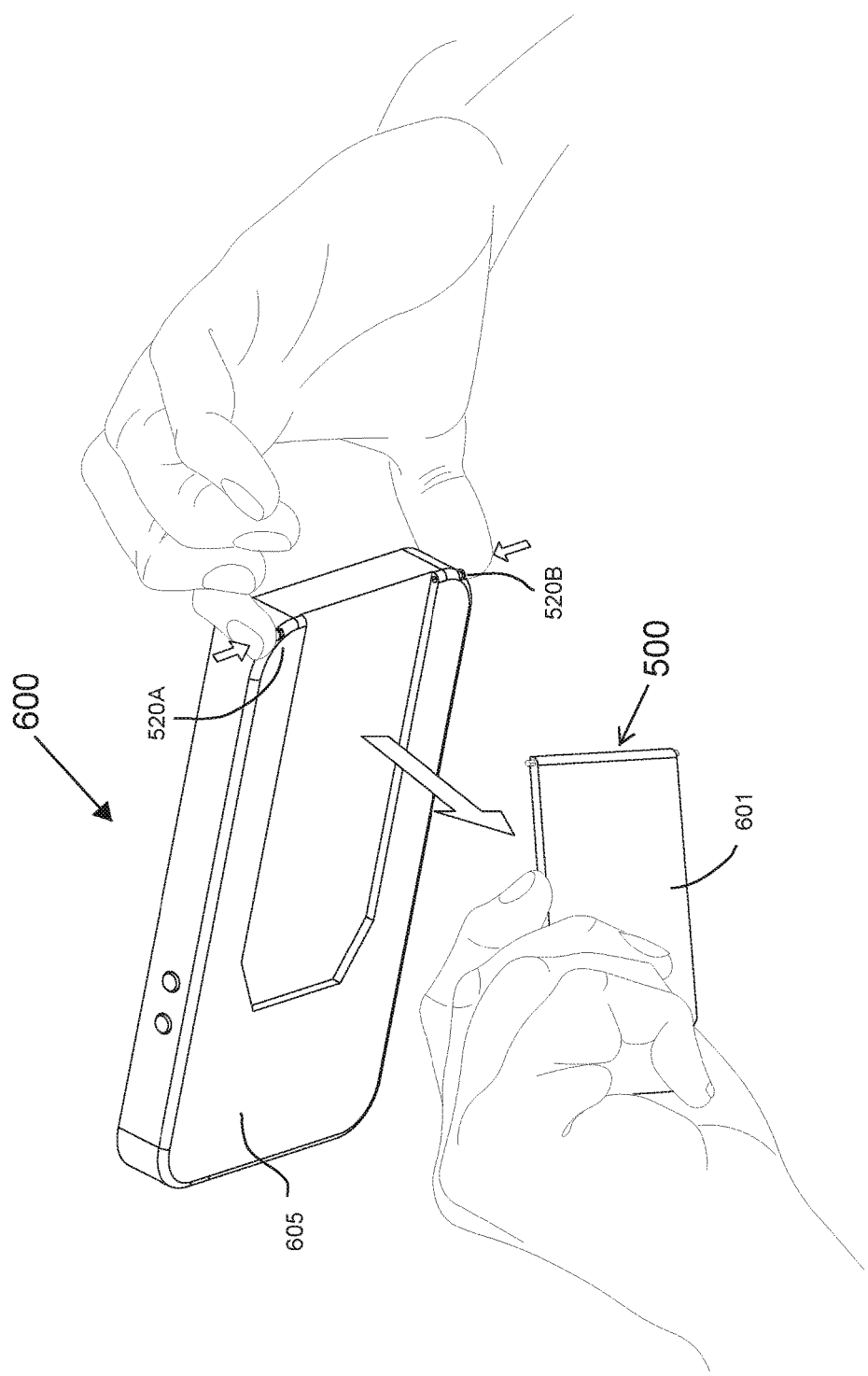
FIG. 52 illustrates a three-dimensional perspective view of an exemplary embodiment of a sliding cylinders rotation lock mechanism implemented as a detachable stand of a smart phone with human hands pressing the hinge pincers deeper and the detachable stand fully disassociated from the back panel of the smart phone.

FIG. 52 illustrates a 3D perspective view of an exemplary embodiment of a sliding cylinders rotation lock mechanism 500 implemented in a detachable stand 601 of a smart phone 600 with human hands pressing the hinge pincers 520A and 520B deeper and the detachable stand 601 fully disassociated and removed from the back panel 605 of the smart phone 600.

While exemplary embodiments of the present inventions are disclosed herein, it should be understood that modifications, substitutions and alternatives may be apparent to one of ordinary skill in the art and can be made without departing from the scope of this disclosure. This disclosure is intended to cover any adaptations or variations of the exemplary embodiments. In addition, in this disclosure, the terms "comprise" or "comprising" do not exclude other elements or steps, the terms "a" or "one" do not exclude a plural number, and the term "or" means either or both. Furthermore, characteristics or steps which have been described may also be used in combination with other characteristics or steps and in any order unless the disclosure or context suggests otherwise.

The invention claimed is:

1. A hinge or clamp assembly comprising:
a first plate or arm including a slot or aperture and outer cylindrical bores on opposite sides of the slot, or aperture, wherein the outer cylindrical bores are coaxial along the longitudinal axis of the bores;
a second plate or arm seated in the slot, or aperture, of the first plate or arm, wherein the second plate or arm moves rotationally relative to the first plate or arm about the longitudinal axis of the bores;
two mirrored cylinders or stepped cylinders on opposite ends of the second plate or arm, wherein the two mirrored cylinders or stepped cylinders are coaxial with the longitudinal axis of the bores and slide in opposite direction along the longitudinal axis of the bores to engage and disengage with the outer cylindrical bores;
a locking mechanism including the two mirrored cylinders or stepped cylinders and a common biasing mechanism configured to urge the two mirrored cylinders or stepped cylinders in opposite directions along the longitudinal axis of the bores, wherein the mirrored cylinders or stepped cylinders each have an outer surface with at least one first locking region with faceted sides, ridges, or teeth in which the faceted sides, ridges, or teeth are non-sloping relative to the longitudinal axis of the bores;
each of the outer cylindrical bores includes at least one chamber coaxial with and receiving a respective end of one of the mirrored cylinders or stepped cylinders, wherein the at least one chamber includes at least one second locking region which includes an internal wall with faceted, ridged, or toothed internal surfaces that are non-sloping relative to the longitudinal axis of the bores; and that are configured to receive and interlock with the faceted sides, ridges, or teeth of the at least one first locking region on the outer surface of a respective mirrored cylinder or stepped cylinder;
wherein the mirrored cylinders or stepped cylinders have a locked position where the at least one first locking region of the cylinders or stepped cylinders is interlocking partially or fully with the at least one second locking region of the at least one chamber of the outer cylindrical bores such that the second plate or arm is prevented from rotating relative to the first plate or arm; and
wherein the mirrored cylinders or stepped cylinders have an unlocked position where the at least first locking region of the cylinders is disengaged from the at least one second locking region of the at least one chamber of the outer cylindrical bores to allow the second plate or arm to pivot freely relative to the first plate or arm; and
wherein each of the mirrored cylinders or stepped cylinders is connected to a release post that is configured to be manually displaced to urge the mirrored cylinders or stepped cylinders axially along the longitudinal axis of the bores in a direction to disengage the first and second locking regions, thereby allowing the second plate or arm to pivot relative to the first plate or arm.

2. The hinge or clamp assembly of claim 1 wherein the mirrored cylinders or stepped cylinders have a detached position where the mirrored cylinders or stepped cylinders are positioned fully outside of the outer cylindrical bores which allows the second plate or arm to be fully detached from the first plate or arm.

3. The hinge or clamp assembly of claim 1 wherein the biasing mechanism of the mirrored cylinders or stepped cylinders is at least one of a U-shaped rod or brace, a coil spring, a sponge, an elastically deformable shaft or a compressible gas.

4. The hinge or clamp assembly of claim 1 wherein the second plate or arm is a U-shaped rod or brace having opposite ends each including one of the two mirrored cylinders or stepped cylinders.

5. A hinge or clamp assembly comprising:
a first plate or arm including a slot or aperture and protruding cylinders on opposite sides of the slot or aperture wherein the protruding cylinders are coaxial along their longitudinal axis; and wherein each protruding cylinder has an outer surface with at least one first locking region with faceted sides, ridges, or teeth; in which the faceted sides, ridges, or teeth are non-sloping relative to the longitudinal axis of the protruding cylinders;
a second plate or arm seated in the slot or aperture of the first plate or arm, wherein the second plate or arm moves rotationally relative to the first plate or arm about the longitudinal axis of the protruding cylinders;
two mirrored hollow cylinders on opposite ends of the second plate or arm, wherein the two mirrored hollow cylinders are coaxial with the longitudinal axis of the protruding cylinders and slide in opposite direction along the longitudinal axis of the protruding cylinders to engage and disengage from the protruding cylinders;
a locking mechanism including the two mirrored hollow cylinders and a common biasing mechanism configured to urge the two hollow mirrored cylinders in opposite directions along the longitudinal axis of the protruding cylinders, wherein each of the mirrored hollow cylinders includes at least one chamber coaxial with and receiving a respective end of one of the protruding cylinders, wherein the at least one chamber includes at least one second locking region in which the at least one second locking region includes an internal wall with faceted, ridged, or toothed internal surfaces that are non-sloping relative to the longitudinal axis of the protruding cylinders and that are configured to receive and interlock with faceted sides, ridges, or teeth of the at least one first locking region on the outer surface of the protruding cylinders;

wherein the mirrored hollow cylinders have a locked position where the at least one second locking region of the hollow cylinders is interlocking partially or fully with the at least one first locking region of the protruding cylinders such that the second plate or arm is prevented from rotating relative to the first plate or arm, and wherein the mirrored hollow cylinders have an unlocked position where the at least one second locking region of the hollow cylinders is disengaged from the at least one first locking region of the outer cylinders to allow the second plate or arm to pivot freely relative to the first plate or arm; and wherein each of the mirrored hollow cylinders is connected to a release post that is configured to be manually displaced to urge the mirrored hollow cylinders axially along the longitudinal axis of the bores in a direction to disengage the first and second locking regions, thereby allowing the second plate or arm to pivot relative to the first plate or arm.

6. The hinge or clamp assembly of claim 5 wherein the hollow cylinders have a detached position where the hollow cylinders are positioned fully outside of the protruding cylinders which allows the second plate or arm to be fully detached from the first plate or arm.

7. The hinge or clamp assembly of claim 5 wherein the biasing mechanism is at least one of a U-shaped rod, or brace, a coil spring, a sponge, an elastically deformable shaft or a compressible gas.

8. The hinge or clamp assembly of claim 5 wherein the second pate or arm is a U-shaped rod or brace having opposite ends each including one of the two hollow cylinders.

* * * * *